(12) United States Patent
Akiba et al.

(10) Patent No.: US 6,707,682 B2
(45) Date of Patent: Mar. 16, 2004

(54) LOW-EMI ELECTRONIC APPARATUS, LOW-EMI CIRCUIT BOARD, AND METHOD OF MANUFACTURING THE LOW-EMI CIRCUIT BOARD

(75) Inventors: Yutaka Akiba, Fujisawa (JP); Yasunori Narizuka, Hiratsuka (JP); Hirayoshi Tanei, Yokohama (JP); Naoya Kitamura, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/956,909

(22) Filed: Sep. 21, 2001

(65) Prior Publication Data

US 2002/0015293 A1 Feb. 7, 2002

Related U.S. Application Data

(63) Continuation of application No. 08/860,181, filed as application No. PCT/JP96/00021 on Jan. 10, 1996, now Pat. No. 6,353,540.

(30) Foreign Application Priority Data

| Jan. 10, 1995 | (JP) | 7-001721 |
| Aug. 9, 1995 | (JP) | 7-203567 |
| Nov. 30, 1995 | (JP) | 7-311944 |
| Dec. 8, 1995 | (JP) | 7-319977 |

(51) Int. Cl.[7] .................................. H05K 1/18
(52) U.S. Cl. .................. 361/763; 361/764; 361/765
(58) Field of Search .................... 361/760–766, 361/777–778, 792–795; 174/255, 261–262; 333/12

(56) References Cited

U.S. PATENT DOCUMENTS

| 4,179,797 A | 12/1979 | Johnson | 338/320 |
| 4,300,115 A | 11/1981 | Ansell et al. | 338/320 |
| 4,328,531 A | 5/1982 | Nagashima et al. | 361/762 |
| 4,574,255 A | 3/1986 | Fujii et al. | 361/795 |
| 4,705,917 A | 11/1987 | Gates, Jr. et al. | 361/794 |
| 4,737,747 A | 4/1988 | Henderson et al. | 333/246 |
| 4,870,746 A | 10/1989 | Klaser | 29/620 |
| 5,208,561 A | 5/1993 | Delestre et al. | 333/246 |
| 5,384,434 A | 1/1995 | Mandai et al. | 361/763 |
| 5,469,324 A | 11/1995 | Henderson et al. | 361/763 |
| 5,483,413 A | 1/1996 | Babb | 361/794 |
| 5,488,540 A | 1/1996 | Hatta | 361/794 |
| 5,708,569 A | 1/1998 | Howard et al. | 361/763 |
| 5,870,274 A | 2/1999 | Lucas | 361/763 |

FOREIGN PATENT DOCUMENTS

| JP | 60-177696 | 9/1985 | H05K/1/03 |
| JP | 1-089393 | 4/1989 | H05K/3/46 |
| JP | 2-186694 | 7/1990 | H05K/3/46 |
| JP | 3-014284 | 1/1991 | |
| JP | 4-230055 | 8/1992 | H01L/23/12 |
| JP | 6-132668 | 5/1994 | H05K/3/46 |

OTHER PUBLICATIONS

Oka et al, "Radiated Emission from Digital Printed Circuit Boards", Technical Report of IEICE, EMCJ94–88, pp. 17–25; 1995.

*Primary Examiner*—David E. Graybill
*Assistant Examiner*—Tuan Dinh
(74) *Attorney, Agent, or Firm*—Antonelli, Terry, Stout & Kraus, LLP

(57) ABSTRACT

A low-EMI circuit which realizes a high mounting density by converting the potential fluctuation of a power supply layer with respect to a ground layer which occurs on switching an IC device etc., into Joule's heat in the substrate without using any parts as a countermeasure against the EMI. Its structure, a circuit board using it, and a method of manufacturing the circuit board are also disclosed. Parallel plate lines in which the Q-value of the stray capacitance between solid layers viewed from the power supply layer and ground layer is equivalently reduced and which are matchedly terminated by forming a structure in which a resistor (resistor layer) and another ground layer are provided in addition to the power supply layer and the ground layer on a multilayered circuit board. A closed shield structure is also disclosed.

3 Claims, 30 Drawing Sheets

ADDITION OF THROUGH-HOLE INDUCTANCE (1)

(2)

(3)

RADIATION CHARACTERISTIC OF PRIOR ART
CIRCUIT BOARD AND NEW CIRCUIT BOARD

SUPPRESSION EFFECT OF NEW CIRCUIT BOARD
(REFERENCE:PRIOR ART CIRCUIT BOARD)

LOW-EMI ELECTRONIC APPARATUS, LOW-EMI CIRCUIT BOARD, AND METHOD OF MANUFACTURING THE LOW-EMI CIRCUIT BOARD

This is a continuation application of U.S. application Ser. No. 08/860,181, filed Jul. 10, 1997 now U.S. Pat. No. 6,353,540, which is a 371 filing of PCT/JP96/00021, filed on Jan. 10, 1996, and the entire disclosures of which are incorporated herein by reference.

The present invention relates to an electronic apparatus which copes with an EMC which is becoming more and more important in increasing speed and packaging density of IC and LSI devices, and to a device, a circuit board and an electronic apparatus which require suppression means for spurious radiation noise and a method of making the same.

BACKGROUND ART

An EMC intends to the compatibility of an electromagnetic environment of an EMI (noise source) and an immunity (noise receiver). Recently, the rise of an operating frequency due to high performance of a product raises a radiation intensity of spurious radiation, which leads the EMI to a severe situation. Further, with the population of the electronic products, the countermeasure for the EMI of the electronic products is becoming severer.

It is reported that the increase of the anticipated spurious radiation amounts to 4 dB/year. If the spurious radiation increases in this manner, the electromagnetic environment becomes more and more worse and it is no doubt that a television video screen is disturbed or a manipulation system of an aircraft becomes uncontrollable and social problems are raised.

For this reason, a noise regulation in terms of a radiation intensity and a scope of applicable products is more and more enhanced and manufacturers are endeavoring to enhance the EMC performance of the products by design and simulation prediction technique to clear the regulation.

As a technical reference relating thereto, JP-A-3-14284 is cited. The JP-A-3-14284 discloses a built-in structure to a printed circuit board in place of discrete parts of a ferrite core and a ferrite beads which are existing countermeasure parts.

In order to enhance the EMC performance of the product, various countermeasure parts such as a common mode choke, a filter and a bypass capacitor for an I/O unit and a power supply have been used from the past but these parts present demerits of ① increase of a cost, ② problem to so-called high packaging density such as minituarization, thinning and weight reduction of a product due to the increase of volume, ③ complexity of the countermeasure part, and ④ restriction to external view design.

Further, in such a prior art product, the conformity to the future increase of the spurious radiation due to the rise of the operation frequency of the product is restricted.

The restriction to the suppression of the spurious radiation from the electronic apparatus by using the countermeasure parts is explained for a case of a bypass capacitor.

As examples of means for suppressing the spurious radiation form the electronic apparatus, the suppression of a potential fluctuation of a ground system which serves as a drive source for an antenna and the insertion of a common mode core to a cable are cited. Of those, the means for suppressing the potential fluctuation includes a method for using a bypass capacitor.

FIG. 13 shows a sectional structure model of a four-layer circuit board using a bypass capacitor. The four-layer circuit board comprises a signal layer (S1), a power layer (V), a ground layer (G) and a signal layer (S2). In FIG. 13, a dielectric material layer is omitted. As externally connected circuit components, a device equivalent circuit comprising a series connection of an inductance Ld, a load resistor Rd and a switch SW and a power equivalent circuit comprising a series connection of a bypass capacitor having a capacitance of C0, a DC power supply E0 and an inductance Lg are included. In the circuit board, a stray capacity C1 by the power layer (V) and the ground layer (G) and inductances L0 and L1 by a wiring pattern and through-holes are formed.

The bypass capacitor is provided in order to absorb the potential fluctuation as described before.

FIG. 14 shows an equivalent circuit of the sectional structure model shown in FIG. 13.

Since the potential fluctuation V0 occurs in a power lead of an IC device at the switching of the IC device (modeled by ON/OFF of SW in FIG. 14), the bypass capacitor is provided to absorb the potential fluctuation V0.

However, since the inductances L0 and L1 due to the wiring pattern and the through-holes for connecting the bypass capacitor C0 are included by the nature of the circuit board structure, a resonance loop is created with the stray capacity C1 and the effective suppression of the potential fluctuation may be difficult.

Namely, as the operation frequency rises and harmonics frequencies rise, the bypass capacitor does not exhibit the inherent capacitance characteristic because of its inductive component and it cannot absorb the potential fluctuation of the ground system.

Namely, as the operating frequency of the electronic product rises, the prior art technique cannot cope with the future increase of the spurious radiation.

As other countermeasure means, plating may be applied to a plastic housing to form a shield structure to suppress the spurious radiation as seen in a modern notebook type personal computer, but the shield structure has demerits of ① increase of cost and ② the reduction of added value of the product by a problem to recycling the plastic housing.

Thus, new countermeasure means for suppressing the spurious radiation without lowering the added value of the electronic apparatus has been demanded, and on the other hand, a mechanism of the spurious radiation has not been fully investigated. As described in the Technical Journal of the Association of Electronics and Electronic Communications of Japan, EMCJ 94-88 (1995-3), the investigation of a radiation source model for a common mode radiation is behind and it is a future problem to be solved.

It is an object of the present invention to provide an electronic apparatus which suppresses spurious radiation at a level of a circuit board mounted on the apparatus.

It is a second object of the present invention to provide a structure of a circuit board to be applied to an electronic apparatus.

It is a third object of the present invention to provides a circuit board and a method of manufacturing the same when the structure of the present invention is applied to various manufacturing methods.

DISCLOSURE OF INVENTION

In order to achieve the first object of the present invention, an electronic apparatus is provided with a circuit board suppressing spurious radiation is formed by providing first and second ground layers having at least one thereof electrically connected to electrical parts, a power layer provided between said first ground layer and said second ground layer and electrically connected to said electronic parts, a dielectric material layer for joining said second ground layer and said power layer and a resistor layer having said first ground layer and said second ground layer electrically connected, and said circuit board is housed in a housing.

Alternatively, an electronic apparatus is provided with a circuit board suppressing spurious radiation is formed by providing a ground layer and a power layer electrically connected to electronic parts, a dielectric material layer for connecting said second ground layer and said power layer, and a first dielectric material layer and a second dielectric material layer sandwiching said ground layer and said power layer therebetween, and said circuit board is housed in a housing.

In order to achieve the second object of the present invention, a structure is characterized by the provision of a first conductor layer and a second conductor layer; a third conductor layer provided between said first conductor layer and said second conductor layer; a first dielectric material layer for joining said first conductor layer and said third conductor layer; a second dielectric material layer for joining said second conductor layer and said third conductor layer; and a resistor for joining said first conductor layer and said second conductor layer.

Alternatively, a structure is provided with a first conductor layer, a second conductor layer, a dielectric material layer provided between said first conductor layer and said second conductor layer, and a resistor layer Specifically, the structure is provided with a first conductor layer, a second conductor layer, a third conductor layer, a first dielectric material layer, a second dielectric material layer and a resistor layer, and characterized in that said second conductor layer sandwiched by said first dielectric material layer and said second dielectric material layer and said resistor layer are arranged between said first conductor layer and said third conductor layer; and a capacitor C formed by a series connection, through said second conductor layer, of a capacitor C1 formed by arranging said first dielectric material layer between said first conductor layer and said second conductor layer and a capacitor C2 formed by arranging said second dielectric material layer between said second conductor layer and said third conductor layer, and a resistor R formed by arranging said resistor layer around said second conductor layer sandwiched by said first dielectric material layer and said second dielectric material layer form a parallel circuit.

Alternatively, the structure is provided with a first conductor layer, a second conductor layer, a first dielectric material layer, a second dielectric material layer and a resistor layer, and characterized in that said first dielectric material layer and said second dielectric material layer are arranged between said first conductor layer and said second conductor layer; and said resistor layer is sandwiched by said first dielectric material layer and said second dielectric material layer.

When the former structure is specifically viewed in terms of function, the structure is characterized by the provision of a first conductor layer and a second conductor layer; a third conductor layer provided between said first conductor layer and said second conductor layer; a first dielectric material layer for joining said first conductor layer and said third conductor layer; a second dielectric material layer for joining said second conductor layer and said third conductor layer; and a resistor for joining said first conductor layer and said second conductor layer, and the resistor is arranged such that the Q value of the structure is within a predetermined value.

Alternatively, the structure is characterized by the provision of a first conductor layer and a second conductor layer; a third conductor layer provided between said first conductor layer and said second conductor layer; a first dielectric material layer for joining said first conductor layer and said third conductor layer; a second dielectric material layer for joining said second conductor layer and said third conductor layer; and a resistor for joining said first conductor layer and said second conductor layer, and the resistor is arranged to matching terminate the parallel plate line formed by said first conductor layer and said second conductor layer.

In order to achieve the third object of the present invention, a method of manufacturing a circuit board is characterized by steps of forming a multi-layer circuit board having a circuit board comprising at least a ground layer and power layer or a multi-layer structure of said circuit board; and forming a resistor layer on a side of said circuit board or said multilayer circuit board, or at least a portion of an outer periphery of a wiring area in said ground layer and said power layer.

Alternatively, a circuit board is provided with a first conductor layer, a second conductor layer, a third conductor layer, a first dielectric material layer, a second dielectric material layer and a resistor layer, and characterized in that said second conductor layer and said resistor layer are sandwiched between said first dielectric material layer and said second dielectric material layer and arranged between said first conductor layer and said third conductor layer; a metallic layer is used as said conductor layer, an inorganic or organic material is used as said dielectric material layer and an inorganic material layer is used as said resistor layer in forming a low EMI circuit comprising a capacitor component and a resistor component on the circuit board between said first conductor layer and said third conductor layer and said layers are stacked on the circuit board to form a multilayer wiring structure; a wall shape structure made of conductors is formed in a self-closed line shape in an outer periphery of the dielectric material layer on the circuit board on in the dielectric material layer; and a plurality of conductor layers of different structures are electrically connected through the resistor layer.

Alternatively, in a low EMI circuit having a structure in which a power conductor layer and a resistor layer are held between two ground conductor layers, said power conductor layer is arranged to the two ground conductor layers through a dielectric material layer, said resistor layer is arranged in a periphery of said dielectric material layer and connected to the two ground conductor layers, a method of manufacturing a circuit board comprising the steps of forming the conductor layer by a thick film printing method of conductor paste which is a mixture of a metal comprising silver (Ag), palladium (pd), copper (Cu), gold (Ag) or an alloy thereof or a mixture thereof and organic polymer resin solved in organic solvent; forming the resistor layer by the thick film printing method of resistor paste which is a mixture of ruthenium oxide ($RuO_2$) or a compound including ruthenium oxide and organic polymer resin solved in organic solvent; glass ceramic is used as the low dielectric constant dielectric material layer and perovskite type ferro-dielctric material is used as the high specific dielectric constant dielectric material layer.

First, a principle of the present invention for suppressing the spurious radiation from the electronic radiation is explained.

The spurious radiation from the electronic apparatus generally includes two radiation modes, differential mode radiation and common mode radiation.

For example, for the circuit board which is a center of noise sources, the differential mode radiation is created by a current flowing in a loop formed by the conductor pattern and the loop serves as a miniature antenna for generating a magnetic field. On the other hand, the common mode radiation is created by the potential fluctuation of the ground system, and when an external cable in connected, it serves as an antenna for generating an electrical field.

The differential mode radiation may cope with by the design or the layout but the common mode radiation is caused by the potential fluctuation of the ground system and it is difficult to suppers it because it is not intended by the design. In addition, the common mode radiation is a big factor in determining the radiation performance of the circuit board and the product using the same.

In the electronic apparatus of the present invention, the common mode radiation is suppressed at the level of the circuit board to suppress the spurious radiation from the electronic apparatus. Namely, the circuit board which suppresses the spurious radiation is constructed by "providing first and second ground layers having at least one thereof electrically connected to electrical parts, a power layer provided between said first ground layer and said second ground layer and electrically connected to said electronic parts, a dielectric material layer for joining said second ground layer and said power layer and a resistor layer having said first ground layer and said second ground layer electrically connected" or "a ground layer and a power layer electrically connected to electronic parts, a dielectric material layer for connecting said second ground layer and said power layer, and a first dielectric material layer and a second dielectric material layer sandwiching said ground layer and said power layer therebetween", and said circuit board is housed in a housing to suppress the common mode radiation at the level of the circuit board to suppress the spurious radiation emitted from the electronic apparatus.

The present invention aims to suppress the spurious radiation at the level of the circuit board, and it eliminates various countermeasure parts such as a common mode choke, a filter and a bypass capacitor for an I/O unit and a power code which have been required in the prior art, and solves the problems of ① the increase of cost of the electronic apparatus, ② problems to so-called high packaging density such as minituarization, thinning and weight reduction of the product due to the increase of volume, ③ the complexity of the countermeasure parts, and ④ the restriction to the external design.

Further, since a design without the shield structure having plating applied to the plastic housing as seen in the modern notebook type personal computer is allowed, the shield structure is eliminated and ① the reduction of cost and ② the recycling of the plastic housing may be attained.

By providing the prior art countermeasure parts in the electronic apparatus of the present invention, it is natural to cope with the future increase of the spurious radiation and provide a highly reliable electronic apparatus against the spurious radiation.

A structure or a circuit board of the present invention for suppressing the spurious radiation at the level of the circuit board is now explained.

While the mechanism of the radiation source model for the common mode radiation is not fully investigated, the inventors of the present invention assumed that it is the potential fluctuation caused between the power layer and the ground layer and attempted to absorb the potential fluctuation by providing a resistor (resistive layer). The potential fluctuation depends on a drive frequency of the electronic parts mounted on the circuit board and the structure or the circuit board of the present invention is handled for two major modes, ① a lumped constant circuit and ② a distributed constant circuit although the basic constructions are substantially identical for both circuits.

The operation of the structure or the circuit board of the present invention as the lumped constant circuit is first explained.

In the structure or the circuit board of the present invention, in FIG. 14, in order to absorb the potential fluctuation V1 generated between the power layer (V (and the ground layer (G), a resistor Rc formed in the circuit board is connected to the capacitor C1 to form a parallel circuit (see FIG. 2) or a series circuit (see FIG. 12) of the capacitor C1 and the resistor Rc to reduce a Q value (attain Q value of not larger than 10).

For the parallel circuit, since it is difficult to directly connect the resistor Rc between the power layer (V) and the ground layer (G), another ground layer and a capacitor C2 are formed and the resistor Rc and the capacitor C2 are serially connected to block a DC component. By making an impedance of the capacitor C2 sufficiently small for frequencies in a radiation suppression area, a parallel circuit of the capacitor C1 and the resistor Rc is effectively formed (C2 in FIG. 4 may be neglected and a circuit of FIG. 5 is formed).

Namely, when the structure or the circuit board of the present invention functions as the lamp constant circuit, the low Q-value is attained by providing the resistor to absorb the potential fluctuation.

The function of the structure or the circuit board of the present invention as the distributed constant circuit is now explained.

In FIG. 13, in order to absorb a standing wave generated between the power layer (V) and the ground layers (G, G1), a further ground layer (G2) and the resistor (resistor layer) are used and a parallel plate line is formed by the two ground layers (G1, G2) arranged to sandwich the power layer (V), and a matching termination resistance R0 is given by the resistor (resistor layer) arranged at the line end.

In this case, since the two parallel plate lines formed by the power layer (V) and the ground layer (G1) and other ground layer (G2) have the line ends thereof opened, a large potential fluctuation occurs at the end in a particular frequency region. However, since it is arranged in the parallel plate line formed by the two ground layers (G1, G2), the standing wave due to the potential fluctuation is absorbed by the matching termination resistor R0.

Namely, when the structure or the circuit board of the present invention functions as the distributed constant circuit, the matching termination is made by the resistor to absorb the potential fluctuation due to the resonance of the standing wave.

As a condition for the matching termination, a resistance r of the resistor should be set to meet the following relation:

$$R = (h/a) \cdot \sqrt{(\mu_0 \cdot \mu_{r1})/(\epsilon_0 \cdot \epsilon_{r1})}$$

where
  h: gap length between G1-V
  a: length of one side of rectangle
  $\epsilon_0$: dielectric constant in vacuum (air)

εr1: specific dielectric constant of dielectric material filled between G1-V

μ0: permeability in vacuum (air)

μr1: specific permeability of dielectric material

A further effect may be attained by adding the following condition in the above structure.

In the structure of matching termination, the capacitance c2 of the second dielectric material layer is set such that the second conductive layer and the third conductive layer are at the same potential so that the fluctuation of the third conductive layer (power layer) may be absorbed by the resistor.

In the above structure, when the resistance R of the resistor and the capacitance C2 of the second dielectric material layer meet the following relation, the Q-value of the structure may be lowered:

$$R > 1/\omega C2$$

where $$C2 = \epsilon 0 * \epsilon r2 * S/d$$

w: angular frequency (area) required for low EMI

ε0: dielectric constant in vacuum (air)

εr2: specific dielectric constant of dielectric material filled between G2-V

S: area of dielectric material d: gap length between G2-V

Similarly, when the resistance R of the above resistor and the capacitance C1 of the first dielectric material layer meet the following relation, the Q-value of the structure may be set to a desired value:

$$Q \approx \omega * C1 * R$$

where

ω: angular frequency area required for low EMI

Further, in the above structure, when the first dielectric material layer and the second dielectric material layer are formed by the same dielectric material, the warp of the circuit board may be reduced.

Further, in the above structure, when high speed signal layer (fifth conductor layer) is provided between the ground layer (first conductor layer) and the power layer (third conductor layer), it is necessary that the second dielectric material layer is formed by a dielectric material of a low dielectric constant.

In the above structures, when the power layer is surrounded by the two ground layers and the resistor (resistor layer), the potential fluctuation and the standing wave generated between the solid layers of the power layer and the ground layer may also be absorbed and shielded.

When only the low Q is to be attained, the resistor may be approached to the conductor from the formula defining the Q-value.

BRIEF DESCRIPTION OF DRAWINGS

FIG. 4 is given at a particular frequency area.

FIG. 23-(2) shows a sectional view of an improvement of the structure shown in FIG. 23-(1).

FIG. 24-(2) shows a sectional view of a structure of a simplified circuit board of the structure of FIG. 24-(1).

FIG. 24-(3) shows a sectional vies of a structure of a simplified circuit board of the structure of FIG. 24-(2).

FIG. 38-(2) shows other embodiment of the present invention and shows a seven-layer circuit board in a section along a line A–A' (sectional view along line A–A') when the power layer V is divided into three patterns.

BEST MODES FOR CARRYING OUT THE INVENTION

The embodiments of the present invention are now explained.

Figure 33:
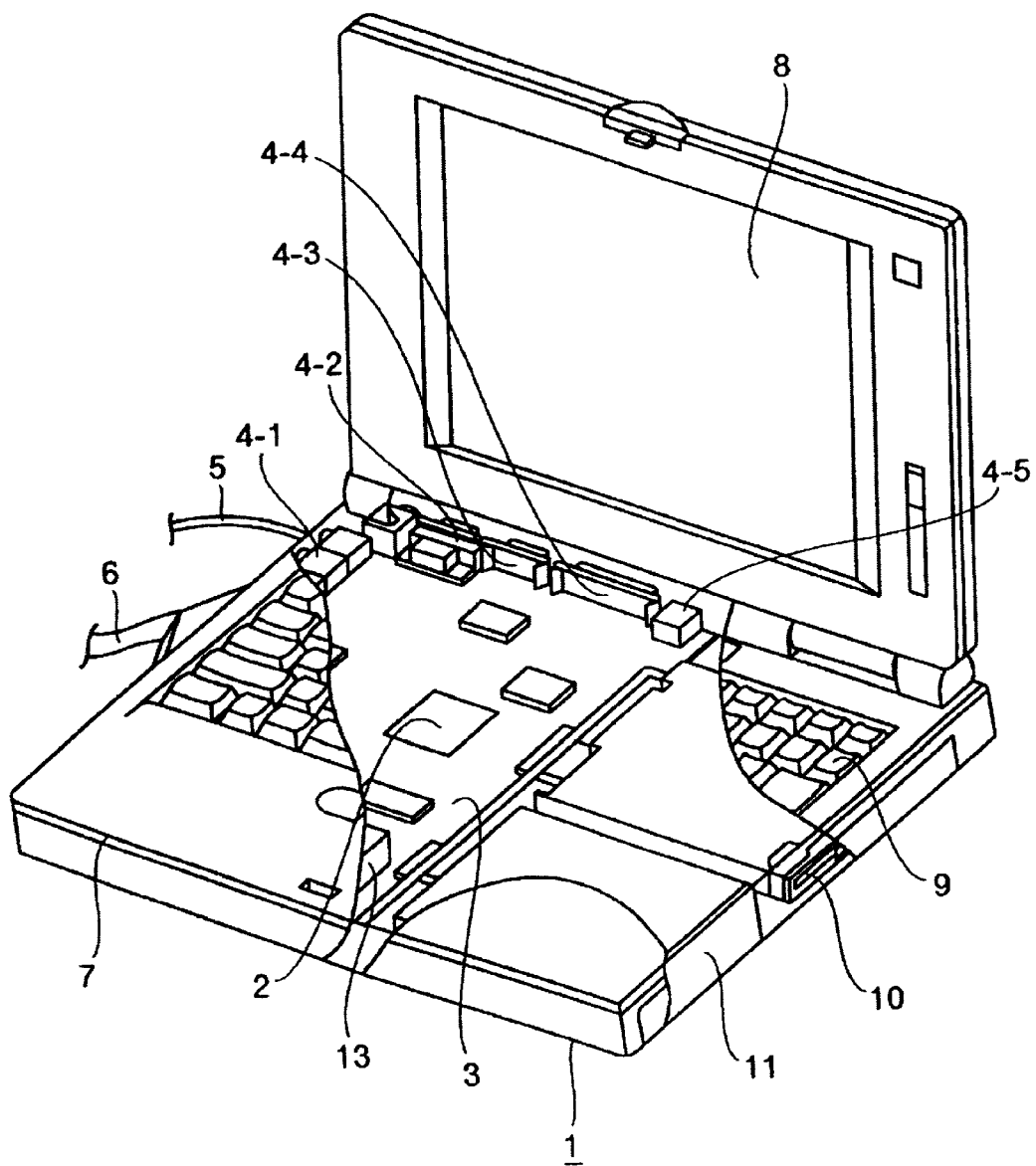
FIG. 33 shows an example of the electronic apparatus of the present invention.

FIG. 33 shows an external view of an electronic apparatus (personal computer) using a low EMI circuit board in accordance with one embodiment of the present invention.

In the electronic apparatus 1 of the present invention, components comprising I/O connectors 4 (4-1, . . . , 4-5), a power code 5, a signal cable 6, a housing 7, an LCD display 8, a keyboard 9, a floppy disk drive 10, a hard disk drive 11, a battery pack 12 and an IC card 13 are electrically and physically connected around a low EMI circuit board 3 on which a high speed CPU 2 is mounted. The low EMI circuit board 3 comprises "first and second ground layers having at least one thereof electrically connected to electrical parts, a power layer provided between said first ground layer and said second ground layer and electrically connected to said electronic parts, a dielectric material layer for joining said second ground layer and said power layer and a resistor layer having said first ground layer and said second ground layer electrically connected" or "a ground layer and a power layer electrically connected to electronic parts, a dielectric material layer for connecting said second ground layer and said power layer, and a first dielectric material layer and a second dielectric material layer sandwiching said ground layer and said power layer therebetween". The structures thereof will be described later.

The major features of the present electronic apparatus 1 reside in the following two points:

One feature is that in the electronic apparatus 1 shown in FIG. 33, the low EMI circuit board 3 is used for the circuit board which function as a noise source to suppress the radiation from other components (antenna, resonance structure) electrically connected with the circuit board 3 so that the prior art EMI countermeasure parts (ferrite beads, filter and bypass capacitor) are eliminated. Thus, most of the EMI countermeasure parts are removed from the circuit board and the circuit board space may be reduced and the minituarization and the low cost of the electronic apparatus 1 are attained.

Specifically, various I/O connectors 4 mounted on a periphery of the circuit board of the present electronic apparatus 1 are not provided with the prior art shield case or ferrite core used as the noise countermeasure parts and the structure is simplified, miniaturized and reduced in weight.

Further, for various signal cables 6 connected to a conventional power code and an external apparatus, the signal grounding (SG) itself suppresses and remove various resonance in the present electronic apparatus 1 to eliminate the potential fluctuation so that the noise countermeasure means such as the insertion of the common mode core and means for enhancing the ground is not adopted. This is also true for a cable electrically connected to a display unit. In various signal cables, when they are driven by the potential fluctuation generated in the signal ground (SG) of the circuit board, they become sources of spurious radiation.

In the present electronic apparatus 1, the spurious radiation is suppressed without using the insertion of the common mode core which is one of means for suppressing the radiation or a plate shield or a housing shield (Ni/Cu plating, conductive vapor deposition, etc.) structure which is one of means for enhancing the ground in the apparatus The common mode core suppresses a resonance current by increasing an impedance of the cable as viewed from a drive source, and the housing shield suppresses the potential fluctuation (noise source) by reducing an impedance of the signal ground (SG) by the metal thin plate.

In general, as the operating frequency of the electronic apparatus rises (around 50 MHz~1000 MHz) and the spurious radiation (intensity) from the circuit board increases, the suppression of the potential fluctuation generated in the signal ground (SG) is difficult, and as countermeasure therefor, the housing shield for surrounding the entire circuit board which is the noise source may be used. In the present electronic apparatus 1, since the spurious radiation is suppressed at the level of the circuit board, the spurious radiation may be suppressed and eliminated without regard to the increase of the operating frequency in principle, and the method of applying conductive plating to the plastic housing or attaching the thin metal plate is basically not necessary. By applying the structure of the present electronic apparatus 1 to a prior art electronic apparatus in which the spurious radiation is suppressed by applying the conductive plating to the housing, it is not necessary to provide the shield in the housing and a product which realizes the enhancement of the recycling of the housing material, the reduction of weight and the reduction of the number of assembling steps is provided.

Another feature is that when the components such as the built-in hard disk drive, floppy disk drive and IC card are arranged closely to the circuit board in order to realize the minituarization and thinning of the electronic apparatus, electric and electromagnetic coupling apt to occur through the signal ground (SG) between the components including the circuit board and the problems of the reduction of a signal noise margin and a malfunction occurs. In the electronic apparatus 1 of the present invention, the low EMI circuit board 3 is used to absorb the potential fluctuation for various resonance in principle so that the above problems are eliminated. Accordingly, new means for suppressing the electric and electromagnetic coupling for the requirement of the minituarization and the thinning is not necessary and the electronic apparatus 1 which is advantageous for the high packaging density is provided.

As described above, the electronic apparatus 1 using the high performance and low EMI circuit board 3 of the present invention collectively solves many problems described above and provides a high added value. The present invention may be applied to a common electronic apparatus and is basically compatible to the formation of the high speed circuit and the suppression of the spurious radiation.

By suppressing the spurious radiation at the level of the circuit board as it is in the present electronic apparatus 1, not only the spurious radiation from the electronic apparatus is suppressed but also the electromagnetic noise coming through various I/O connectors 4, power code and signal cables 6 externally of the electronic apparatus 1 may be absorbed and the resistance to noise is enhanced (high immunity).

Figure 3:
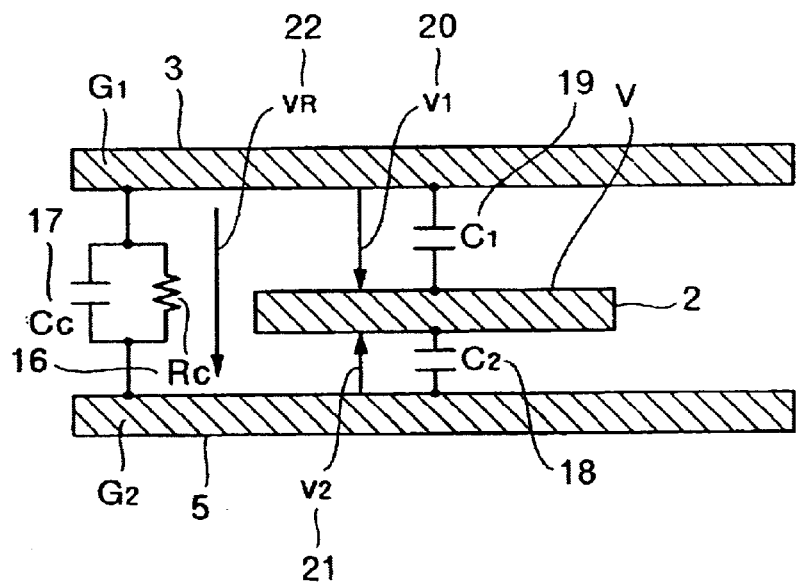
FIG. 3 shows a model chart of a sectional structure for the structure of FIG. 2.

The structure of the low EMI circuit board applied to FIG. 3 is now described in detail.

As described above, the present invention aims to suppress the spurious radiation at the level of the circuit board. For this purpose, the inventors of the present invention principally investigated that the spurious radiation may be suppressed by suppressing the potential fluctuation generated in the power layer and the ground layer and invented a structure to suppress the fluctuation. Namely, it is the structure to basically absorb the potential fluctuation assumed to be generated in the power layer and the ground layer, by a resistor.

Figure 2:
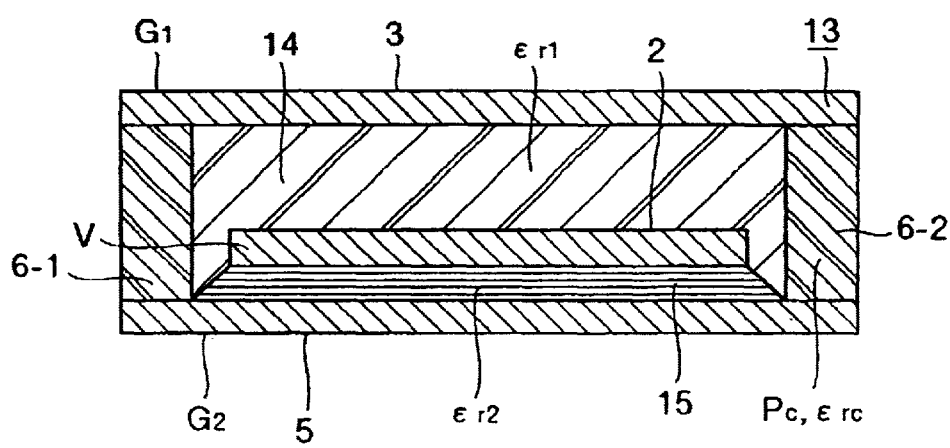
FIG. 2 shows a sectional view of a structure in accordance with another embodiment of the present invention.
Figure 7:
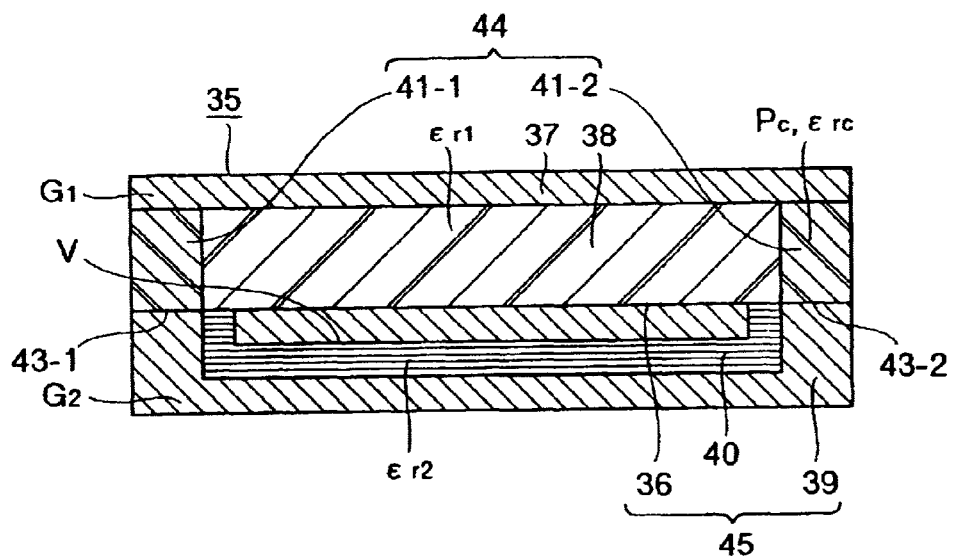
FIG. 7 shows a sectional view of the structure in accordance with other embodiment of the present invention.
Figure 12:
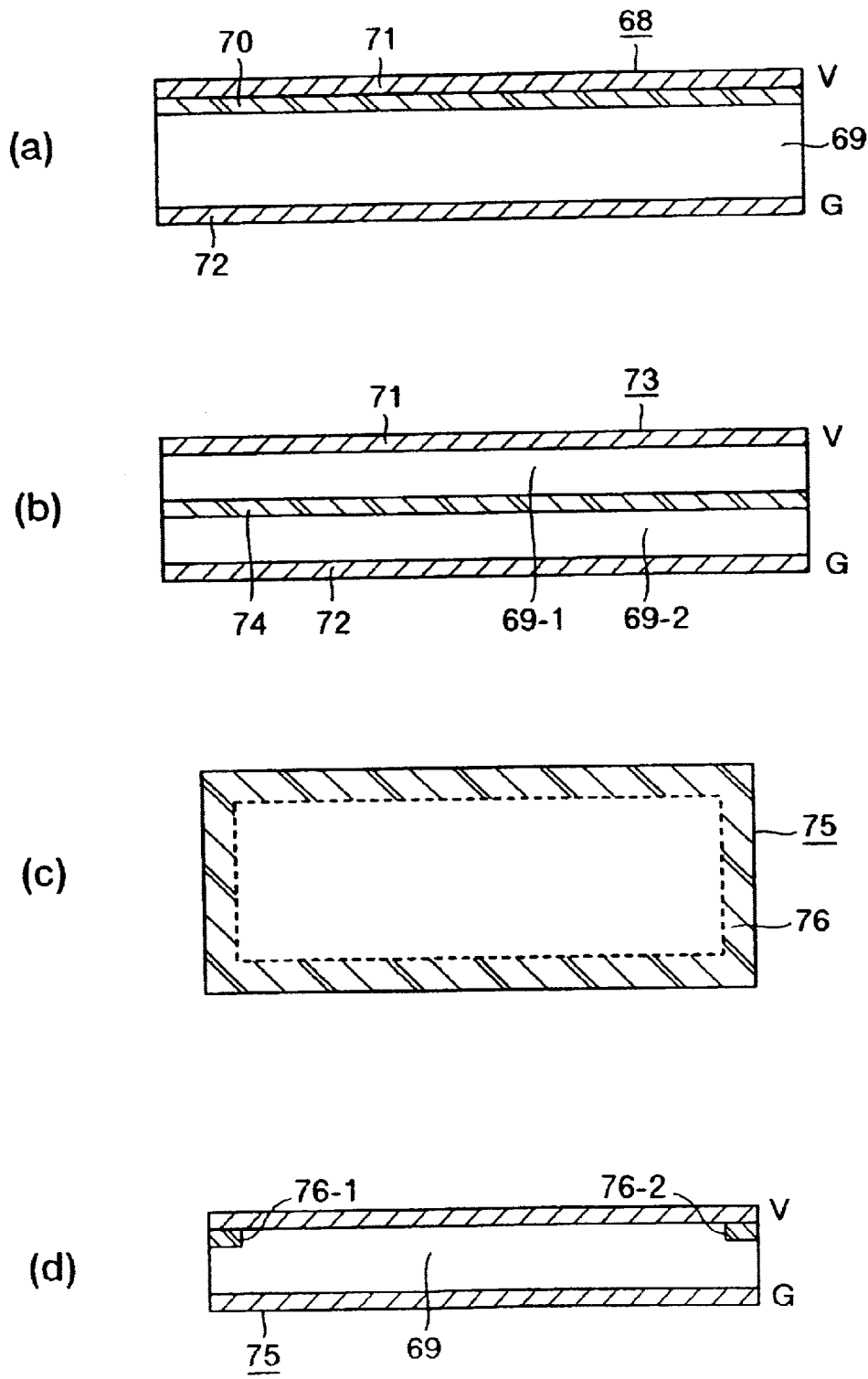
FIG. 12 shows a sectional view and a plan view of a structure of a series circuit in accordance with other embodiment of the present invention.
Figure 13:
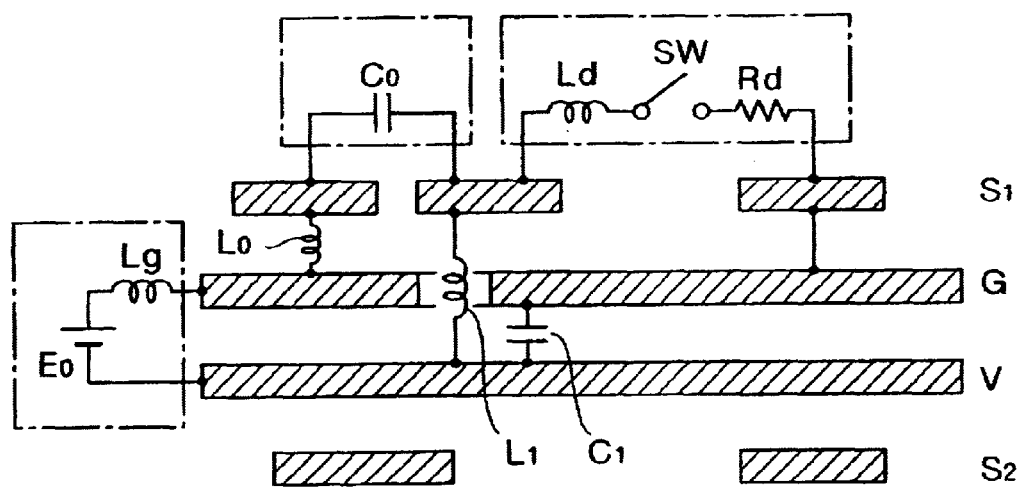
FIG. 13 shows a model chart of a sectional structure in a prior art four-layer circuit board.
Figure 14:
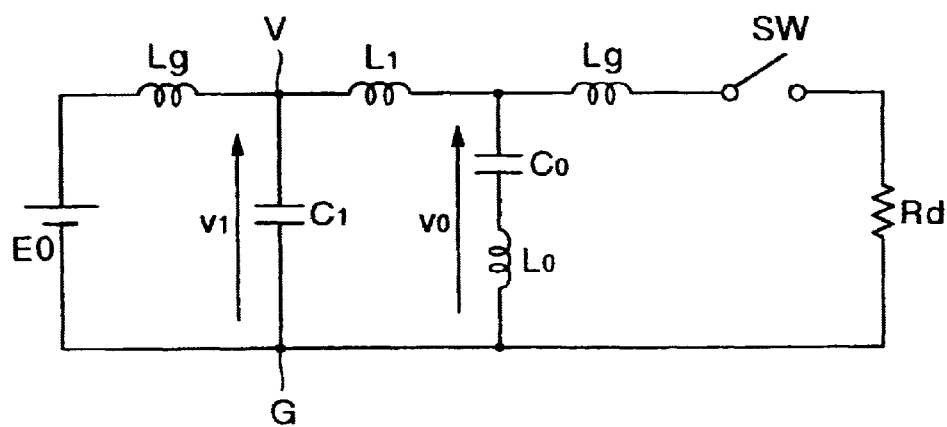
FIG. 14 shows an equivalent circuit diagram of the four-layer circuit board shown in FIG. 13.

The structure comprises "first and second ground layers having at least one thereof electrically connected to electrical parts, a power layer provided between said first ground layer and said second ground layer and electrically connected to said electronic parts, a dielectric material layer for joining said second ground layer and said power layer and a resistor layer having said first ground layer and said second ground layer electrically connected" as shown in FIG. 2 and FIG. 7 and "a ground layer and a power layer electrically connected to electronic parts, a dielectric material layer for connecting said second ground layer and said power layer, and a first dielectric material layer and a second dielectric material layer sandwiching said ground layer and said power layer therebetween" as shown in FIG. 12.

In the former, an additional ground layer is provided and the two ground layers are coupled to the resistor, and in the latter, the resistor layer and the a dielectric material layer are sandwiched between the power layer and the ground layer.

The feature of the structure is the provision of the resistor layer to prevent the short-circuit of the power layer and the ground layer and it is resolved by providing the dielectric material layer.

Namely, in the structure shown in FIG. 2, a capacitor C1 is formed by the power layer (V) 2 and the ground layer (G1) 3 with the intervention of the dielectric material layer 14 therebetween, the capacitor C2 is formed by the power layer (V) 2 and the ground layer (G2) 5 with the intervention of the dielectric material layer 15 therebetween, and the resistor Rc is formed by the ground layer (G1) 3 and the ground layer (G2) 5 with the intervention of the resistor layer 6 therebetween. When the resistor Rc is formed, the capacitor Cc may be simultaneously formed by the material of the resistor layer 6.

When a high speed signal line or an active element (not shown in the drawing) may be formed in the dielectric material layer 14 provided in the structure 13 in order to suppress the radiation. In this case, the dielectric material layer 14 is formed by a dielectric material of a low dielectric constant.

Similarly, in the structure 35 of FIG. 7, the capacitor Ci is formed by the power layer (V) 36 and the ground layer (G1) 37 with the intervention of the dielectric material layer 38 therebetween, the capacitor C2 is formed by the power layer (Y) 36 and the ground layer (G2) 39 with the intervention of the dielectric material layer 40 therebetween, and the resistor Rc is formed by the ground layer (G1) 37 and the ground layer (G2) 39 with the intervention of the resistor layers 41 (41-1, 41-2) therebetween. The levels of one side 42 of the power layer (V) 36 and the connecting sides 43 (43-1, 43-2) of the ground layer (G2) 39 connected to the resistor layers 43 (43-1, 43-2) are aligned and the resistor layer 41 is arranged around the dielectric material layer 38.

Thus, the structure 35 is separated to a structure 44 comprising the ground layer (G1) 37, the dielectric material layer 38 and the resistor layers 41 (41-1, 41-2), and a structure 45 comprising the ground layer (G2) 39, the dielectric material layer 40 and the power layer (V) 36 so that the formation of the layers is simplified. Further, the parallel plate line structure for connecting the matching termination resistor R0 is equivalently given by a simple structure comprising the ground layer (G1) 37, the dielectric material layer 38 and the power layer (V) 36.

Similarly, in the structure shown in FIG. 12, the structure 68 is formed by sandwiching the dielectric material layer 69 and the resistor layer 70 by the power layer (V) 71 and the ground layer (G) 72. While the structure to closely contact the resistor layer 70 to the ground layer (V) 71 is shown, an additional resistor layer may be provided, which is closely contacted to the ground layer (G) 72.

FIG. 12(b) shows a sectional structure of the structure 73 having the resistor layer 70 of FIG. 12(a) formed at a center of the inside of the dielectric material layer 70.

The resistor layer 74 is sandwiched by the dielectric material layers 69-1 and 69-2.

As shown in FIG. 12(c), the shape of the resistor layer 70 in the structure of FIG. 12(a) may be of frame shape. FIG. 12(d) shows a sectional structure of the structure 75 of FIG. 12(c).

The structures of FIGS. 12(a) and 12(b) may be of multi-layer shape, and additional resistor layer may be formed on a side of such structure.

An example in which such structure is actually applied to a circuit board is shown below.

Figure 1:
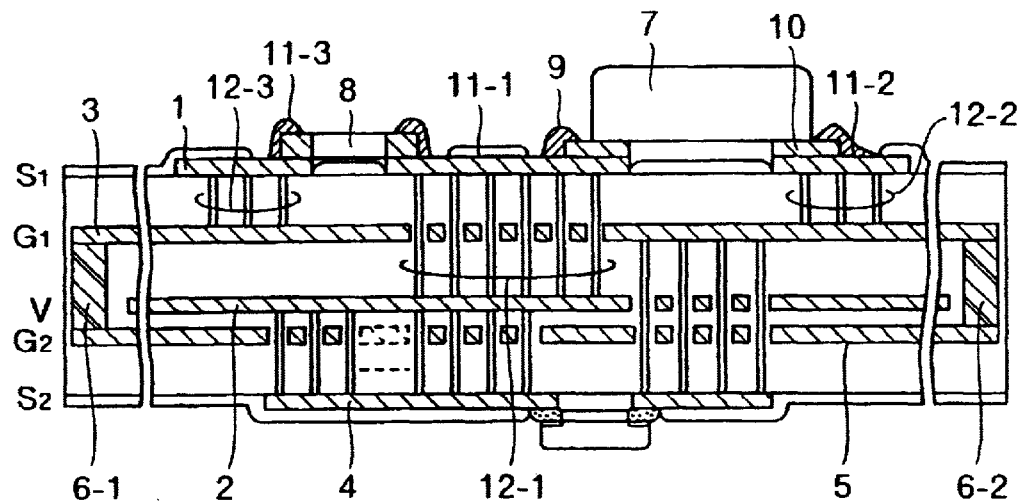
FIG. 1 shows a sectional view of a five-layer circuit board in accordance with an embodiment of the present invention.

FIG. 1 shows a sectional structure of a five-layer circuit board to which the structure of FIG. 2 is applied.

The five-layer circuit board is formed by a four-layer circuit board comprising a signal layer (S1) 1, a power layer (V) 2, a ground layer (G: G1) 3 and a signal layer (S2) 4 (a dielectric material layer is omitted in FIG. 1) and additional ground layer (G2) 5 and resistor layers 6 (6-1, 6-2) added thereto, and the power layer (V) 2 and the resistor layer 6 are arranged between the ground layer (G1) 3 and the ground layer (G2) 5 and the resistor layer 6 is arranged around the power layer (V) 2.

When the five-layer circuit board is rectangular, the shape of the resistor layer 6 is of frame shape to conform to the outer shape of the ground layer (G1) 3 and the ground layer (G2) 5.

The external components such as the IC parts 7 and the bypass capacitor 8 are mounted on the signal layer (S1) 1. The power lead 9 and the ground lead 10 of the IC parts 7 are formed on the signal layer (S1) 1 by the solid etching and they are connected to the power layer (V) 2 and the ground layer (G1) 3, respectively, through the conductor patterns 11-1 and 11-2 formed for the electrical and mechanical connection and the through-holes 12-1 and 12-2 formed between layers, The bypass capacitor 8 is connected in the same manner and it may be mounted on the signal layer (S2) 4.

The through-holes 12 are multi-point through-holes to reduce the inductance L.

The structure 13 shown in FIG. 2 may be directly applied to the IC part 7 of FIG. 1 and the chip element (not shown in the drawing) of the IC part 7 is arranged in the dielectric material layer 14. The chip element (not shown in the drawing) may be arranged on the die electric layer 15. By simultaneously forming the structure 13 for the circuit board as well as the IC part 7 mounted on the circuit board, the radiation may be further suppressed.

The reason that those structures and circuit board can suppress the spurious radiation is that the low Q or the matching termination is attained y the resistor. The function of the resistor to attain the low Q or the matching termination is now explained.

The principle of the present invention is common to all embodiments of the present invention, but for the sake of explanation, the structure and the circuit board shown in FIGS. 1 and 2 are explained as examples.

The function of the resistor to absorb the potential fluctuation caused by the low Q is first explained.

FIG. 3 shows modeling of a sectional structure of the structure 13 shown in FIG. 2 into an equivalent circuit of resistors.

The potential fluctuation V1 20 generated in the capacitor C1 19 is divided into a voltage V 221 of the capacitor C 2 and a voltage Vr 22 of a parallel circuit of the resistor Rc 16 and the capacitor Cc 17.

Figure 4:
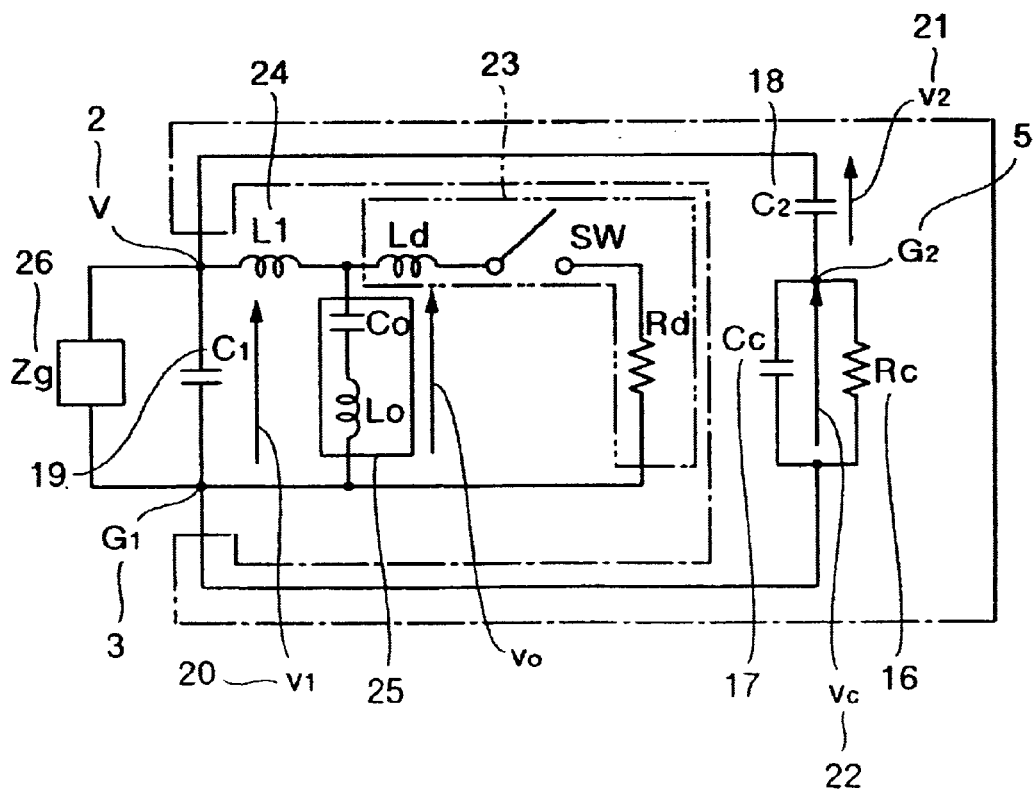
FIG. 4 shows an equivalent circuit diagram of the five-layer circuit board of FIG. 1.

FIG. 4 shows an equivalent circuit of the five-layer circuit board of FIG. 1 having the structure 13 built therein.

The five-layer circuit board comprises components of a capacitor C1 19, a device equivalent circuit 23 comprising a series connection of an inductance Ld, a load resistor Rd and a switch SW as the IC parts 7, an inductance L1 24 formed by a conductor pattern 11-1 formed on the signal layer (S1) 1 and a through-hole 12-1 partially connecting the conductor pattern 11-1 and the power layer (V) 2, a bypass capacitor equivalent circuit 25 comprising a series connection of a capacitor C0 and an inductance L0 having the bypass capacitor 8 connected to the conductor patterns 11-1 and 11-3 formed on the signal layer (S1) 1 and having the conductor pattern 11-3 connected to the ground layer (G1) 3 through the through-hole 12-3, and an impedance Zg 26 (not shown in FIG. 1) by the power layer for supplying a DC voltage E0 (not shown in FIG. 4 because it is an AC circuit) to the power layer (V) 2 and the ground layer (G1) 3.

The device equivalent circuit 23 and the bypass capacitor circuit 25 forms a parallel circuit, this parallel circuit and the inductance L1 24 forms a series circuit, and this series circuit, the impedance Zg 26 and the capacitor C1 19 forms a parallel circuit. The circuit may be equivalently represented by a parallel connection of the above parallel circuit and a series connection of a parallel circuit of the resistor Rc 16 and the capacitor Cc 17 of the structure 13 and a capacitor C2 18. A block encircled by broken lines corresponds to the portion of the structure 13 of FIG. 3.

Figure 5:
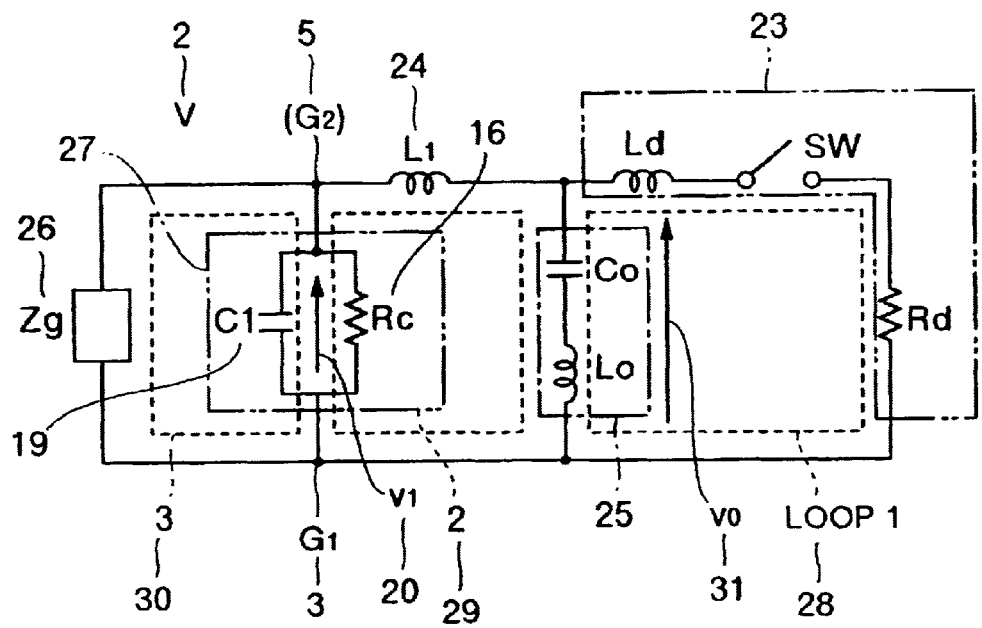
FIG. 5 shows an equivalent circuit diagram when

FIG. 5 shows an equivalent circuit when FIG. 4 is given at a specific frequency region (radiation suppression region).

When the resistor Rc 16 is selected to be sufficiently smaller than the impedance Zcc of the capacitor Cc 17 and sufficiently larger than the impedance Zc2 of the capacitor C2 18, an equivalent circuit 27 of the structure 13 viewed from the power layer (V) 2 and the ground layer (Gi) 3 may be regarded as the parallel circuit of the capacitor C1 19 and the resistor Rc 16. At this time, since a voltage V2 21 generated across the capacitor C2 18 may be regarded as zero, the ground layer (G2) 5 and the power layer (V) 2 match.

Namely, when the specific frequency region is given by using an angular frequency by:

$$\omega_{min} \leq \omega \leq \omega_{max} \tag{1}$$

a condition of $$\omega_1 \leq \omega_{min} \text{ and } \omega_{max} \leq \omega_2 \tag{2}$$

where $$\omega_1 = 1/(C_2 \cdot R_c) \tag{3}$$

$$\omega_2 = 1/(C_c \cdot R_c) \tag{4}$$

in order to give the equivalent circuit of the structure 13 by the parallel circuit 27 of the capacitor C1 19 and the resistor Rc 16 (in order to make it to the equivalent circuit shown in FIG. 5).

The present invention aims to absorb the potential fluctuation generated between G1 and V, that is, the potential fluctuation developed in C1 19 by the resistor, that is, Rc. An index representing a ratio of the stored energy and the consumed energy is defined as a Q-value, and the smaller the Q value is, the more efficiently is the stored energy consumed. For example, when Q=1, it means that the energy generated in one period is consumed in that one period. The Q value of the structure shown in FIG. 5 is given by:

$$Q = \omega C1 Rc \quad (5)$$

and it is seen that the resistor R should be low in order to reduce the Q value. Namely, the resistor may be a conductor to reduce the Q value.

Should the resistor of the present structure be not present, a portion which consumes the energy generated in C1 would be substantially zero (it only depends on the resistance specific to the circuit board material itself) and the energy would contribute to the emission as the spurious radiation.

Accordingly, the Q value in the formula (5) is set to not larger than 10 which is experimentally confirmed as good, the vibration energy exchanged at every half period in the capacitor C1 19 is simultaneously consumed by the resistor Rc 16, the potential fluctuation V1 20 generated between the power layer (V) 2 and the ground layer (G1) 3 is absorbed, and the spurious radiation is suppressed.

FIG. 5 has three closed loops, a loop 1 28 comprising the device equivalent circuit 23 and the bypass capacitor equivalent circuit 25, a loop 2 29 comprising the bypass capacitor equivalent circuit 25, the inductance L1 24 and the parallel circuit 27, and a loop 3 30 comprising the parallel circuit 27 and the impedance Zg 26. The resonance of the loop 2 and the loop 3 which generate the potential fluctuation V1 as the drive voltage source may be suppressed by setting the Q value of the parallel circuit 27 to a small value.

Further, the potential fluctuation V1 20 is given by the division of the potential fluctuation V0 31 generated across the bypass capacitor equivalent circuit 25 at the switching of the device equivalent circuit 23 by the impedance ratio of the parallel circuit 27 and the inductance L1 24.

In order to effectively suppress the potential fluctuation V0 31 which is the drive voltage source of the potential fluctuation V1 20, the impedance ratio of the inductance L1 24 to the parallel circuit 27 may be set sufficiently low. However, it is necessary that the impedance of the parallel circuit 27 is sufficiently smaller than the impedance Zg 26.

Means for suppressing the spurious radiation by the matching termination in the structure 13 is now explained.

The parallel plate line structure (A) is formed by two solid layers of the ground layer (G1) 3 and the ground layer (G2) 5 and the matching termination resistor R0 is given by the resistor layer 6 arranged at the line end. The parallel plate line structure (A) is of rectangular shape having a major side length of a0 and a minor side length of b0 and has two lines, a minor side line and a major side line, and the matching termination resistors Ro comprising R01 and R02 is represented as follows:

$$R0 = (dc/a0) \cdot \sqrt{(\mu 0 - \mu r)/(\epsilon 0 - \epsilon r)} \quad (6)$$

$$R02 = (a0/b0) \cdot R01 \quad (7)$$

where dc: gap length between ground layer (G1) 3 and ground layer (G2) 5

$\mu r$: specific dielectric constant determined by structure and material of the structure 13

$\epsilon r$: specific permeability determined by structure and material of the structure 13

When the plate shape of the line structure is other than rectangular shape, it may be sub-divided and handled as a set of a plurality of rectangular lines.

Two further parallel plate line structures (B) and (C) are formed by the ground layer (G1) 3 and the power layer (V) 2 arranged in the ground layer (G2) 5. In this case, since an open end (capacitor termination) is provided, a standing wave due to the potential fluctuation V1 20 or the potential fluctuation V0 31 is generated and the frequency thereof is determined by the structure and the material of the line. Since the two parallel plate line structures (B) and (C) are formed in the parallel plate line structure (A), the generated standing wave is absorbed by the matching termination resistors R0 (R01 and R02).

The shield effect is attained by covering the power layer (V) 2 which generates the potential fluctuation V1 for the ground layer (G1) 3 by the closed parallel plate line structure (A) comprising the ground layer (G1) 3, the ground layer (G2) 5 and the resistor layer 6.

By covering the surface of the power layer (V) 2 and the opposing inner surfaces of the ground layer (G1) 3 and the ground layer (G2) 5 by the resistor film, an attenuation constant a of each of the parallel plate line may be increased to suppress the potential fluctuation V1 20 (standing wave) generated at the end of the line.

The resistor Rc for lowering the Q value of the parallel circuit 27 (to not larger than 10) and the matching termination resistor R0 (R01, R02) may meet a certain relation.

In this manner, at the switching of the IC device, the potential fluctuation (resonance) generated in the power supply loop including the IC device and the package parts and the parallel plate lines is absorbed and the direct spurious radiation due to the potential fluctuation and the spurious radiation due to the generation of the standing wave are also suppressed.

Figure 6:
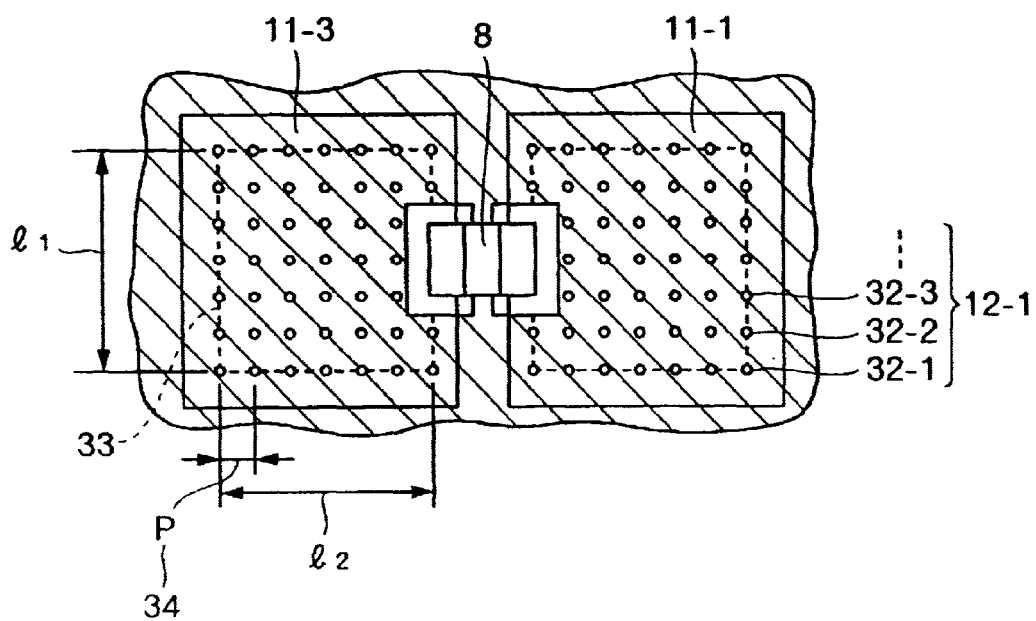
FIG. 6 shows a plan view of a structure for reducing an inductance L1 in accordance with other embodiment of the present invention.

FIG. 6 shows a plan structure for reducing the inductance L1 24 in accordance with one embodiment of the present invention.

The inductance L1 24 is formed by the shape and the structure of the conductor pattern 11-1 and the through-hole 12-1. Since the current is concentrated to the junction of the through-hole and the conductor pattern, an apparent inductance (hereinafter referred to as a lamp inductance Lc) increases.

In order to remove the lamp inductance Lc from the inductance L1, the surface area of the conductor pattern 11-1 formed on the signal layer (S1) 1 is increased and the multi-point through-hole structure 121 having a plurality of single-point through-holes 32-1, 32-2 and 32-3 is employed.

For the values of the surface area (11×12) 33 and the through-hole pitch p 34, a ratio of the lamp inductance Lc to the inductance L1 is lowered and the impedance ratio of the inductance l1 24 to the parallel circuit 27 shown in FIG. 5 is lowered sufficiently (not larger than 0.1).

In FIG. 5, when the inductance L1 24 is removed by the above means, the parallel circuit 27 and the bypass capacitor equivalent circuit 25 are equivalently connected in parallel. The potential fluctuation V0 31 is equivalently applied directly to the parallel circuit 27 and it is equal to the potential fluctuation V1 20. The Q of the circuit of the parallel connection of the bypass capacitor equivalent circuit 25 and the parallel circuit 27 is lowered sufficiently so that the potential fluctuation V0 31 generated across the device equivalent circuit 23 may be effectively absorbed.

By imparting the capacitor C1 of the parallel circuit 27 by the capacitor C0 of the bypass capacitor equivalent circuit 25, the function of the bypass capacitor equivalent circuit 25 is added to the parallel circuit 27 and the bypass capacitor 8 may be eliminated and the number of parts may be reduced.

Figure 8:
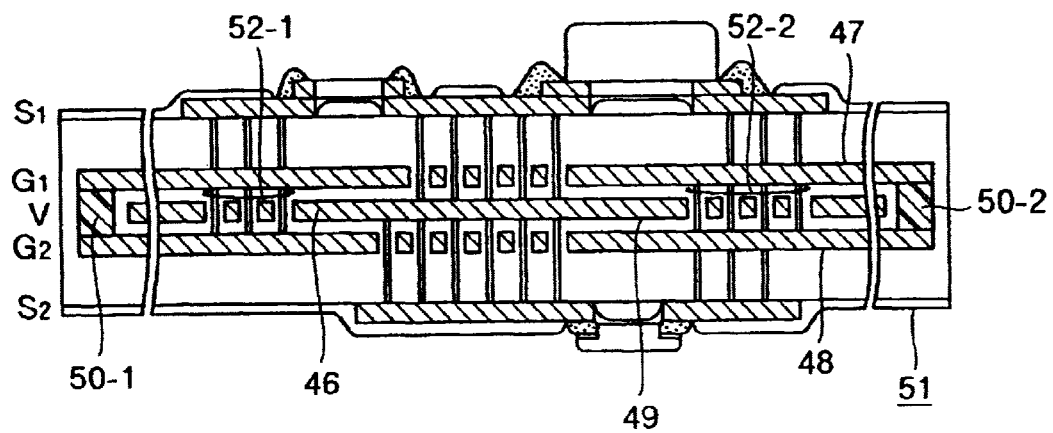
FIG. 8 shows a sectional view of a five-layer circuit board having a symmetric structure for a structure 51 in accordance with other embodiment of the present invention.

FIG. 8 shows a sectional structure of a five-layer circuit board to which the structure of the present invention is applied.

A sectional structure of a structure 51 comprising a power layer (V) 46, a ground layer (G1) 47, a ground layer (G2) 48, a dielectric material layer 49 and a resistor layer 50 (50-1, 50-2) forms a symmetric structure around the power layer (V) 46.

The above solving means 1 having the dielectric material layer 49 as a common material is built in the capacitor C1 formed by the ground layer (G1) 47 and the power layer (V) 46 and the capacitor C2 formed by the ground layer (G2) 48 and the power layer (V) 46, and the resistance Rc formed by the ground layer (G1) 47, the ground layer (G2) 48 and the resistor layer 50 is set to be sufficiently larger than the impedance of the capacitor C1 and the capacitor C2. When the dielectric lasers 49 of the capacitor C1 and the capacitor C2 are given by different materials (dielectric constants), the resistance Rc is set to be sufficiently larger than the impedance of the capacitor C1 and the capacitor C2.

When the structure 51 is viewed from the ground layer (G1) 47, the power layer (V) 46, the ground layer (G2) 48 and the power layer (V) 46, the parallel circuit of the capacitor C1 and the resistor Rc, and the parallel circuit of the capacitor C2 and the resistor Rc are formed. When compared with the structure 13 shown in FIG. 1, the structure 51 has the parallel circuit of the capacitor C2 and the resistor Rc in addition to the parallel circuit of the capacitor C1 and the resistor Rc and it effectively forms two structures. Since each of the parallel circuits is of symmetric structure, they have basically the same characteristic and meet the formulas (2)~(4) at the specific frequency region given by the formula (1).

By setting the Q1 and Q2 of the respective parallel circuits to be sufficiently low by the capacitor C1, the capacitor C2 and the resistor Rc from the formula (5), the potential fluctuation generated between the ground layer (G1) 47 and the power layer (V) 46 and between the ground layer (G2) 48 and the power layer (V) 46 are absorbed.

Further, in order to reduce the potential difference between the ground layer (G1) 47 and the ground layer (G2) 48, the layers are locally connected by the through-hole 52 (52-1, 52-2).

Figure 9:
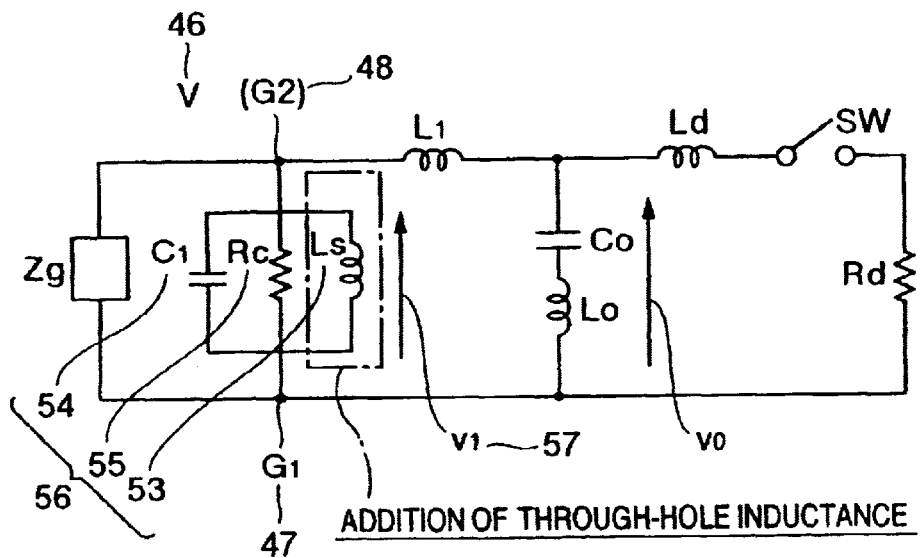
FIG. 9 shows an equivalent circuit diagram of the five-layer circuit board of FIG. 8 when through-hole connection is to be made.

FIG. 9 shows an equivalent circuit when the through-hole connection is taken into account in the five-layer circuit board of FIG. 8.

When viewed between the ground layer (G1) 47 and the power layer (V) 46, the structure 51 forms the parallel circuit 56 by a series connection of the inductance Ls 53 by the through-hole 52 (52-1, 52-2) and the parallel circuit of the capacitor C1 54 and the resistor Rc 55. When viewed between the ground layer (G1) 48 and the power layer (V) 46, similar parallel circuit is formed by replacing the capacitor C1 54 with the capacitor C2.

The Q of the parallel circuit 56 is given by:

$$Q = Rc/(\omega \cdot Ls) \quad (8)$$

$$= \omega \cdot C1 \cdot Rc \quad (9)$$

$$= Rc \cdot \sqrt{(C1/Ls)} \quad (10)$$

By forming the structure 51 which meets the condition of the formulas (1)~(4) and makes the Q value of the formulas (8)~(10) not larger than 10, the potential fluctuation V1 57 generated between the ground layer (G1) 47 and the power layer (V) 46 is absorbed.

A plurality (N) of units with the structure 51 being a basic unit are stacked to form a unit group 58 (58-1, 58-2, . . . , 58-N {N≧2}), and the ground layer (G1) 59-(K-1), the ground layer (G2) 60-(K-1) and the power layer (V) 61-(K-1) of one unit 58-(K-1) {2≦K≦N} are partially connected to the ground layer (G1) 59-K, the ground layer (G2) 60-K and the power layer (V) 61-K, respectively of other unit through the through-hole and a plurality of parallel circuits are formed between the components of the respective units to from the multilayer circuit board 62. In this manner, the potential fluctuation between the ground layer (G1) 59, the ground layer (G2) 60 and the power layer (V) 61 of the unit group 58 is suppressed.

One or more signal layers are formed between the units as required. Further, one or more signal layers (including the dielectric material layer) may be sandwiched by the two adjacent ground layers (G2) 60-(K-1) and the ground layer (G1) 59-K and the resistor layer 63-(K-1) may be arranged in the peripheral ends of the ground layer (G2) 60-(K-1) and the ground layer (G1) 59-K to form the parallel plate line structure (D) comprising the ground layer (G2) 60-(K-1), the ground layer (G1) 59-K and the resistor layer 63-(K-1). In this case, the matching termination resistor R0 is given by the resistor layer 63-(K-1) arranged at the line end. The spurious radiation from the respective signal layers arranged between units is suppressed by the shield structure by the matching terminated parallel plate line structure (D) and the concurrently formed shield structure.

Figure 10:
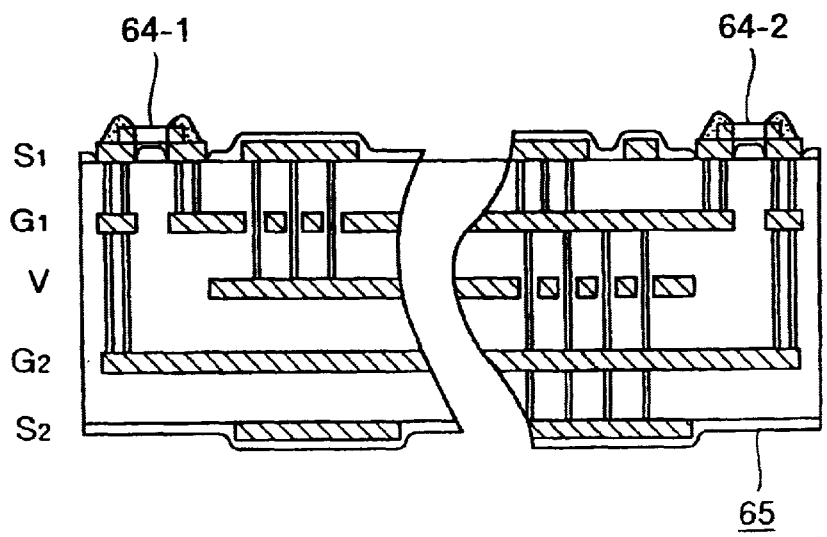
FIG. 10 shows a sectional view of a five-layer circuit board having a resistor formed on a circuit board surface by a discrete component in accordance with other embodiment of the present invention.

FIG. 10 shows another embodiment and shows a sectional view of a five-layer circuit board 65 having the resistor layer 50 of the structure 51 shown in FIG. 8 formed on the surface of the circuit board by a discrete part 64 (64-1, 64-2) such as a chip resistor. Namely, two ground layers are extended to the surface of the circuit board by the through-hole and the resistor layer is formed by using the discrete part 64. This offers an advantage that the setting of resistance is facilitated.

Figure 11:
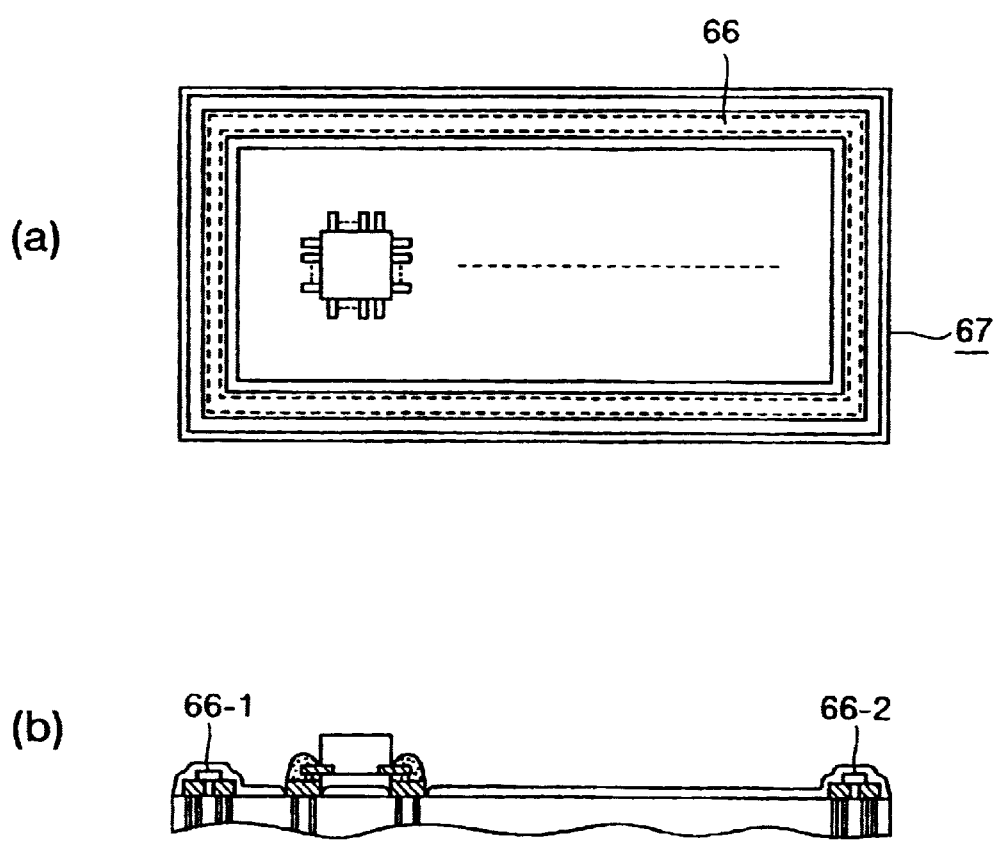
FIG. 11 shows a sectional vies of a five-layer circuit board having a resistor layer formed on the circuit board surface in accordance with other embodiment of the present invention.

FIG. 11(a) shows other embodiment and shows a sectional view of a five-layer circuit board 67 having the resistor layer 66 formed on the surface of the circuit board instead of the discrete part 64 such as the chip resistor shown in FIG. 10.

FIG. 11(b) shows a sectional structure of the five-layer circuit board 67 of FIG. 11(a).

Figure 34:
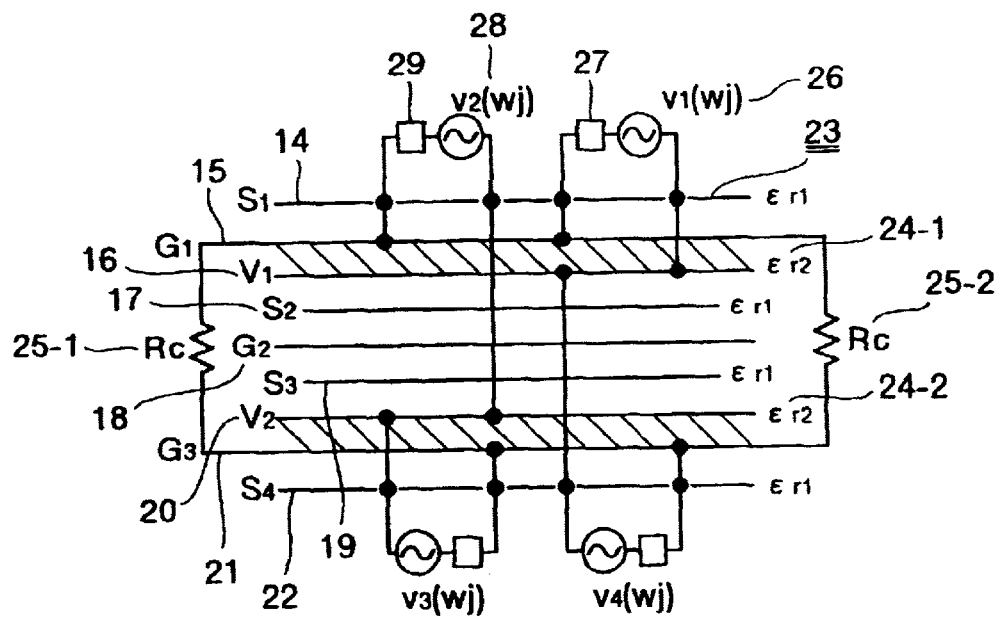
FIG. 34 shows an embodiment of the present invention an shows a nine-layer circuit board (sectional structure by simple model) having two power layers Vi, and two or more ground layers GI.

FIG. 34 show an embodiment of the present invention and shows a nine-layer structure 23 of a signal layer S1 14, a ground layer G1 15, a power layer V1 16, a signal layer S2 17, a ground layer G2 18, a signal layer S3 19, a power layer V2 20, a ground layer G3 21 and a signal layer S4 22.

In order to increase the interlayer stray capacity C2 formed by the power layer V1 16 and the ground layer G1 15 and the power layer V2 20 and the ground layer G3 21, a specific dielectric constant $\epsilon r2$ 24 (24-1, 24-2) of t he interlayer material is set to be not smaller than 10 and the layer thickness is set to 80 μm.

The matching termination resistor Rc 25 (25-1, 25-2) is connected to the end of the parallel plate line (two lines for the rectangular shape) formed by the ground layer G1 15 and the ground layer G3 21 to absorb the potential fluctuation (resonance) of the power layer V1 16 and the power layer V2 20.

The noise drive source generated at the switching of the IC or the LSI is equivalently given by two models, the power supply 26 connected to the power layer V1 16 and the ground layer G1 15 and an internal impedance Z0 27, and the power supply 28 connected to the power layer V2 20 and the ground layer G1 15 and an internal impedance Z0 29.

The line to which the power supply 26 is connected is open ended but in the lamp constant circuit, the interlayer stray capacitance C2 (bypass capacitor) having a good frequency characteristic formed by the power layer V1 16 and the ground layer G1 15 is connected so that the potential fluctuation is absorbed.

On the other hand, for the power supply 28, the potential fluctuation of the power layer V2 20 is propagated to the ground layer G3 21, and the potential fluctuation (standing wave resonance) is absorbed by connecting the matching termination resistor Rc 25 (25-1, 25-2) to the line formed by the ground layer G1 15 and the ground layer G3 21. At the same time, the Q value of the interlayer stray capacitor C1 (the specific dielectric constant of the interlayer material $\epsilon$r1: 4.7) formed by the power layer V1 16 and the power layer V2 20 is reduced (to not larger than 10) to absorb the potential fluctuation (resonance) of the power layer V2 20 to the ground layer G1 15.

Since the layer section of the circuit board 23 is of symmetric structure (including a case where the ground layer G2 18 is not present), similar effect is attained for the noise drive source connected to the opposite side. Further, the ground layer G2 18 may be used in place of the signal layer.

Figure 35:
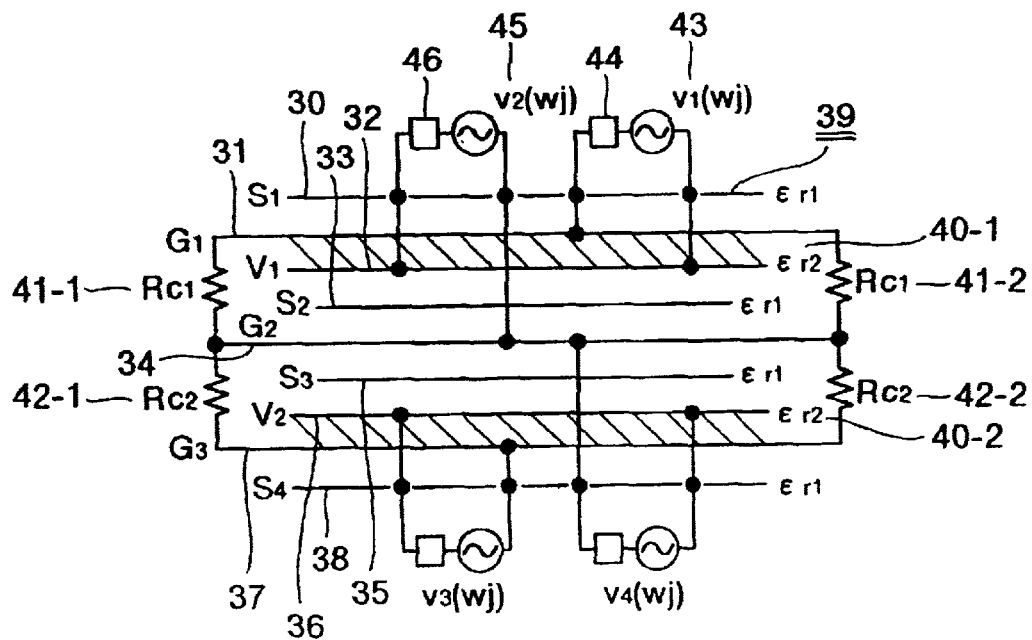
FIG. 35 show other embodiment of the present invention and shows a nine-layer circuit board (sectional structure by simple model) having two power layers Vi and three or more ground layers GI.

FIG. 35 shows other embodiment of the present invention and shows a nine-layer circuit board of a signal layer S1 30, a ground layer G1 31, a power layer V1 32, a signal layer S2 33, a ground layer G2 34, a signal layer S3 35, a power layer V2 36, a ground layer G3 37 and a signal layer S4 38. In order to increase the interlayer stray capacitance C2 formed by the power layer V1 32 and the ground layer G1 31, and the power layer V2 36 and the ground layer G3 37, the specific dielectric constant $\epsilon$r2 40 (40-1, 40-2) of the interlayer material is set to be not smaller than 10 and the layer thickness t is set to 80 $\mu$m.

The signal layers Si may be further inserted except between the two interlayers of the ground layer G1 31 and the power layer V1 32, and the power layer V2 36 and the ground layer G3 37.

The matching termination resistor Rc1 41 (41-1, 41-2) and the matching termination resistor Rc2 42 (42-1, 42-2) are connected to the ends of the two parallel plate lines (two lines for the rectangular shape) formed by the ground layer G1 31 and the ground layer G2 34, and the ground layer G3 37 and the ground layer G2 34 to absorb the standing wave resonance generated by the potential fluctuation of the power layer V1 32 and the power layer V2 36. At the same time, the Q value of the interlayer stray capacitor C1 (the specific dielectric constant of the interlayer material $\epsilon$r1: 4.7) formed by the ground layer G2 34 and the power layer V1 32, and the ground layer G2 34 and the power layer V2 36 is reduced (to not larger than 10). Usually, the Q value may be set to approximately 1 (frequency=30 MHz~1 GHz) even when the resistance Rci (i=1, 2) of the matching termination is adopted.

The noise drive source generated at the switching of the IC or the LSI is equivalently given by two models, the power supply 43 connected to the power layer V1 32 and the ground layer G1 31 and the internal impedance Z0 44, and the power supply 45 connected to the power layer V1 32 and the ground layer G2 34 and the internal impedance Z0 46.

The line to which the power supply 43 is connected is open ended but in the lamp constant circuit, the interlayer capacitor C2 (bypass capacitor) having a good frequency characteristic formed by the power layer V1 32 band the ground layer G1 31 is connected to absorb the potential fluctuation.

On the other hand, for the power supply 45, the potential fluctuation of the power layer is propagated to the ground layer G1 31 and the potential fluctuation (standing wave resonance) is absorbed by connecting the matching termination resistor Rc 41 (41-1, 41-2) to the line formed by the ground layer G1 and the ground layer G2 34. At the same time, the Q value of the interlayer stray capacitance C1 (the specific dielectric constant of the interlayer material $\epsilon$r1: 4.7) formed by the ground layer G2 34 and the power layer V1 32 is reduced (to not larger than 10).

Since the layer section of the circuit board 39 is of symmetric structure, the same effect is attained for the noise drive source connected to the opposite side.

Figure 36:
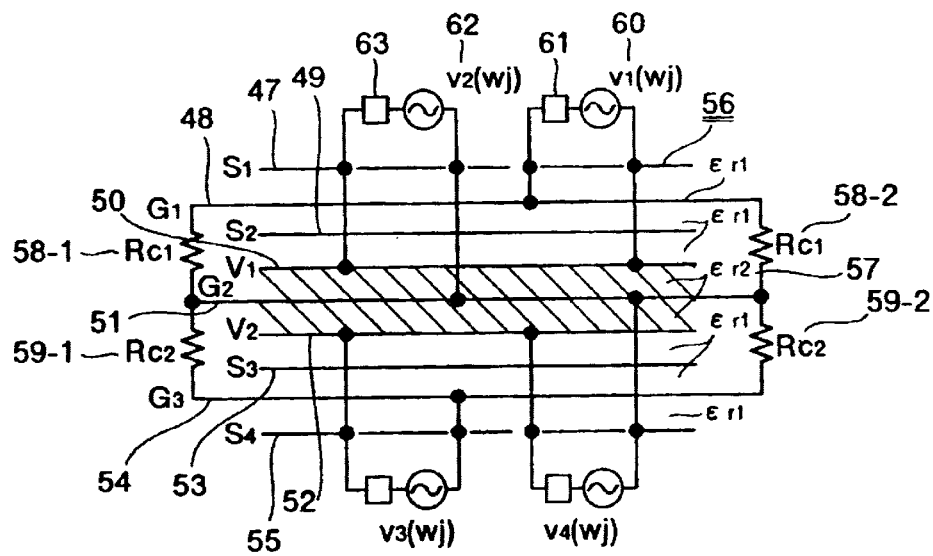
FIG. 36 shows other embodiment of the present invention and shows a nine-layer circuit board (sectional structure by simple model) having two power layers Vi and three ground layers GI and one of the ground layers having sandwiched by the two power layers.

FIG. 36 shows an embodiment of the present invention and shows a nine-layer circuit board 56 comprising a signal layer S1 47, a ground layer G1 48, a signal layer V2 52, a signal layer S3 53, a ground layer G3 54 and a signal layer S4 55. In order to increase the interlayer capacity C2 formed by the power layer V1 50 and the ground layer G2 51, and the power layer V2 52 and the ground layer G2 51, the specific dielectric constant of the interlayer material $\epsilon$r2 57 is set to be not smaller than 10 and the layer thickness t is set to 80 $\mu$m. The capacitance which offers the performance of the bypass capacitor (for example, approximately 0.01 $\mu$F) may be provided and the bypass capacitor as a discrete part may be eliminated.

Signal layers Si may be further inserted between layers except between the ground layer G2 51 and the power layer V1 50 and between the power layer V2 52 and the ground layer G2 51 in which the high dielectric material layers are inserted to form the multi-layer circuit board of more than nine layers.

The matching termination resistors Rc1 58 (58-1, 58-2) and the matching termination resistor Rc2 59 (59-1, 59-2) are connected to the ends of the two parallel plate lines (two lines for the rectangular shape) formed by the ground layer G1 48 and the ground layer G2 51, and the ground layer G3 54 and the ground layer G2 51 to absorb the standing wave resonance generated by the potential fluctuation of the power layer V1 50 and the power layer V2 52. At the same time, the Q value of the interlayer stray capacity C1 (the specific dielectric constant of the interlayer material $\epsilon$r1: 4.7) formed by the ground layer G1 48 and the power layer V1 50, and the ground layer G3 54 and the power layer 54 is reduced. By setting the Q value to be not larger than 10, the resonance may be effectively suppressed and removed. Usually, the resistance Rci (I=1, 2) of the termination resistor which is determined by the structure and the material ($\epsilon$r, $\mu$r) of the line is adopted and the Q value is set to approximately 1 (frequency f=30 MHz~1 GHz).

The noise drive source generated at the switching of the IC or the LSI may be equivalently given by two models, the power supply 60 connected to the power layer V1 50 and the ground layer G1 48 and the internal impedance Z0 61, and the power supply 62 connected to the power layer V1 50 and the ground layer G2 51 and the internal impedance Z0 63.

The line to which the power supply 62 is connected is open ended but in the lamp constant circuit, the interlayer stray capacitor C2 (bypass capacitor) having a good frequency characteristic formed by the ground layer V1 50 and the ground layer G2 51 is connected to absorb the potential fluctuation.

On the other hand, for the power supply 60, the potential fluctuation of the power layer V1 50 is propagated to the ground layer G2 51, and the potential fluctuation (standing wave resonance) is absorbed by connecting the matching termination resistor Rc1 58 (58-1, 58-2) to the line formed by the ground layer G2 51 and the ground layer G1 48. At the same time, the Q value of the interlayer capacitor C1 (the specific dielectric constant of the inter layer material $\epsilon$r1: 4.7) formed by the ground layer G1 48 and the power layer V1 50 is reduced (to not larger than 10).

Since the layer section is of symmetric structure, the same effect is attained for the noise drive source connected to the opposite side.

Figure 37:
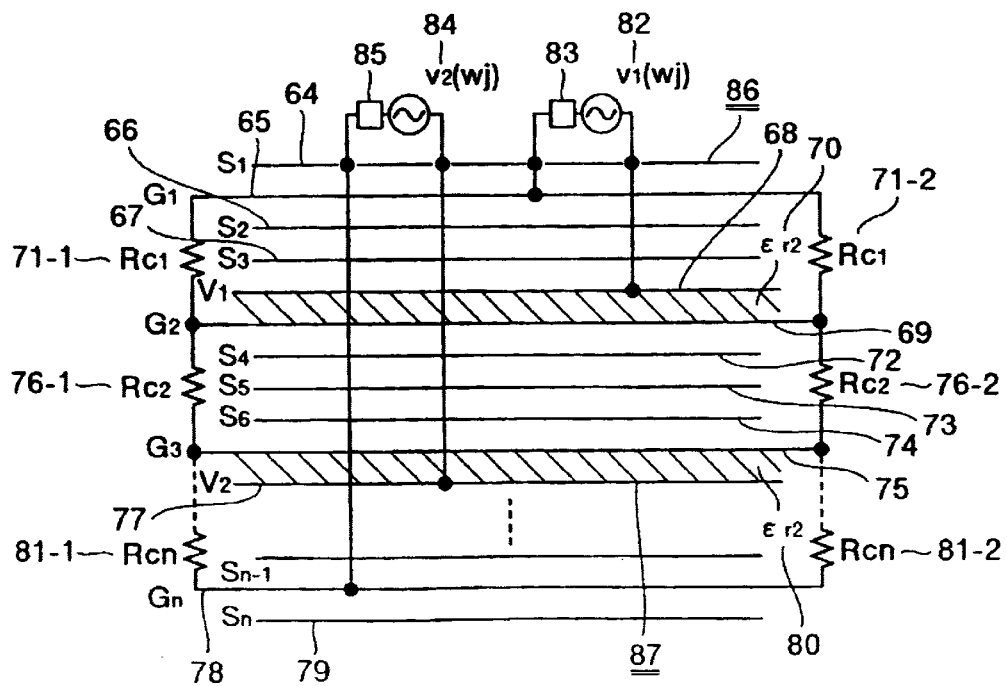
FIG. 37 shows other embodiment of the present invention and shows a multi-layer circuit board (sectional structure by simple model) having a plurality of power layers Vi and ground layers GI.

FIG. 37 shows other embodiment of the present invention.

The IC drive source represented by the series connection model of the power supply 82 and the internal impedance Z0 83 is mounted on the signal layer S1 64, and two terminals thereof are connected to the ground layer G1 65 and the power layer V1 68. The power layer V1 68 is sandwiched by the ground layer G1 65 and the ground layer G2 69 together with the signal layer S1 66 and the signal layer G2 69. The potential fluctuation of the power layer V1 68 is absorbed by the ground layer G2 69, and the matching termination resistor Rc 71 (71-1, 71-2) is connected to the ends of the ground layer G1 65 and the ground layer G2 69 which forms the line to absorb and remove various resonance energies. At the same time, the Q value of the interlayer stray capacitor C1 formed by the power layer V1 69 and the ground layer G1 65 is reduced. Namely, the resonance represented by the distributed constant circuit and the lamp constant circuit is suppressed and removed.

The above layer structure from the ground layer G1 65 to the ground layer G2 69 is used as a basic unit (constituent unit) 86 and a plurality of basic units 86 are stacked and the line is formed by the ground layer G2 69 of the constituent unit 86 and the ground layer G3 75 of other adjacent constituent unit 87. By connecting the matching termination resistor Rc2 at the end of the line, the potential fluctuation (resonance) between constituent units is absorbed and removed. Since the high dielectric material layer is not used in the line, the signal layer S4 72, the signal layer S5 73 and the signal layer S6 74 are arranged. The ground layers are DC connected to each other.

Figure 38:
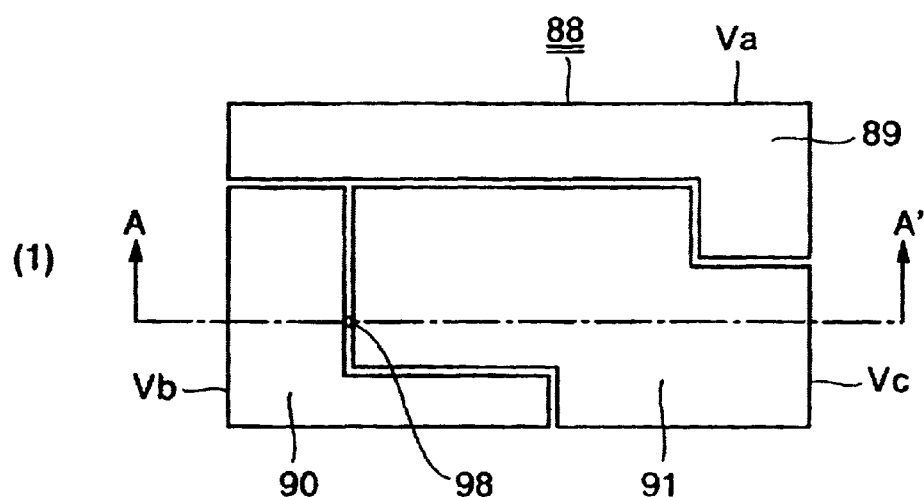
FIG. 38-(1) shows other embodiment of the present invention and shows a seven-layer circuit board (plan view of the power layer V) when the power layer V is divided into three patterns.
Figure 38:
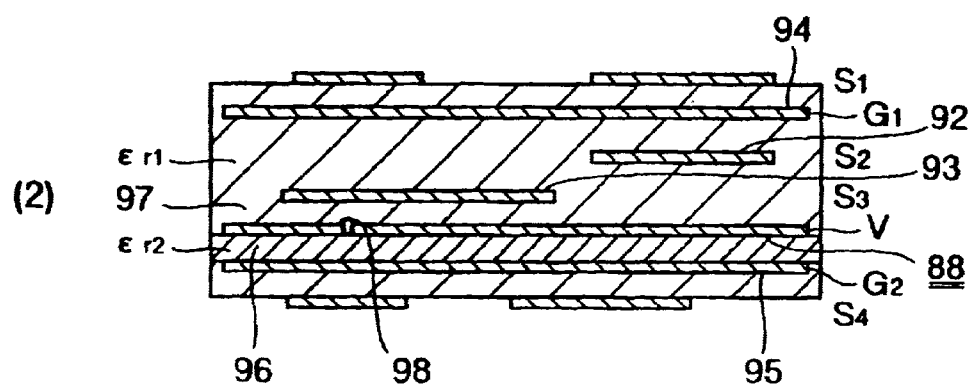

FIG. 38(1) shows an embodiment of the present invention, in which the power layer V88 for supplying various power voltages is divided into three insulated patterns Va 89, Vb 90 and Vc 91. As shown in FIG. 38(2), the power layer V 88 is sandwiched by the ground layer G1 94 and the ground layer G2 95 together with the signal layer S2 92 and the signal layer S3 93, and the dielectric material layer 96 having the specific dielectric constant of $\epsilon r2$: 10 or higher and the thickness of 80 $\mu$m is used between the ground layer G2 95 and the power layer V 88.

The potential fluctuation (including the resonance) of the power layer V 88 having the divided and insulated patterns Va 89, Vb 90 and Vc 91 is absorbed by the ground layer G2 95 connected through a low impedance. In order to suppress and remove the potential fluctuation, the conversion to Joule's heat is conducted by the matching termination resistor Rc (not shown) connected to the end of the line (two lines for the rectangular circuit board) formed by the ground layer G1 94 and the ground layer G2 (95). When the Q value of the interlayer stray capacity C1 formed by the ground layer G1 94 and the power layer V 88 is reduced in order to suppress and remove the potential fluctuation of the power layer V 88 for the ground layer G1 94, the resistor (short-circuit structure) may be arranged at other than the end of the circuit board. In this case, the potential fluctuation (resonance) which may be handled by the lamp constant circuit can be suppressed and removed.

Further, the dielectric material layer 97 having the specific dielectric constant of $\epsilon r1$: 4.7 is used between the power layer V 88 and the ground layer G1 94 and a high speed wiring is formed in the signal layer S2 92 and the signal layer S3 93. A return current path of the signal line arranged in the signal layer S3 93 adjacent to the power layer V 88 is formed in the power layer V 88, that is, in the two insulated power patterns Vb 90 and Vc 91 as shown in FIG. 38(1). The disturbance of the return current of the signal line (not shown) and the impedance occurs at the insulated portion 98 between patterns, which cause the distortion of the signal waveform and the increase of the spurious radiation. In the embodiment shown in FIG. 38(2), the ground layer G2 95 is arranged closely to the power layer V 88 with the spacing of 80 $\mu$m and the dielectric material layer 96 having the specific dielectric constant of $\epsilon r2$: 10 or higher is used to suppress and remove the distortion of the return current path and the impedance.

Figure 39:
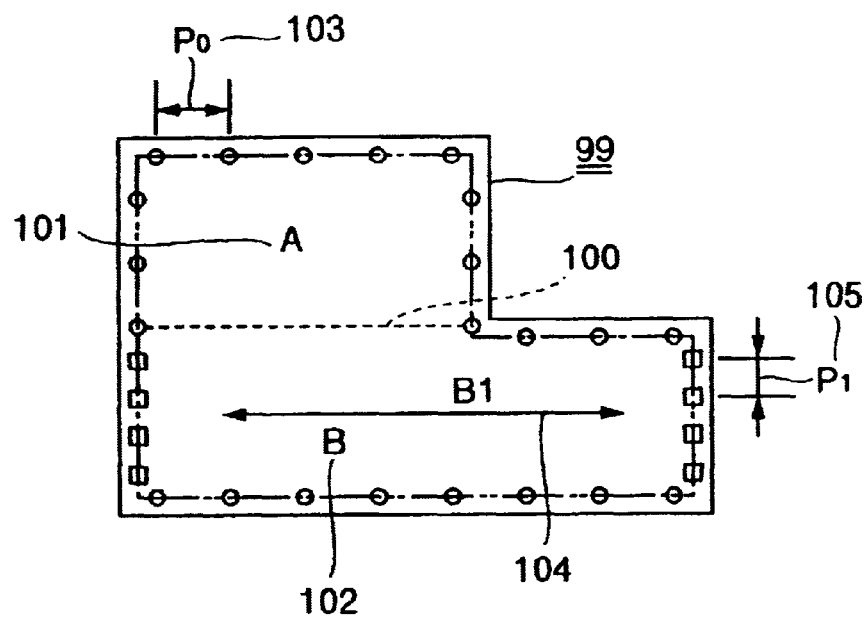
FIG. 39 shows other embodiment of the present invention and shows a multi-layer circuit board (plan view) when the ground layer and the power layer are not rectangular.

FIG. 39 shows an embodiment of the present invention and shows an arrangement structure of the discrete resistor (chip resistor) connected at the end of the line formed by the two ground layers G1 and G2 in which the power layer V is sandwiched.

When the outer shapes of the ground layer G1 and the ground layer G2 which are basically identical in shape are rectangular, the matching termination resistance Rci (i=1, 2) is derived from a calculation formula by the parallel plate line model. In order to attain the resistance by the chip resistor (discrete resistor), the circuit connection of the chip resistor is conducted by electrodes formed by extending from the ground layer G1 and the ground layer G2 to the surface layer (signal layer S1) of the circuit board by the through-hole. For the rectangular shape, since two lines are formed in the minor direction and the major direction, the matching termination resistors Rci (i=1, 2) are connected respectively, and in order to secure the matching termination condition in the planar circuit, the connection structure similar to that of the distributed constant circuit in which the inductance components which depend on the through-hole and the resistor connection points (number of points) are reduced as much as possible is used. At the same time, in order to secure the low Q value, the occurrence of the inductance component is suppressed.

Specifically, the number of chip resistors to be connected is increased to reduce the lamp inductance generated by the concentration of the current. Further, for the through-holes, multi-point through-holes are formed in the electrode of as large area as possible to reduce the inductance components which depends on the connection structure.

In the multi-layer circuit board having the power layers and the ground layers, there are two types of resonance (standing wave resonance and loop resonance) which serve as the radiation sources, and the matching termination and the low Q value are used to suppress and remove those resonances. When the resistor is formed by the chip resistor, the inductance component generated by the connection structure of the chip resistor cannot be neglected and the restriction condition imparted differs between the matching termination and the low Q value.

For the former, the resonance occurs by the formation of the parallel plate line having the conductor plane between the power layer and the ground layer open ended, and the matching termination by the distributed constant circuit is required. Accordingly, the impedance of the inductance component caused by the number of chip resistors the electrode structure for connecting the chip resistors is reduced by one order to compare with the matching termination resistance Rc to prevent the affect to the matching termination condition.

For the latter, the resonance occurs between the interlayer stray capacitor formed between the power layer and the ground layer and the inductance of the bypass capacitor at the frequency range (10 MHz~1 GHz) in which the bypass capacitor normally behaves as the inductance. In this case, the inductance component equivalently formed the drive IC and the power filter connected between the power layer and the ground layer and mounted on the circuit board may be neglected with respect to the inductance component of the bypass capacitor. The resonance in this case is the parallel resonance, and since the inductance component is reduced as the number of bypass capacitors increases, the resonance frequency usually tends to increase although it depends on the packaging condition on the circuit board.

As the inductance connected between the power layer and the ground layer is reduced in this manner, the inductance component which is serially connected to the chip resistors by the connection structure of the resistor required for the low Q value cannot be neglected. When the inductance component of the bypass capacitor which is parallelly connected to the interlayer stray capacitor is smaller than the inductance component caused at the connection of the chip resistors, the low Q value of the interlayer stray capacitor is prevented. Namely, it is difficult to attain the low Q value on the circuit for the inductance component of the bypass capacitor in place of the interlayer stray capacitor. In phenomenon, since the electromagnetic energy stored in the interlayer stray capacitor flows to the inductance component of the low impedance bypass capacitor, the conversion to the Joule's heat by the chip resistor is not attained. Accordingly, in this case, in order to meet the low Q value condition, the inductance component of the bypass capacitor is set to be larger than the inductance component.

When the increase of the interlayer stray capacity between the power layer and the ground layer is used instead of the bypass capacitor, the inductance component of the bypass capacitor is eliminated but the inductance component equivalently formed by the parts mounted on the circuit board such as the drive IC and the power filter imparts the affect instead. In this case, again, in order to meet the low Q value condition, the inductance component generated at the connection of the chip resistor is set to be larger than the inductance component which is parallelly connected to the interlayer stray capacitor.

When the chip resistors are increased from 1 chip/side to m, n chips/side (even arrangement) in order to connect the chip resistors in the distributed constant circuit manner, the resistances of m times and n times of the matching termination condition are connected. The numbers m and n are set to sufficiently reduce the affect of the inductance component to the matching termination resistor. For the multi-layer printed circuit board, it has been experimentally confirmed that the pitch of approximately one inch at the connection points of the chip resistors does not cause a problem.

Although two matching termination resistance Rci (i=1, 2) are prepared because of the rectangular shape, only one may be prepared in principle. In this case, however, the pitch P to connect the chip resistors should be constant. Conversely, when the pitch P is increased by the factor of k, the resistance of the chip resistor should be reduced by the factor of k.

When the parallel plate line 99 formed by the ground layer G1 and the ground layer G2 of the same shape is not rectangular as it is in the present embodiment, it is divided into two rectangular lines A 101 and B 102 shown by a broken line 100. Other division method may be selected. In the line A 101 and the line B 102, the pitch P to arrange the chip resistors is set to constant pitch P0 103. The resistance used here is given by the pitch P0 103 rather than the shape dimension of the line. For the longitudinal line B1 104 of the line B 102, the pitch P1 105 which is one half of the pitch P0 103 is used to secure the precision of the matching termination condition. When only the low Q value is desired by disregarding the matching termination condition, the connection structure of the chip resistors adopts the even arrangement over the entire area. In this case, again, it is necessary to secure certain number of connections, that is, the number of connections per unit area in order to eliminate the affect of the inductance component.

Figure 40:
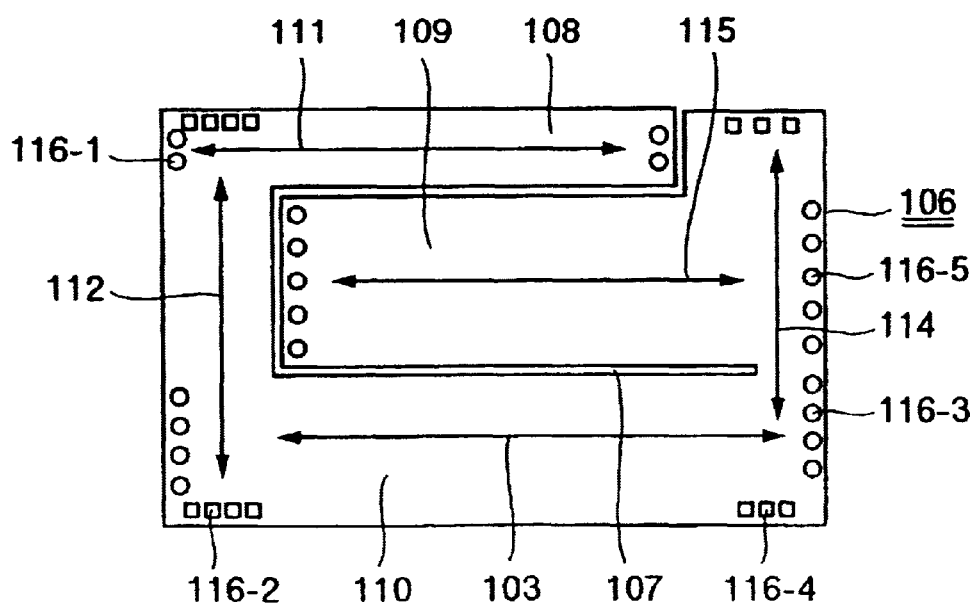
FIG. 40 shows other embodiment of the present invention and shows a multi-layer circuit board (plan view) when a cut line is provided in one of the two ground layers G1 and G2 between which the power layer V is sandwiched.

FIG. 40 shows an embodiment of the present invention in which a cut line 107 is formed in the ground layer G1 106 which is loosely capacitively coupled to the power layer V and the impedances of the ground area 110 and the ground area 109, and the ground area 109 and the ground area 110 are set to be high. The structure which prevents the propagation of the potential fluctuations of the respective ground areas to each other is formed to secure the noise margin in the signal circuit. On the other hand, for the ground layer G2 which is closely capacitively coupled to the power layer V, the cut line is usually not formed because the potential fluctuation is propagated even if the cut line is formed. When the power layer V is divided, a good characteristic is exhibited in the formation of the return current path of the high speed signal line.

In order to absorb the potential fluctuation generated in the divided ground layer G1 106, a parallel plate line is provided for the ground layer G2 for each ground area of the ground layer G1. In order to form the matching termination condition for the longitudinal line 111, the line 112, the line 113, the line 114 and the line 1215 while taking the resonance structure into account, the chip resistors 116 (116-1, 2, 3, . . . ) arranged at different pitches P are connected. The connection of the chip resistors 116 is conducted by soldering to the electrodes pulled out to the signal layer S which is the surface layer from the respective ground layers through the through-holes.

Figure 41:
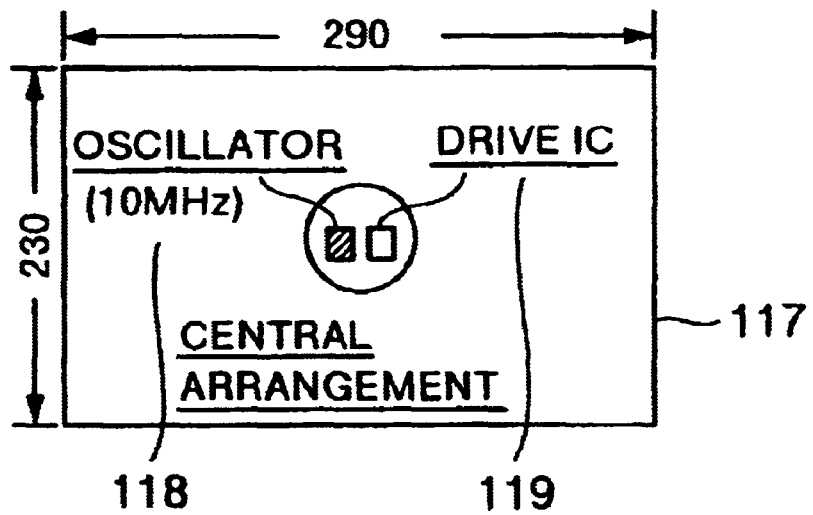
FIG. 41 shows other embodiment of the present invention and shows a five-layer printed circuit board (plan vies and sectional view) when the matching termination and the low-Q are applied.
Figure 41:
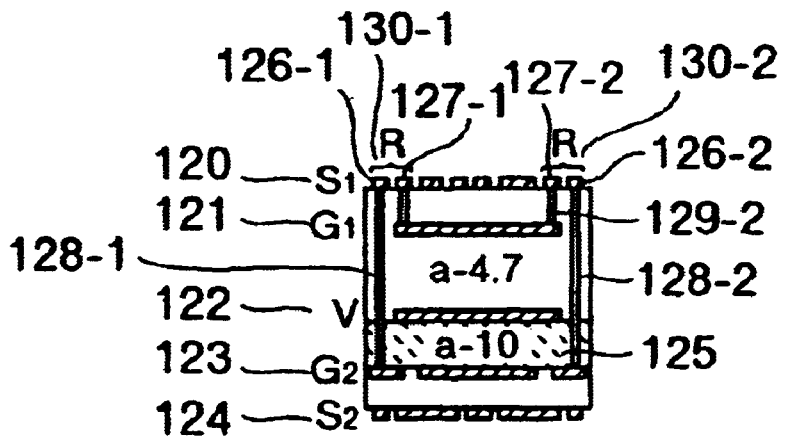

FIG. 41 shows an embodiment of the present invention and shows a five-layer printed circuit board (new circuit board) 117 having a board dimension of 290 mm×230 mm×1.6 mm.

In order to evaluate the matching termination and the low Q value in the radiation characteristic, an oscillator (10 MHz) 118 and a drive IC 119 are arranged at a center of the board and are locally shielded by a conductor case. A waveform of the output voltage is rectangular and the radiation characteristic to the harmonic components is provided.

The layer structure of the new circuit board 117 is of five-layer of a signal layer S1 120, a ground layer G1 121, a power layer V 122, a ground layer G2 123 and a signal layer S2 124. The matching termination and the low Q value are secured by using the dielectric material layer 125 having the specific dielectric constant of $\epsilon r$: 10 and the layer thickness of 80 $\mu$m between the power layer V 122 and the ground layer G2 123. For the electrodes 126 (126-1, 126-2) and 127 (127-1, 127-2) formed on the surface signal layer S1 120, the through-holes 128 (128-1, 128-2) and 129 (129-1, 129-2) pulled out of the ground layer G2 123 and the ground layer G1 121, respectively, are connected. The shape and the arrangement of the electrode 126 and the electrode 127 are double frame shape along the outer periphery of the circuit board. A plurality of chip parts 130 (130-1, 130-2,) which are discrete parts are connected between electrodes. In order to form the matching termination resistor, approximately ten chip resistors of approximately 10 are connected to the major side and the minor side. The Q value is not larger than 10 for the frequency region of 30 MHz~1 GHz and the low Q value is also attained. The through-holes are formed at multiple points at a high density to prevent the affect of the inductance component to the matching termination and the low Q value.

Printed circuit resistors may be used in place of the chip resistors. The frame shape resistor is formed to conform to the shapes of the electrode 126 and the electrode 127. Further, the printed circuit resistors may be formed in the circuit board (inner layer resistor) by using the ground layer G1 121 or the ground layer G2 123. Since it is not necessary to pull out by the through-hole, the inductance component may be reduced. Further, since the chip resistors are not mounted, the packaging density may be increased.

When the frame shape inner layer resistors are formed in the ground layer G1 121 and the ground layer G2 123 to meet only the condition of low Q value, the power layer V 122 is sandwiched by the ground layer 121 and the ground layer G2 123 and the periphery is covered by the multi-point through-holes and the conductor walls. In this case, since the inductance component by the connection structure of the internal layer resistors may be significantly reduced, the low Q value condition may be met even when the inductance component equivalently formed by the parts mounted on the circuit board such as the bypass capacitor and the drive IC connected between the power layer V 122 and the ground layer G1 121 is reduced.

The degree of low EMI of those structure with respect to the prior art structure is now explained with reference to FIG. 42 and FIG. 43.

Figure 42:
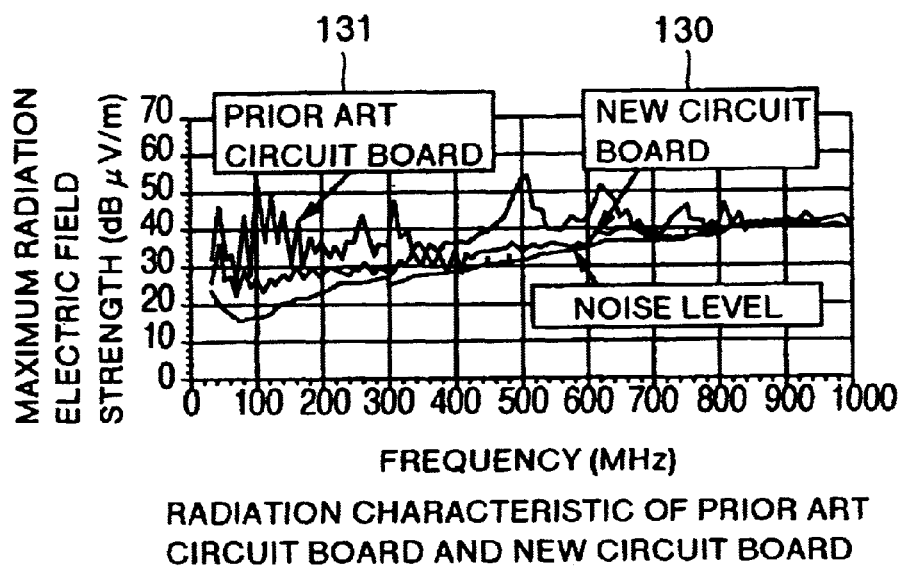
FIG. 42 shows a radiation characteristics (characteristic chart) of a prior art circuit board and a novel circuit board.

FIG. 42 shows radiation characteristics of the new circuit board (five-layer printed circuit board) 117 shown in FIG. 41 and the prior art circuit board. While the prior art circuit board is not shown, it is a four-layer printed circuit board which may be compared with the new circuit board 117 under the same condition including the drive condition. The radiation characteristic shows a maximum radiation electric field strength (dB$\mu$V/m) for the frequency at a point spaced from the radiation source by 3 m. The characteristic 130 of the new circuit board indicates that the increase of the amount of radiation is not observed near a singular frequency (100, 270 and 310, 510 and 620) to compare with the characteristic 131 of the prior art circuit board, and the amount of radiation is lowered as a whole. The increase of the amount of radiation as seen in the characteristic 131 of the prior art circuit board is due to the resonance, and in the characteristic 130 of the new circuit board, it is eliminated by building the condition of the matching termination and the low Q value into the circuit board.

Figure 43:
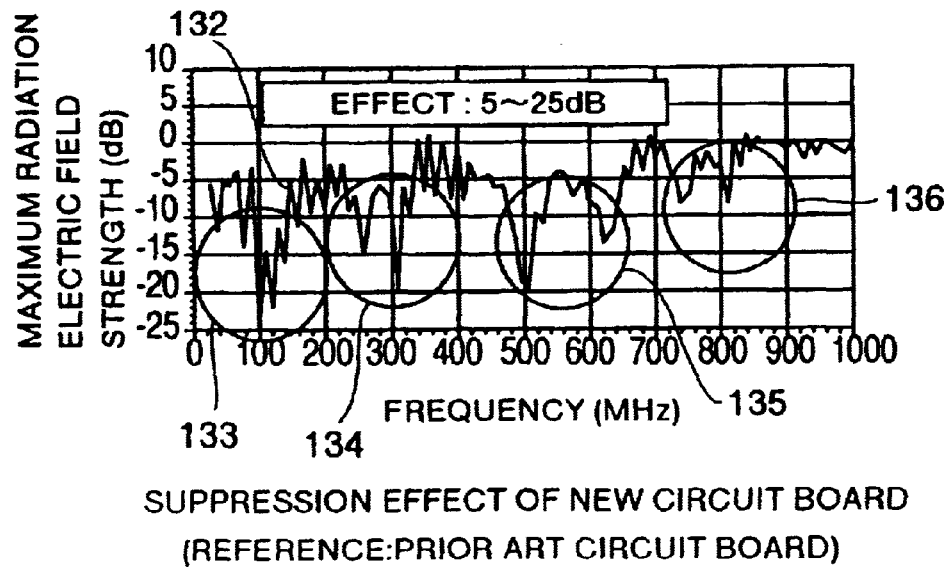
FIG. 43 shows a suppression effect (characteristic chart) of the novel circuit board over the prior art circuit board.

FIG. 43 shows a suppression effect in the radiation characteristic of the new substrate with respect to FIG. 42, and shows a difference 132 between the characteristic 130 of the new circuit board and the characteristic 131 of the prior art circuit board. The effect is approximately 5~25 dB and it indicates that the electric field strength may be suppressed by approximately one order. The characteristic 133 shown by circles shows the effect by the low Q value, and the resonance (standing wave resonance: $\lambda/2$, $\lambda$, $3\lambda/2$) by the distributed constant circuit is suppressed and removed.

Those effects are applicable to not only the structure shown in FIG. 41 but equally applicable to all structures which uses the principle of the present invention, and the EMI characteristic is improved over the prior art structure.

Example in which the above structure is applied to a printed circuit board and a manufacturing method thereof are explained with reference to a process chart. It should be understood that the present invention is not limited thereto.

FIG. 15 to FIG. 19 shows examples in which the above structure is applied to the printed circuit board. When such a printed circuit board is mounted on an electronic apparatus, the low EMI is attained.

Figure 15:
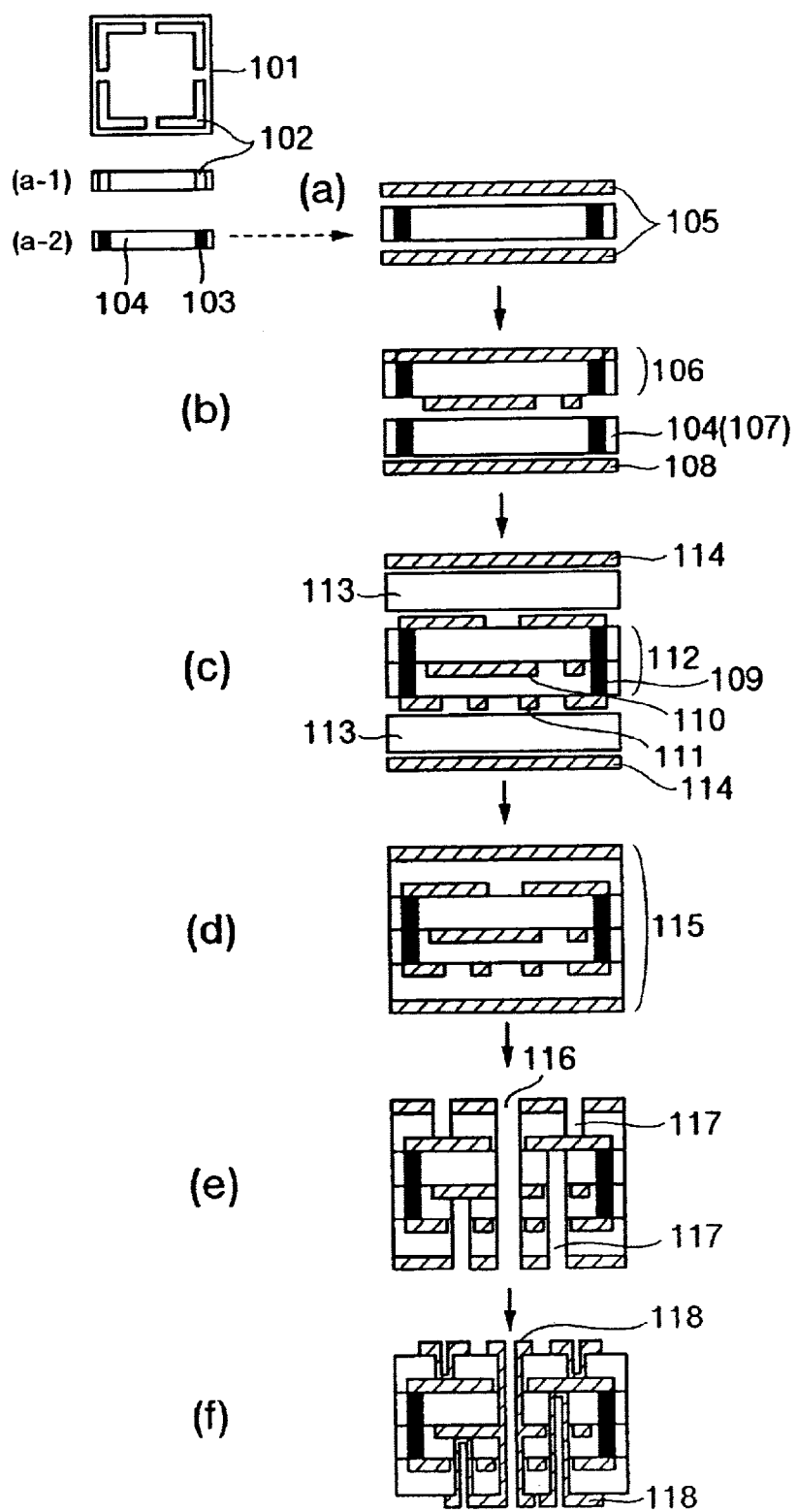
FIG. 15 shows a process chart of one example of a manufacturing method of a multi-layer circuit board for a low EMI circuit board of the present invention.

FIG. 15 shows an example in which a resistor layer is provided in the printed circuit board. The structure (f) may be regarded as the structure of FIG. 1 having the mounted parts and the outermost solder resist layer removed therefrom. A manufacturing process thereof is briefly explained below.

First, as shown in a plan view (a-1), a frame shape hole 102 is formed in a periphery of a prepreg 101 of an insulation material which is an example of a dielectric material pre-drive. Polymer resistor paste 103 which is an example of a resistor layer pre-drive is repeatedly filled therein and dried to prepare a prepreg 104 having the frame shape hole thereof fully filled as shown in (a-2). The polymer resistor paste 103 is the resistor layer used in the structure explained above. The prepreg and two copper foils 105 are stacked and bonded as shown in (1) to prepare a double-sided copper foil lamination, and the copper foil on one side is patterned by etching by using a resist, then the patterned copper foil surfaces on both sides are blackened and roughened by reduction process to prepare a double-sided copper foil lamination 106 as shown in (b).

Then, the lamination 106, the prepreg 104 (or homogeneous prepreg 107 of the same shape) and a copper foil 108 are stacked as shown in (b) and bonded to prepare a lamination which includes a resistor 109 and an inner layer 110 (for power layer).

The copper foils on both sides are patterned 111 (for ground layer) by using resist while maintaining the conduction with the resistor 109, roughened by the blackening and reduction process to prepare a wiring board 112 as shown in (c). Then, as shown in (c), prepregs 113 and copper foils 114 are stacked on both sides of the circuit board 112 and bonded to prepare a lamination 115 as shown in (d). Via-holes 116 and non-via-holes 117 for the connection of layers are formed therein, the layers are connected by panel copper plating, and the outermost layer is patterned 118 by etching to from a signal layer to prepare a five-layer wiring board as shown in (f).

In the printed circuit board thus prepared, the power layer 110 is sandwiched by the two ground layers 11 and these two ground layers are bonded by the resistor layer 109 so that the printed circuit board which attains the low EMI described above is provided.

In the present embodiment, the frame shape hole 102 is formed in the periphery of the prepreg 101 as shown in the plan view (a-1) although the shape may be changed appropriately. For example, holes 102 may be formed at a constant pitch along one side of the periphery.

When the resistance of the resistor is set to a predetermined value, the amount of the polymer resistor paste 103 may be changed, and by adjusting the amount of the polymer resistor paste 103 by determining the size 'width and depth) of the holes 102, a desired resistance may be attained.

Figure 16:
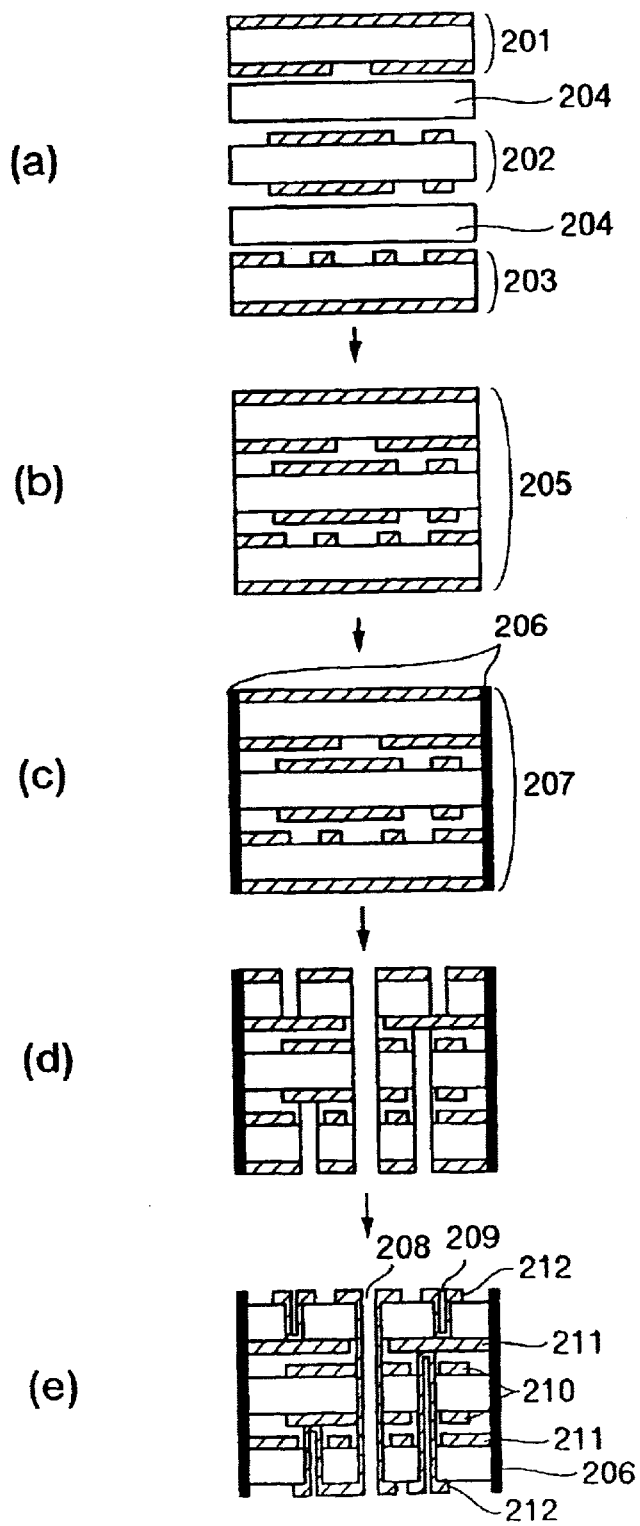
FIG. 16 shows a process chart of an example of the manufacturing method of the multi-layer circuit board for the low EMI circuit board of the present invention.

FIG. 16 shows an example in which the resistor layer is provided on the side of the printed circuit board. The structure (f) may be regarded as the structure of FIG. 1 having the mounted parts and the solder resist layer of the outermost layer removed therefrom as it is in FIG. 15. A manufacturing process thereof is briefly explained below.

As shown in (a), double-sided copper foil laminations 201, 202 and 203 having copper foils roughened by #240 buff patterned on one side or both sides by etching are stacked with two prepregs 204 (homogeneous or heterogeneous) and bonded to prepare a lamination 205 comprising six layers of conductor as shown in (b). The both sides of the lamination are protected by Teflon sheets and mounted in a predetermined mold, and polymer resistor pre-drive having volatile components removed to form into tablet is filled and cured by a transfer molding machine to prepare a lamination 207 having a polymer resistor 206 formed on the side of the lamination 205 as shown in (c).

Thereafter, by the same process (d)~(e) as the process of FIGS. 15(e)~(f), a six-layer wiring board comprising two power layers 210 connected by via plated through-holes 208 and non-via plated through holes 209, two ground layers 211, two signal layers 212 and a resistor 206 connected to the ground layers.

In the present structure, the resistor layer is provided in the state of lamination including the signal layer, and then the patterning is made while preventing the short-circuit of the resistor layer and the signal layer so that the two power layers 210 are sandwiched by the two ground layer 211 and the two ground layers are connected by the resistor layer 207 to complete the structure of the present invention.

The resistor layer 207 may be provided on the entire surface or a portion of the side of the printed circuit board.

In the present embodiment, the resistor layer 207 is formed by the transfer molding although the side may be simply plated. In this case, since the resistance may be set to a desired value by adjusting the amount of the polymer resistor, the resistance may be determined by the shape (entire surface, portion, thickness) of the side of the printed circuit board in which the resistor is formed.

Since the present manufacturing method is same as the prior art method except the process to provide the resistor layer 207, the substantially same process as the manufacturing process of the prior art printed circuit board may be used.

Figure 17:
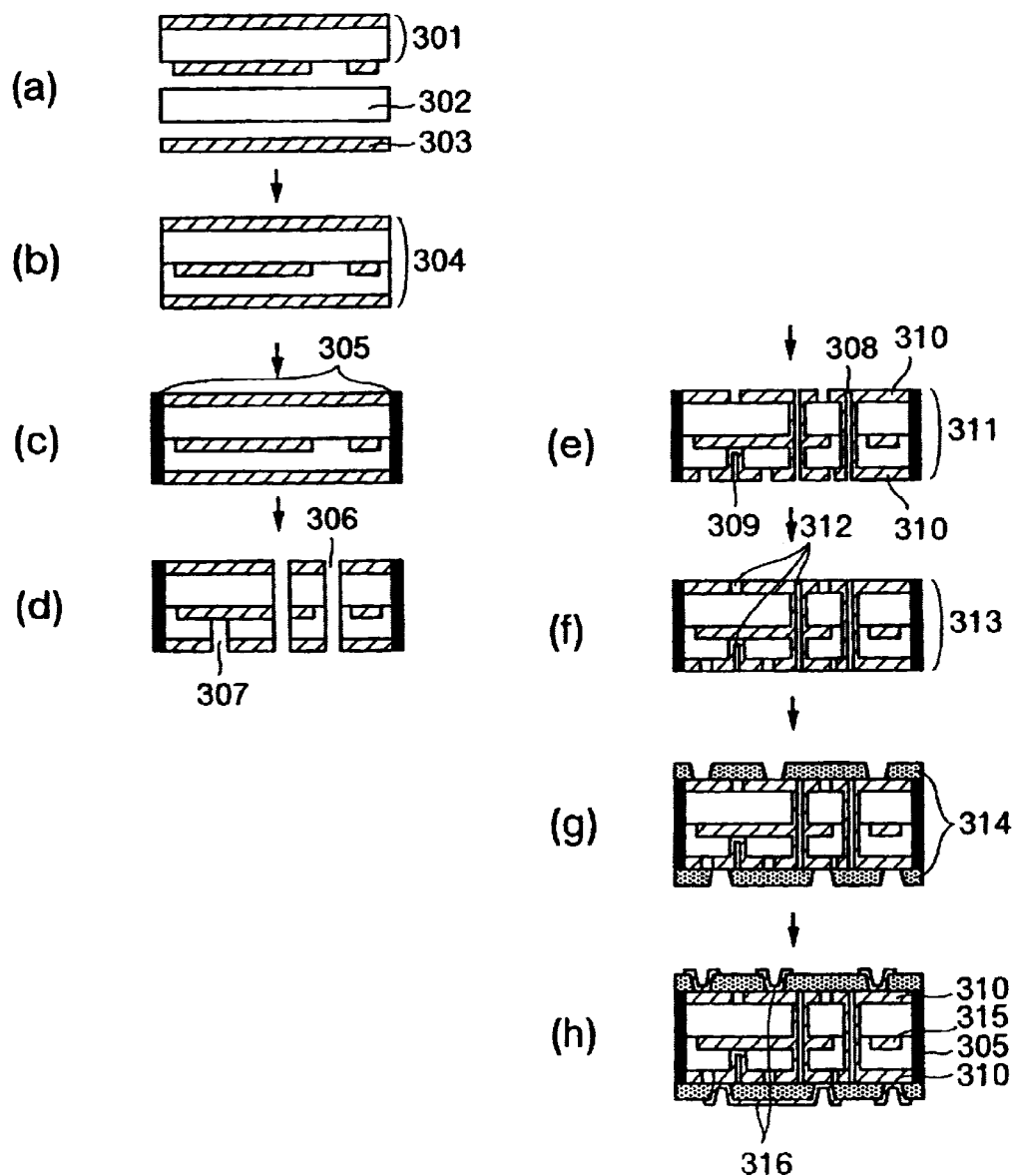
FIG. 17 shows a process chart of an example of the manufacturing method of the multi-layer circuit board for the low EMI circuit board of the present invention.

FIG. 17 shows an example in which the structure of the present invention is applied to a build-up system which uses a photosensitive insulation material to the printed circuit board. The printed circuit board which applies the build-up system attains high density packaging. As shown in (a), one side is patterned by etching, and the double-sided copper foil lamination 301 having the copper foils roughened and the prepreg 302 and the copper foil 303 are stacked in the same manner as the manufacturing method 1 and bonded to prepare the lamination 304 comprising three layers of conductors. The both sides of the lamination 304 are protected by the resist and a resistor 305 as shown in (c) is formed on the side by electrolyte nickel-iron alloy plating film, and the same process (c)~(e) as the process of FIG. 16(c)~(e) is applied, the via holes 306 and non-via-holes 307 for connecting the layers are formed as shown in (d), the layers are connected by via plated through-holes 308 and non-via plated through-holes 309 as shown in (e) and the outermost layer is patterned 310 to prepare the wiring circuit board 311.

Then, the inside of the via plated through-hole 308s, the inside of the non-via plated through-holes 309 and the space between the patterning wiring layers 310 of the circuit board 311 having the plated surfaces roughened by the blackening and reduction process are filled by the insulation material in the following manner. First, the circuit board 311 sandwiched between two thermo-setting resin films (either homogeneous or heterogeneous) including uncured inorganic filler is further sandwiched between two mold-processed metal plates having flat and smooth surfaces and they are mounted in a jig. Then, the inside of the jig is evacuated and the thermo-setting resin including the filler is heated and left below a melting point for several minutes, and a bonding pressure to vertically pinch the metal plates and a lateral compression pressure to the thermo-setting resin including the filler between the metal plates are applied by compressed air, and the thermo-setting resin including the filler is heated in this state to cure it. The cured resin on the surface of the circuit board 311 having the holes thereof filled is removed by wet etching by chemical to prepare the wiring circuit board 313 having the filled holes 312 as shown in (f).

The patterned solder resist layers 314 are formed on the both sides of the filled and flattened wiring circuit board 313, and the wiring layer 316 is then formed by the electroless and electric copper plating and etching to prepare the five-layer wiring circuit board comprising the power layer 315, two ground layers 310, two signal layers 316 and the resistor 305 connected to the ground layers.

Namely, the power layer 304 is sandwiched by the two ground layers 303, the two ground layers are connected to the resistor layer 305 and these are formed into one unit and then the signal layer is stacked.

The shape of the resistor layer and the setting of the resistance are same as those of the previous embodiments.

Figure 18:
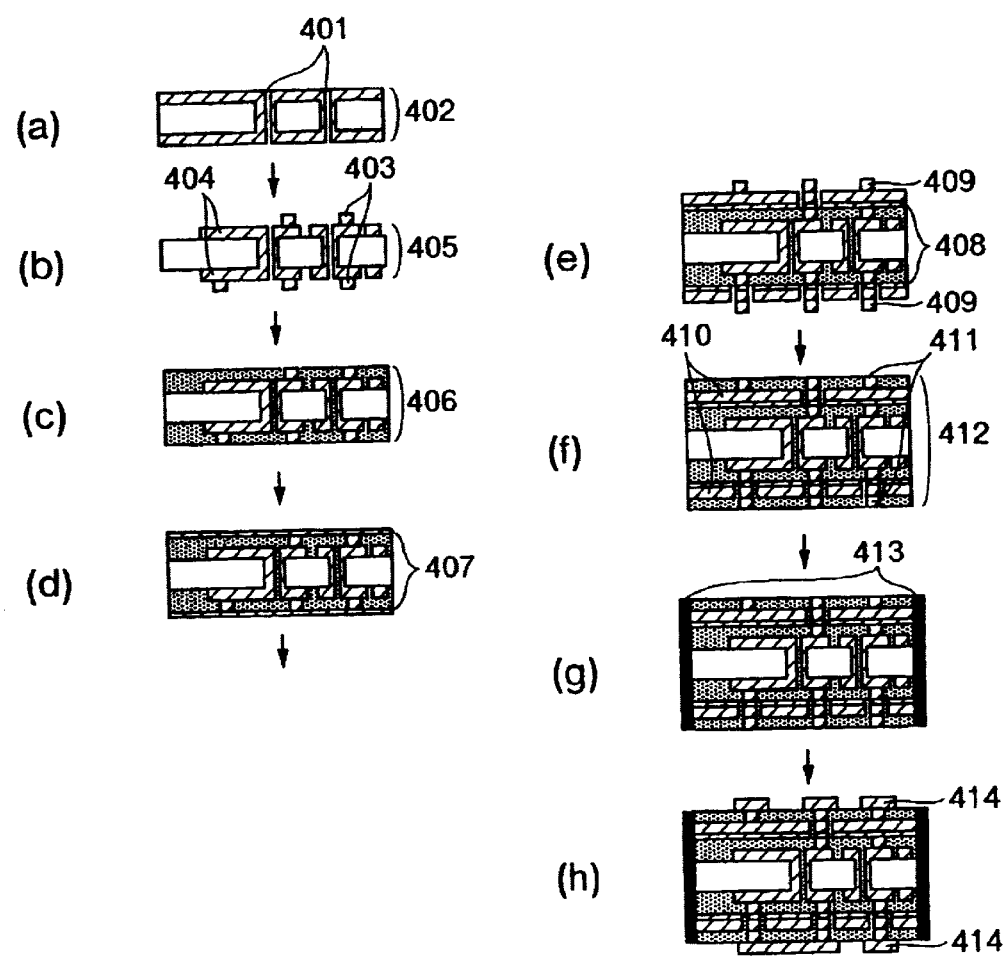
FIG. 18 shows a process chart of an example of the manufacturing method of the multilayer circuit board for the low EMI circuit board of the present invention.

In FIG. 18, the system to package the printed circuit board shown in FIG. 16 at a high packaging density is applied to the present structure. Again, the structure (f) may be regarded as the structure of FIG. 1 having the mounted parts and the solder resist layer of the outermost layer removed therefrom as it is in FIG. 15. A manufacturing process thereof is briefly explained below.

A via-hole wiring board 403 is formed by electro-plating in a groove of the patterned resist on a double-sided copper foil lamination 402 having the both sides electrically connected by via plated through-holes 401 as shown in (a), and then the copper foils are patterned 404 by etching to prepare the double-sided wiring circuit board 405 as shown in (b). The plated surface of the through-hole 410, the surface of the via-hole wiring layer 403 and the surface of the patterned wiring 404 are blackened and the same process (b)~(c) as the process of FIGS. 17(e)~(f) is applied to the circuit board 405, the inside of the via plated through-hole 401, the space between conductors of the via-hole wiring layer 403 and the space between conductors of the patterned wiring layer 404 are filled as shown in (c), the upper surface of the via-hole wiring layer 403 is exposed by flattening the circuit board and etching by alkaline oxidization liquid, and prepares the wiring circuit board 406 having the surface of the insulation layer roughened.

Then, as shown in (d), the underlying conductive film 407 is formed on the circuit board 406 by the electroless copper plated thin film, and horizontal conductors 408 and via-hole conductors 409 are formed thereon in sequence by electro-copper plating by using the patterned resist as shown in (e). The underlying conductive file which was not used in the formation of the conductors is removed by etching and the horizontal wiring layer 410 and the via-hole wiring layer 411 are formed, those wiring conductors are insulated in the same manner as the process (b)~(c), and the circuit board is flattened and the upper surface of the via-hole wiring is exposed to prepare the wiring circuit board 412 as shown in (f).

Thereafter, as shown in (g), the polymer resistor 413 is formed on the side of the circuit board 412 by the same process (f)~(g) as the process of FIGS. 16(b)~(c), and the horizontal wiring board 414 is formed by using the underlying conductive film in the same manner as the process (d)~(e) to prepare the six-layer wiring board comprising two power layers 404 connected by a buried hole 401, two ground layers 410, two signal layers 414 and a resistor 413 connected to the ground layers as shown in (h).

Again, the shape of the resistor and the setting of the resistance are similar to those in the previous embodiments.

Figure 19:
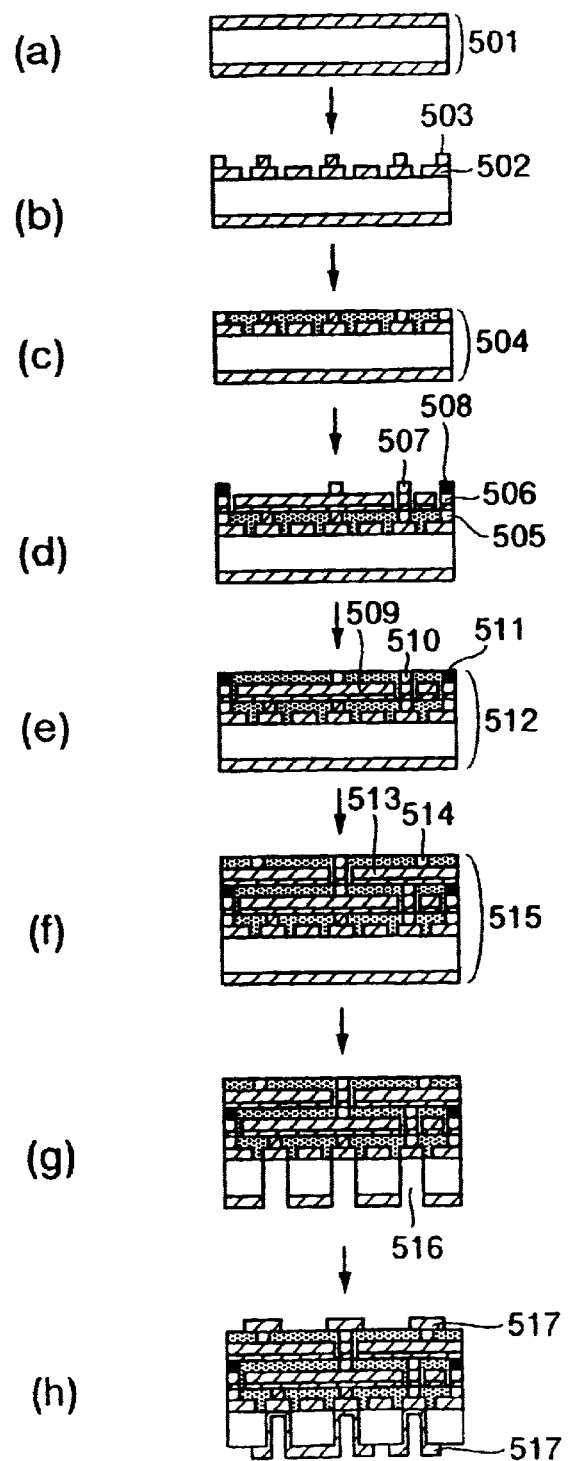
FIG. 19 shows a process chart of an example of the manufacturing method of the multi-layer circuit board for the low EMI circuit board of the present invention.

FIG. 19 shows an example of a five-layer wiring board (h) having the structure of FIG. 7 built therein. A manufacturing method thereof is now briefly explained below.

The same process (a)~(b) as the process of FIGS. 18(a)~(b) is applied to one side of the double-sided copper foil lamination which serves as a base circuit board as shown in (a) to form the roughened horizontal wiring layer 502 and the via-hole wiring layer 503 electrically connected thereto as shown in (b). These wiring conductors are insulated in the same process (b)~(c) as the process of FIGS. 17(e)~(f), the circuit board is flattened, the via-hole wiring layer 503 is exposed and the surface of the insulation layer is roughened to prepare the lamination 504 as shown in (c).

Then, the underlying conductive film 505 is formed on the lamination 504 in the same manner as the process of FIGS. 18(c)~(d) and the horizontal copper conductor 506 is formed thereon as shown in (d) by electro-plating by using the patterned resist, and the surface thereof is roughened by the buff polishing by the #240 buff. Then, the frame-shape nickel-iron alloy 508 is formed on the peripheries of the via-hole copper conductor 507 and the via-hole conductor 507 on the conductor 506. The underlying conductive film not used in the formation of those conductors are removed by etching to form the horizontal wiring layer 509, the via-hole wiring layer 510 and the resistor 511, and those wiring layers are insulated in the same manner as the process (b)~(c), the circuit board is flattened, the upper surfaces of the via-hole wiring layer 510 and the resistor 511 are exposed and the insulation layer surface is roughened to prepare the lamination 512 as shown in (e).

Further, for the lamination 512, the nickel-iron alloy plating is not conducted and the process (c)~(e) is repeated to additionally form the horizontal wiring layer 513 electrically connected to the via-hole wiring layer 510 and the via-hole wiring layer 514, they are insulated, the circuit board is flattened and the upper surface of the via-hole wiring layer 514 is exposed to prepare the lamination as shown in (f).

Thereafter, as shown in (g), the non-via-hole 516 is formed in the copper foil of the double-sided copper foil lamination 501 of the lamination 515, the both sides are electroless and electro-copper plated and etched to form the wiring layer 517 of the outermost layer to prepare the five-layer wiring plate comprising the power layer 509, the ground layers 502 and 513, two signal layers 517 and the resistor 511 connected to the ground layers. The structure corresponding to FIG. 7 is a portion between the ground layers 502 and 513.

In the above manufacturing method, the manufacturing method for single-sheet board has been explained. Alternatively, when the resistor formed on the side of the circuit board or in the periphery is formed in the circuit board in the frame shape, the circuit board may be cut while the resistor is formed on the side of the circuit board or in the periphery so that a number of circuit boards may be prepared in one step.

Again, in this case, the shape of the resistor and the setting of the resistance are similar to those in the previous embodiments.

An application of the structure of the present invention described above to a thin film process is now explained. FIG. 20 to FIG. 26 show examples (including manufacturing methods) of the structure using the thin film process.

Figure 20:
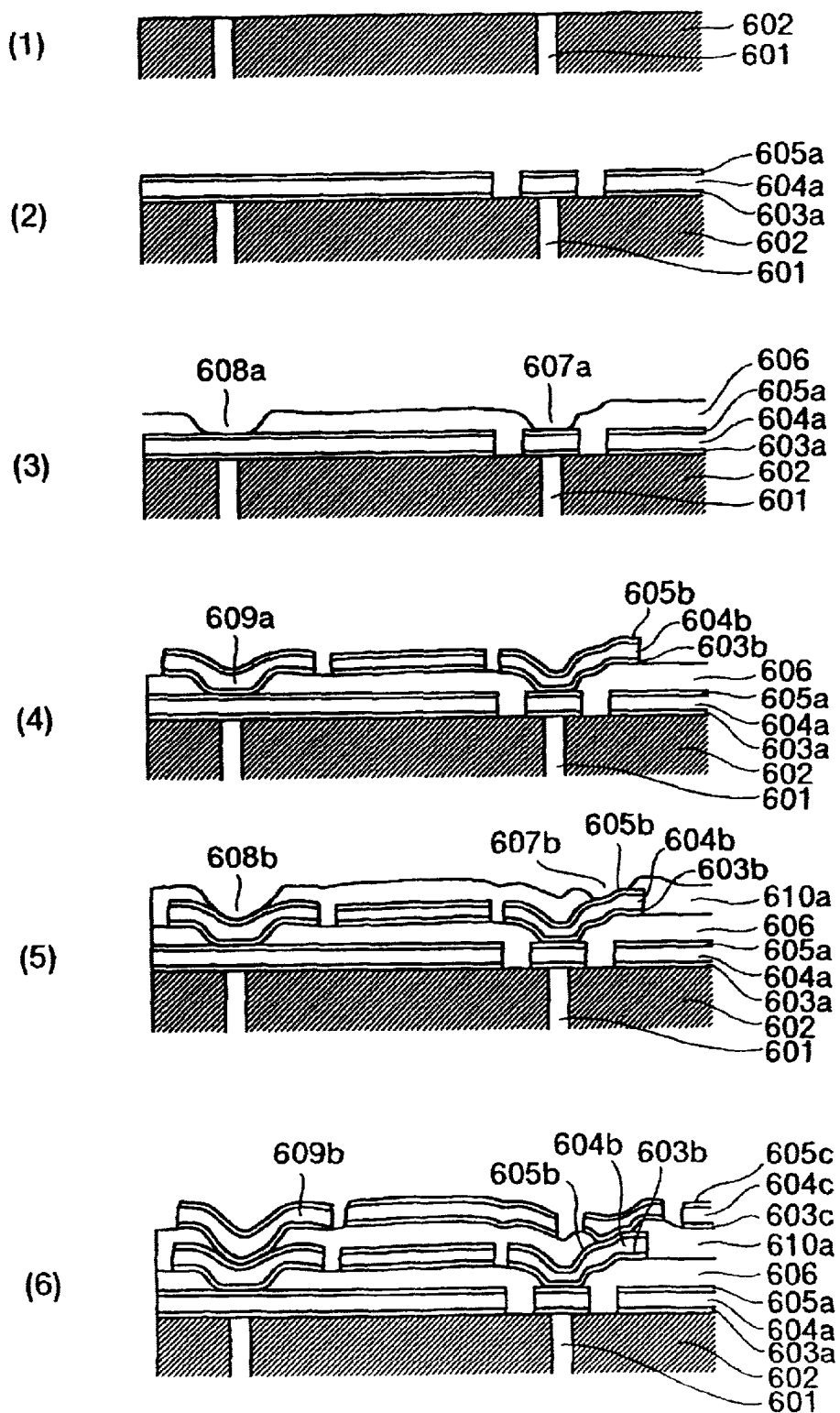
FIG. 20 shows a process chart of a manufacturing method of the circuit board in accordance with the present invention.
Figure 20:
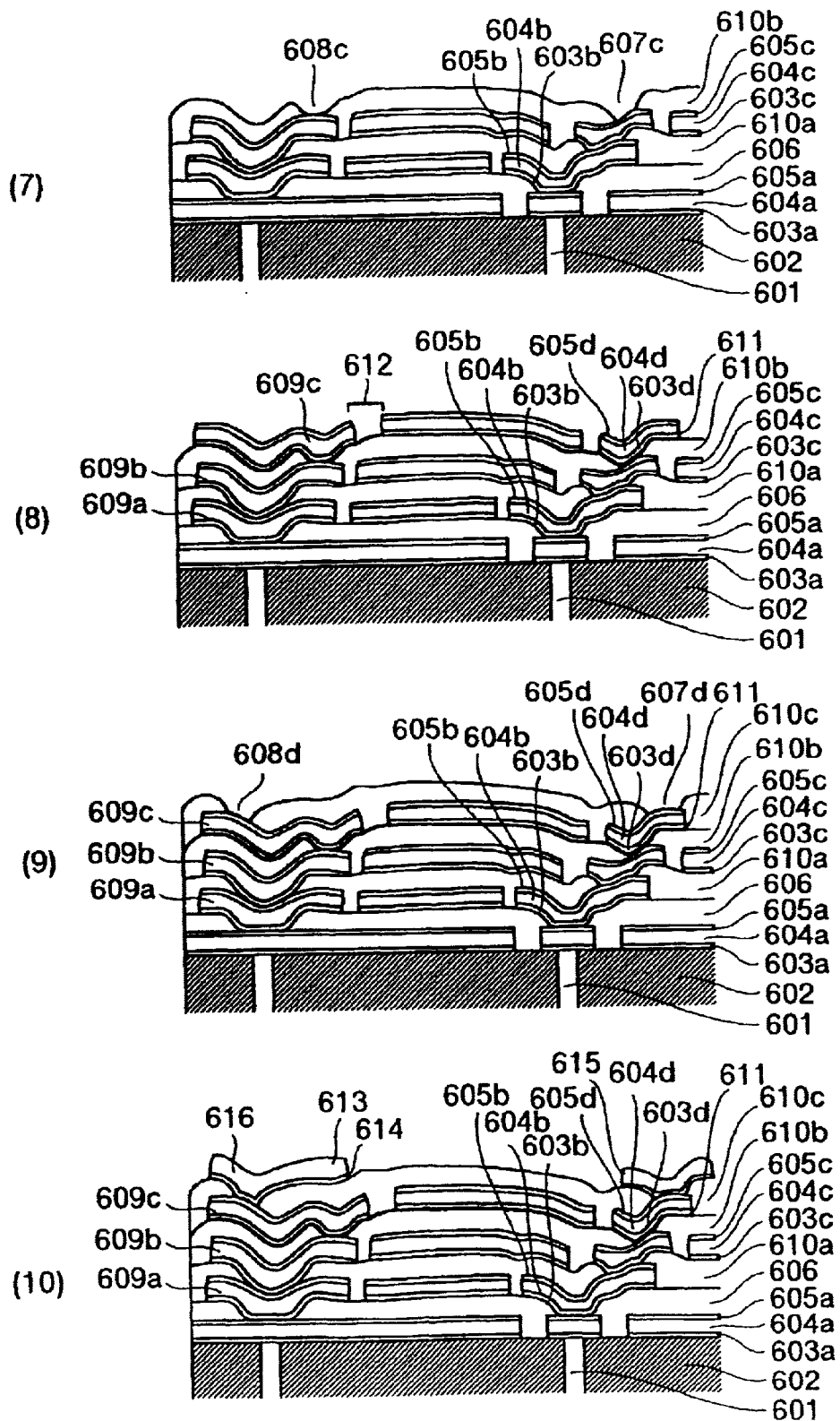
Figure 20:
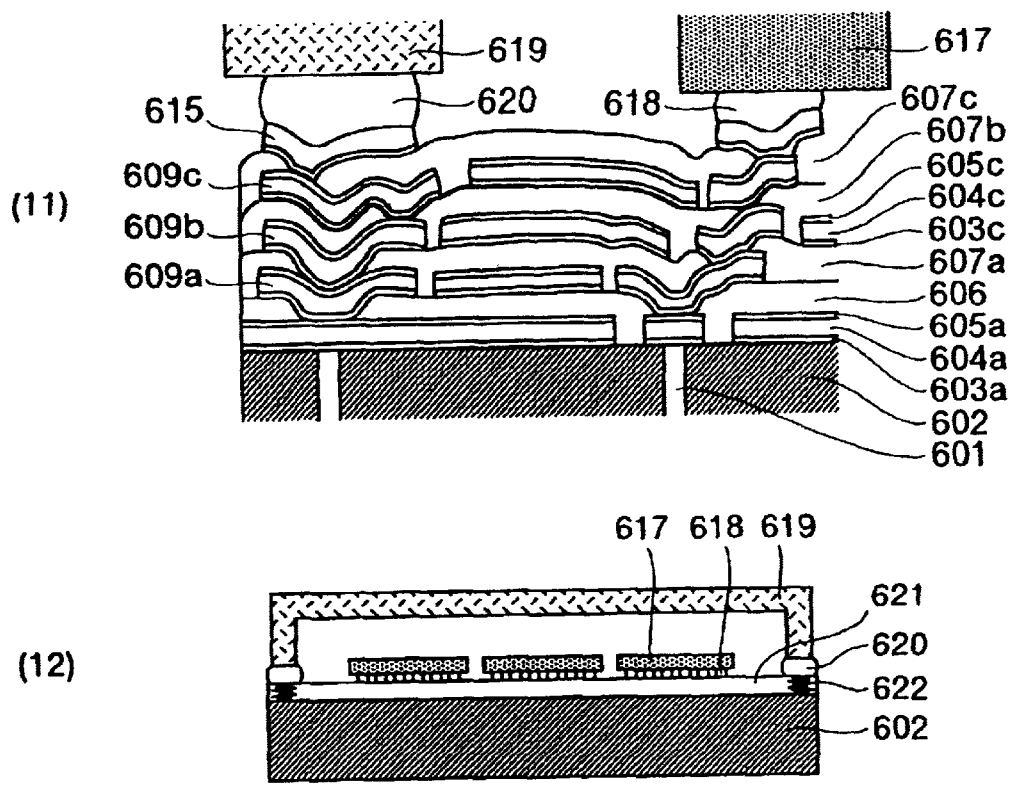

FIG. 20 shows an example in which the resistor layer of the present invention is formed simultaneously with the formation of the wiring in the process of manufacturing the wiring circuit board.

As shown in FIG. 20-(1), a metallic layer comprising three layers of Cr 603a/Cu 604a/Cr 605a in the order from the lower layer to the upper layer is formed by sputtering or vapor deposition as the conductor layer for the ground layer on the circuit board 602 having the wiring 601 formed thereon like a printed circuit board or a thick film substrate. Of those, the Cu film 604a serves as the wiring and the Cr films 603a and 605a are formed to prevent the deterioration primarily due to the oxidization of the Cu film and enhance the bonding of the upper and lower layers. After the photo-resist pattern is formed thereon, the above three metallic layers are sequentially etched. The etchant used for the etching is potassium ferri-cyanide or permangannic acid liquid for Cr, and nitric acid liquid for Cu to attain precise etching. By this work, the predetermined power layer pattern and the pad pattern of the through-hole are obtained. Thereafter, the $Si_3N_4$ film 606 as a high dielectric material film is formed on the entire surface of the circuit board to the thickness of approximately 2 $\mu$m by the CVD method or the sputter method. In this case. The CVD method provides less defect of the $Si_3N_4$ film and it is advantageous in forming the multi-layer wiring. The $Si_3N_4$ film has the specific dielectric constant of approximately 7 to 10 which is relatively large. The photo-resist pattern is formed to form the through-hole 607a and the self-closed line groove 608a along the periphery of the circuit board at predetermined position on the $Si_3N_4$ film 606, and then the $Si_3N_4$ film 606 is etched. Since the $Si_3N_4$ film may be readily etched by fluorine etchant, the structure as shown in FIG. 20-(3) may be readily formed. Further, the three-layer metallic layers 603b, 604b and 605b are sequentially formed on the $Si_3N_4$ film 606 in the same manner as that described above, and the metallic film is photo-etched to form the band shape pattern covering the self-closed line groove 608a of the $Si_3N_4$ film and the power layer. Thus, the band pattern 609a of the self-closed line metal of 10 $\mu$m to 10 mm is formed as shown in FIG. 20-(4) simultaneously with the power layer. Since the band pattern 609a is formed simultaneously by the same martial and process as those of the power layer, the number of steps does not increase. Further, since those metallic layers 603a, 604a, 605a, 603b, 604b and 605b may cover the unevenness of the underlying layer by thicker layer, the integrity of the layer is enhanced, and the thickness of not smaller than 1 $\mu$m is preferable, and the thickness of 3 $\mu$m or larger does not cause the problem in the integrity. Since such a degree of thickness is frequently used in the wiring, no problem is raised by forming the wiring and the band pattern in the same film forming process. The Hitachi Chemical polyimide pre-drive varnish (trade name PIQ) is applied thereon and it is baked in $N_2$ at 350° C. to form the polyimide dielectric material layer 610a having the thickness of approximately 6 $\mu$m on the wiring. The polyimide film has the specific dielectric constant of 3 to 4 which is approximately one half of that of the $Si_3N_4$ film. By the difference between the dielectric constants of the two dielectric materials and the adjustment of the thickness, the ratio of 1/20 of the electric capacitance caused by the power layer wiring on the $Si_3N_4$ film 606 to the ground layer on the lower polyimide layer to the electric capacitance caused by the power layer wiring on the $Si_3N_4$ film 606 to the ground layer on the upper polyimide layer to be formed thereafter may be readily attained. Thereafter, as shown in FIG. 20-(5), the through-hole 607b for the electrical connection to the predetermined positions is formed by the photo-etching, and at the same time, the polyimide is etched into the groove 608b. The three-layer metallic layers 603c, 604c and 605c are sequentially formed on the polyimide layer 610a in the same manner as that described above and the metallic films are photo-etched in the band shape to cover the signal wiring layer and the loop groove 608b of the polyimide film. In this manner, the self-closed line metallic band pattern 609*b* having the width of 10 μm to 10 mm is formed as shown in FIG. 20-(6). The polyimide pre-drive varnish is applied thereon and baked in the same manner as that described above and the polyimide dielectric material layer 610*b* having the thickness of approximately 6 μm or larger is formed on the wiring, the through-holes and the groove 608*c* are formed to form the structure as shown in FIG. 20-(7). Further, the Cr—SiO$_2$ 611 which is the high specific resistance thin film is formed on the polyimide layer 610*b* by the sputtering to the predetermined film thickness, and then the three-layer metallic layer of Cr 603*d*/Cu 604*d*/Cr 605*d* is formed in the same manner as that described above. Since this composite layer functions as the ground layer, the pad pattern of the through-hole is formed and the metallic layers 603*d*, 604*d* and 605*d* of the portion corresponding to the inside of the portion of the polyimide etched into groove as shown in FIG. 20-(8) are removed by the predetermined width in the self-closed line loop pattern, and the high specific resistance thin film is exposed. Since this portion serves as the high resistance region 612 to consume the spurious current, the width of the exposed area of the high specific resistance thin film is determined by taking the sheet resistance of the Cr—SiO$_2$ film into consideration such that the predetermined resistance is attained. Further, undesired area of Cr—SiO$_2$ which is the high specific resistance thin film may be readily etched by fluorine etchan. In the above case, the high resistance region 612 is formed in the upper ground layer although it may be formed in the lower ground layer formed on the surface of the circuit board. When the high resistance thin film is formed to form the resistor element in the signal wiring layer, the high resistance region may be formed as a discrete ring pattern in the outer periphery of the signal wiring layer and a plurality of ground layers may be connected through this pattern to attain the same effect. In this case, since it is formed simultaneously with the formation of the resistor element in the wiring, the number of steps does not increase.

When two or more signal wiring layers are used, the process from FIG. 20-(2) to FIG. 20-(8) as one unit is repeated a plurality of times to form the metallic walls surrounding the wiring layers simultaneously with the formation of the multi-layer wiring.

Then, as shown in FIG. 20-(9), the polyimide film 610*c* is formed in the same manner as the dielectric material film, and as shown in FIG. 20-(10), one of Zr, Ti, Ni, Cu and Au or an alloy layer having those as base metals is stacked on the metallic layer 614 for enhancing the bonding force, as the metallic layer 613 for the solder bonding in order to join the sealing cover formed by conductor and the LSI to the uppermost surface, it is then formed into the LSI connecting metallic layer pattern 615 and the cover mounting metallic pattern 616 by the photo-etching, and the LSI chip 17 is connected by the solder 620 as shown in FIG. 20-(11). The cover 619 made of conductor is joined thereto by the solder 614, and the LSI chip 617 and the wiring layer 621 on the circuit board are sealed by the cover 619 and the wall structure 622 to complete the structure as shown in FIG. 20-(12).

Figure 21:
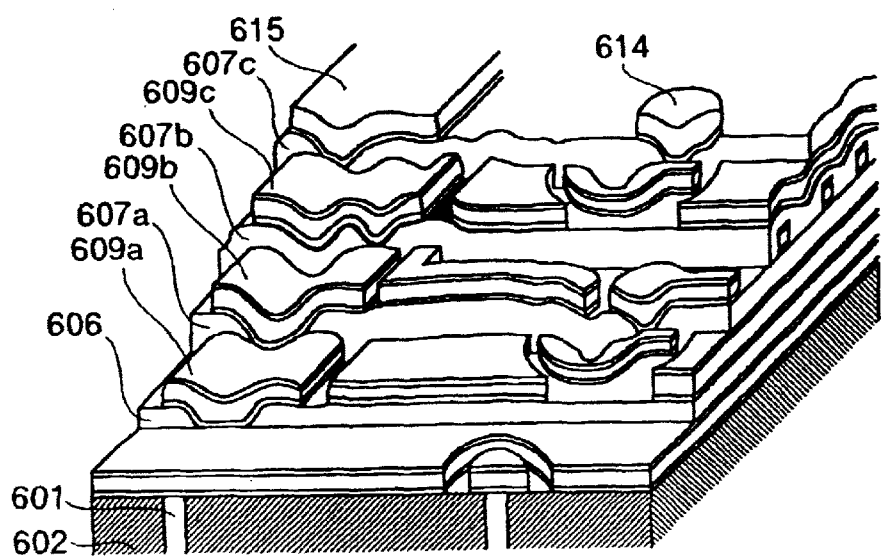
FIG. 21 shows a sectional schematic view of a three-dimensional structure of the circuit board of the present invention.

FIG. 21 shows a bird's eye view of a portion of the wiring circuit board thus formed. It is seen from FIG. 21 that the band pattern formed in the groove is stacked up.

The connection method of the LSI chip 617 is not limited to the CCB (Controlled Collapse Bonding) method but the WB (Wire Bonding) method or the TAB (Tape Automated Bonding) method may be applied. However, since the latter methods requires a large connection area and long time for connection while the CCB method allows the connection of the cover 610 simultaneously with the connection of the LSI chip 617, the CCB method is optimum. Further, since the low EMI effect is enhanced when the ground layer is on the outermost surface, the structure in which the layer having the connection pattern is shared by the uppermost ground layer is most appropriate although the structure as shown in FIG. 20-(11) attains substantially same effect. Those structures may be sufficiently implemented by adding the groove machining process of the dielectric material layer in the so-called printed circuit technology and the thick film wiring substrate technology.

Figure 22:
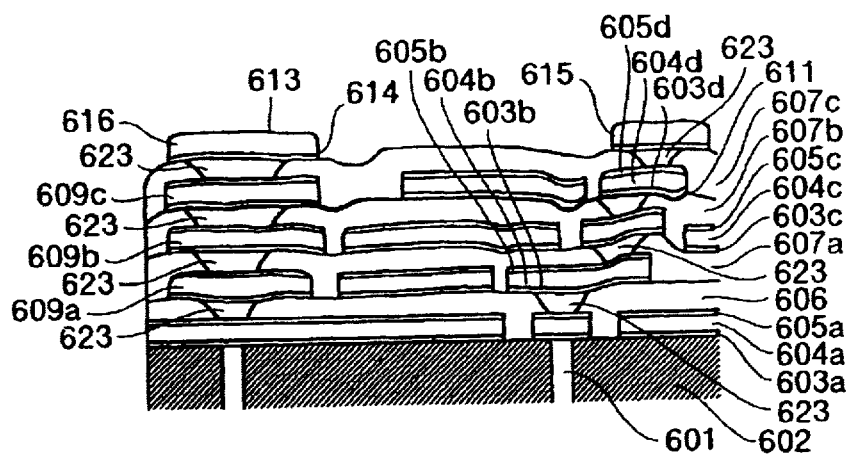
FIG. 22 shows a sectional structure of the circuit board of the present invention which uses a plating method.

When the dielectric martial layer such as the polyimide layer is formed thickly, the groove formed in the dielectric material is also deep and sufficient films may not be formed on the bottom and the side of the groove by the vapor film forming method such as sputtering method or vapor deposition method. In this case, the groove may be filled by metallic film by the plating method. FIG. 22 shows an example thereof. When the metallic layer is formed by Cr/Cu/Cr as it is in the Embodiment 1, the trough-holes of the dielectric material formed on the metallic layer and the Cr layer exposed to the bottom of the groove may be removed by etching to expose the Cu layer. The circuit board in this state is dipped in electrodes plating bath to growth the Cu film 63 on the through-holes and the groove to fill the through-holes and the grooves by the Cu film 623. It is desirable from the standpoint of the subsequent film forming and photo-etching process to fully fill the through-holes and the groove by the plated Cu film 623. To this end, by adjusting the dip time to the plating bath, the level of the surface of the Cu film 615 grown by the plating may be matched to the level the surfaces of the dielectric material layers 606, 607*a*, 607*b* and 607*c*. The metal grown by the plating is not limited to Cu but the metallic film such as Ni which may be grown thickly by the plating method may be used. By combining the flattening of the recess by the plating method and the process of FIG. 20, the structure as shown in FIG. 22 is produced.

When the position of the edge of the groove formed in the dielectric material overlaps with the edge of the band pattern, the lower layer surface may be broken because a sum of the metallic band pattern and the internal stress possessed by the plated film is applied to the lower layer surface. Accordingly, it is preferable that the width of the plated film 23 formed in band shape is narrower than the width of the metallic band patterns 609*a*, 609*b*, 609*c* and 614 as shown in FIG. 22, and when the positioning precision in patterning is taken into account, it is preferable that the width is narrower than the metallic band pattern by not smaller than 20 μm.

Figure 23:
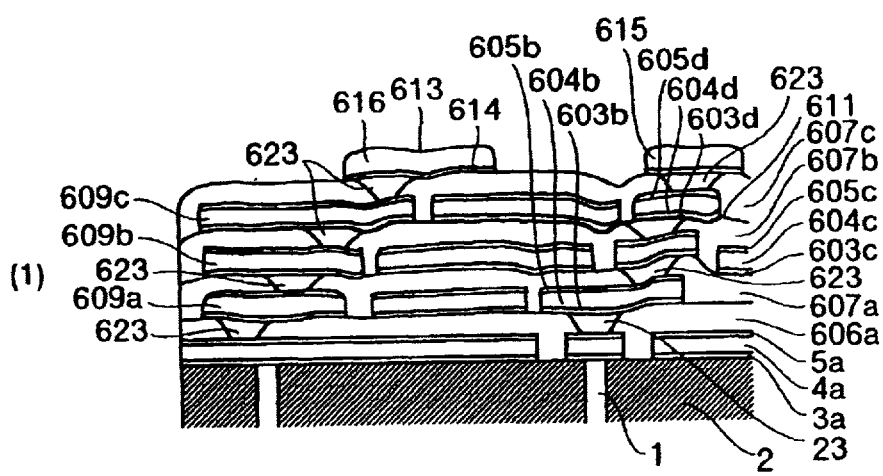
FIG. 23-(1) shows a sectional view of a circuit board which is an improvement over the structure of the circuit board of the present invention using the plating method.
Figure 23:
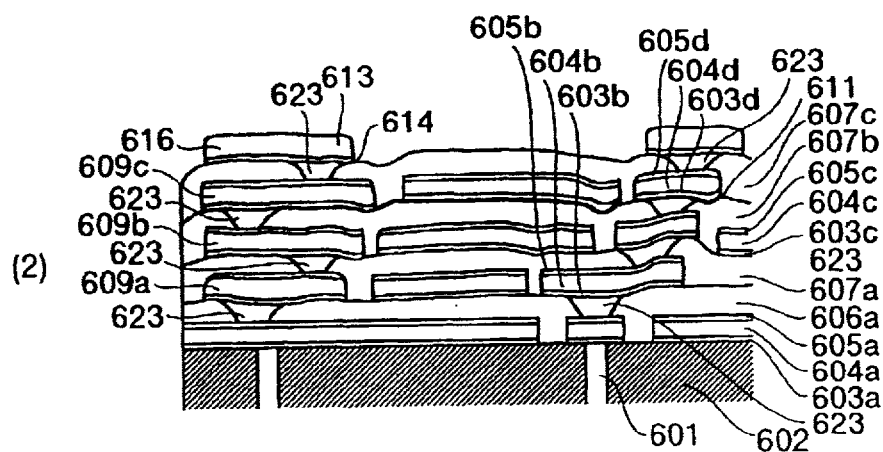

In preparing the circuit board by the same process as that of the above embodiment using the plated film, the positions of the grooves of the dielectric material layer are sequentially formed at different positions than the positions of the groves of the lower dielectric material layer as shown in FIGS. 23-(1) and (2). By this arrangement, the internal stress caused by the conductors in the grooves is absorbed by the dielectric material layer for each layer so that the stress to the circuit board may be reduced. As a result, the break of the circuit board by the thermal fatigue may be prevented and the highly reliable wiring circuit board is attained. In FIG. 23-(1), the grooves of the dielectric material do not overlap and the stress may be positively absorbed and the affect of the recess of the upper layer due to the grooves may be prevented.

Further, in FIG. 23-(2), since the formation positions of the plated films 23 are alternately shifted laterally, the area on the circuit board required to form the wall comprising a plurality of metallic band patterns is reduced and the miniaturization of the circuit board and the effective utilization of the circuit board surface are attained. Further, since the amount of recess of the surface of the upper dielectric material layer caused by the grooves of the dielectric material is reduced, the film forming of the upper layer and the photo-etching are facilitated and the occurrence of defect during the process is reduced.

While the example of the wiring using Cu as a basic component has been described in the above example, any one of Al, Al—Si, Al—Si—Cu, Ni, W and Mo or a multi-metal wiring having those metallic layers and other material stacked may be used to attain the similar structure.

Figure 24:
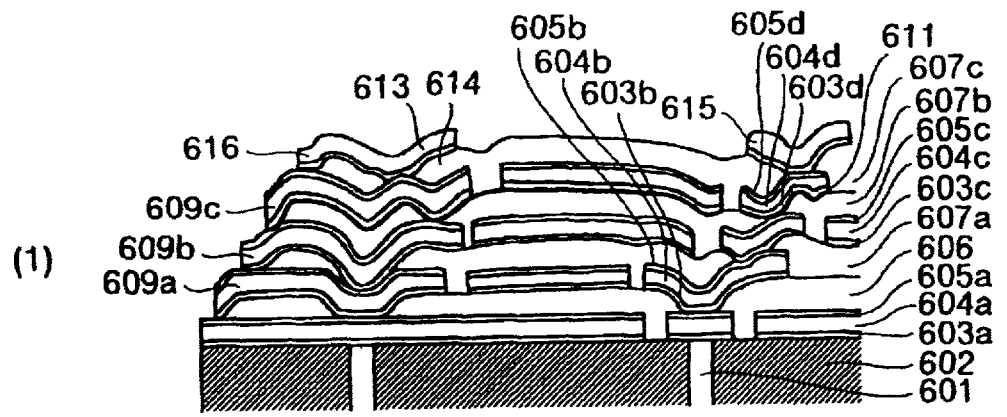
FIG. 24-(1) shows a sectional view of a circuit board in accordance with a basic embodiment of the present invention which uses a dielectric material film side of a circuit board end, of the circuit board of the present invention.
Figure 24:
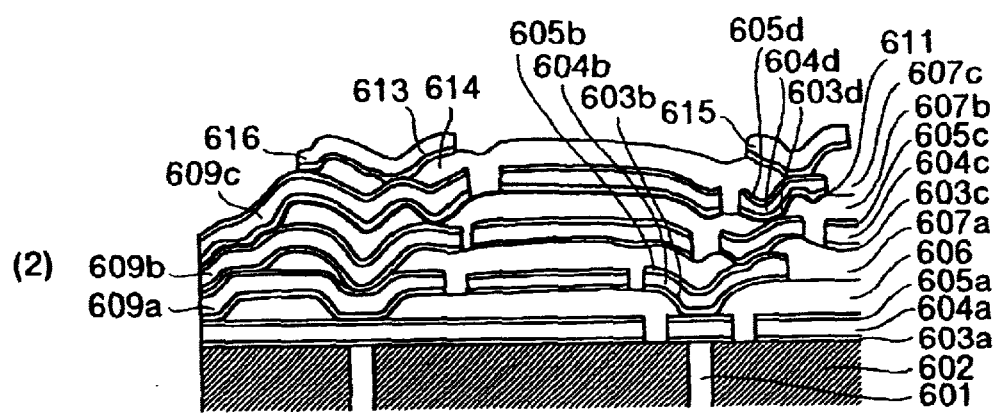
Figure 24:
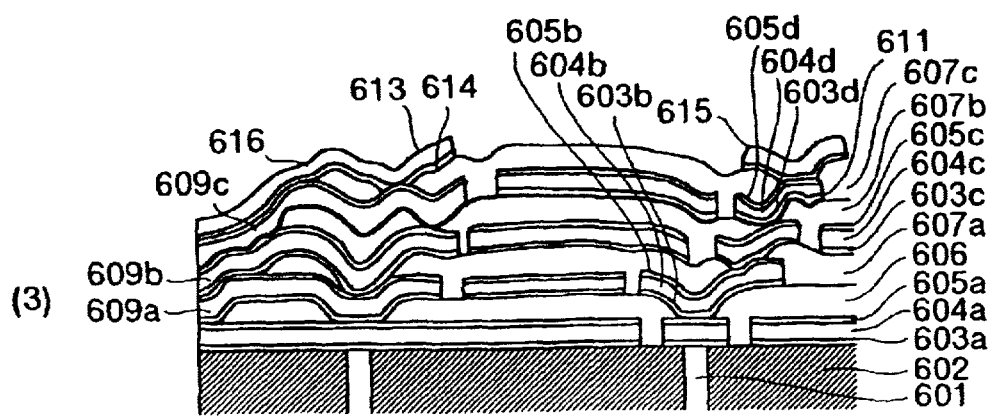

In forming the circuit board by the manufacturing method of the circuit board shown in FIG. 20, the dielectric material layers are machined such that the outer peripheries of the dielectric material layers 606, 610a, 601b and 610c are arranged inner as they go toward the top as shown in FIG. 24-(1) to make a stepwise structure.

Further, the metallic band patterns 609a, 609b and 609c are formed on the outer periphery walls of the dielectric material layers 606, 610a, 610b and 610c and the lower ends are extended to the surfaces of the respective lower metallic band pattern and the upper ends are extended to the flat surfaces of the dielectric material layers. In this structure, the outer periphery side wall is used in place of the grooves of the dielectric material layers 606, 610a, 610b and 610c so that the metallic patterns 609a, 609b and 609c formed on the outer periphery side wall are linked from the metallic layer of the circuit board surface to the multi-layer wiring layer and serves as the shield wall to maintain the sealing to the electromagnetic wave of the wiring layer. For more multi-layer structure, the above process is repeated to form the similar layers throughout the layer.

Further, as shown in FIG. 24-(2), the metallic band patterns 609a, 609b and 609c may be formed to cover all exposed areas of the lower metallic band patterns. In this case, a plurality of layers of walls to maintain the sealing are overlapped and the sealing is enhanced.

Further, as shown in FIG. 24-(3), the metallic pattern 616 for soldering on the uppermost layer is also formed to cover the all exposed areas of the metallic band patterns as it is for the metallic pattern 616. Thereafter, the soldering is conducted and the solder 620 flows to the side of the wiring layer and solidified so that the solder walls are formed on the metallic layer in superposition and the sealing to the electromagnetic wave of the wiring circuit board may be more positively maintained.

Figure 25:
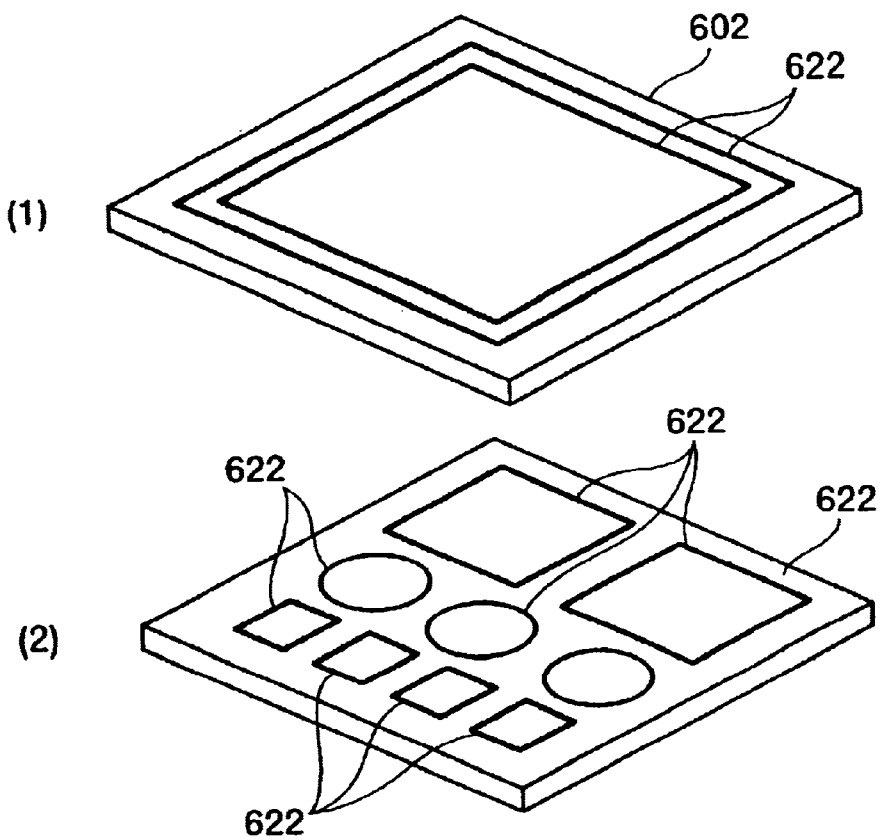
FIG. 25 shows a bird's eye view of a circuit board showing planar shape and arrangement of a wall-like structure, of the embodiment of the present invention.
Figure 26:
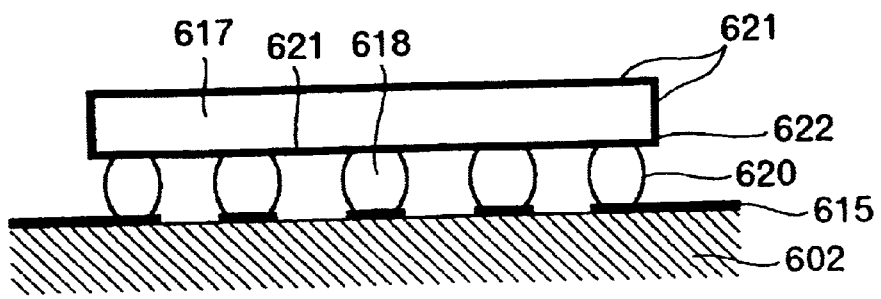
FIG. 26 shows a sectional view of a structure when the present invention is applied to a semiconductor integrated circuit.

In the above manufacturing method, since the walls by the laminated metallic pattern 622 formed at the periphery of the insulation layer 621 as shown in FIG. 25-(1) may be formed in multiple, the sealing may be more positively maintained.

Further, as shown in FIG. 25-(2), the wall by the laminated metallic pattern 622 may be formed to surround only a portion on the circuit board or to surround a plurality of portions on the circuit board. By doing so, the discrete sealing may be imparted to necessary portions on the circuit board and when a plurality of discrete circuits are to be formed on one circuit board, the sealing may be imparted for each of the discrete circuits that require the sealing. Further, the individual circuit may be separated and the sealing may be collectively imparted.

The LSI is one type of wiring circuit board and the low EMI is attained by the above structure and similar process. When the connection is made to the circuit board by face-down as it is in the CCB method, the metalization 615 linked to the ground layer on the surface of the circuit board 602 made of semiconductor, the wall like laminated metallic pattern 622 formed on the LSI surface and the metalization 623 formed on the rear side of the LSI are electrically connected so that the LSI circuit itself is electromagnetically shielded from the external and the great effect of preventing the leakage of the electromagnetic wave to the external and the malfunction due to the affect of the electromagnetic wave from the external is offered. In this case, the metalization 623 on the rear surface of the LSI serves as the above conductive cap 619.

Further, when the present invention is applied to both the packaging circuit board and the LSI, the leakage of the electromagnetic wave to the external environment and the affect of the electromagnetic wave from the external environment can be substantially perfectly prevented.

The application of the structure of the present invention to the thick film process is now explained. FIGS. 27 to 32 show examples thereof.

Figure 27:
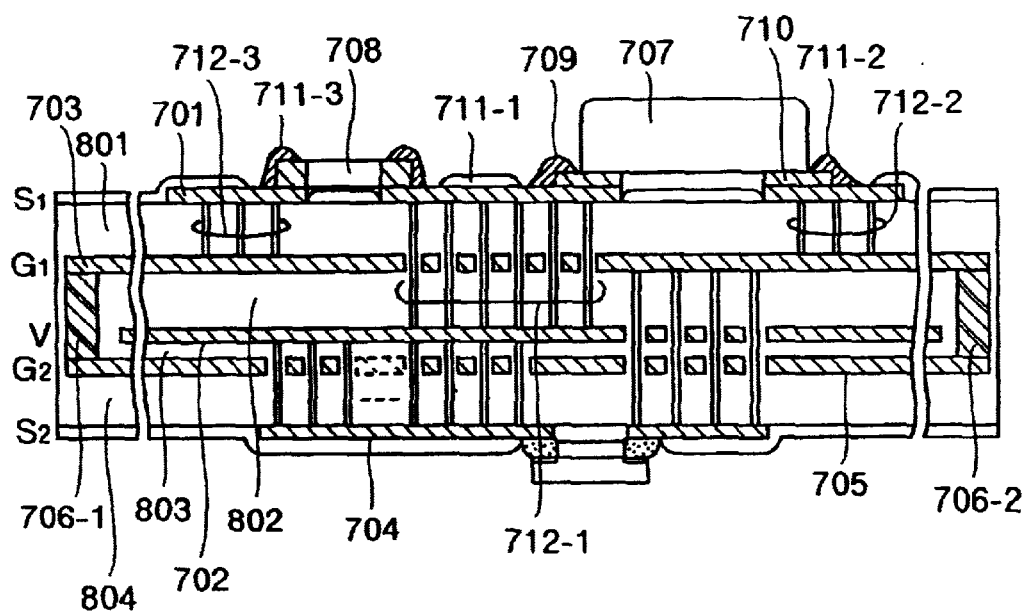
FIG. 27 shows a sectional view of a five-layer circuit board in accordance with an embodiment of the present invention.

The conductor material for forming the power layer, the ground layer and the wiring, the resistor material for forming the resistor layer, the dielectric material layer for forming the dielectric material layer shown in FIG. 27 and the manufacturing method of the circuit board are explained.

As the conductor material, metal powder mixture comprising silver (Ag) powder and palladium (pd) powder and vehicle produced by solving 10 weight percent of ethyl cellulose in organic solvent ($\alpha$-terupineole) are milled by a three-roll mill to prepare conductor paste. The proportions of the silver powder and the palladium powder in the metal powder mixture are two types, 95:5 and 70:30. The former is for forming the via and the internal pattern, and the latter is for forming the surface pattern. For the latter conductor paste for forming the surface pattern, 3 wt % of glass powder is added.

As the resistor material, commercially available resistor paste comprising mixture of ruthenium oxide ($RuO_2$) powder and glass powder was used.

As the low dielectric constant dielectric material layer, ceramic component comprising 56 wt % of borosilicate glass including 79 wt % of silicon oxide ($SiO_2$), 18 wt % of boron oxide ($B_2O_3$), 2 wt % of potassium oxide (KO) and 1 wt % of aluminum oxide ($Al_2O_3$), and 24 wt % of aluminum oxide ($Al_2O_3$) powder as filler, and 20 wt % of cordielite ($2MgO.2Al_2O_3.5SiO_2$) powder was used, and the composition, polyvinyl buthyral resin, solvent (buthanol) and plastic material were mixed by an alumina ball mill to produce slurry of glass and filler. From the slurry, low dielectric constant dielectric material green sheet was prepared by doctor blade type casting machine. For the above glass ceramic material, characteristics of sintered body of single body (pressed powder) were measured and the sintered temperature of 900° C., the sintering maintain time of 1 hr, the bending strength of 240 MPa, the thermal expansion coefficient of $3.1 \times 10^{-6}$/° C., the specific dielectric constant of 5.0 and the dielectric loss (tan $\delta$) of 0.3% were obtained.

Then, via-thorough-holes 712-1, 712-2 and 712-3 for the conductors and via-through-holes 706-1 and 706-2 for the resistors were formed by an NC punching machine at predetermined position on four low dielectric constant dielectric material green sheets for forming the dielectric material layers 801, 802, 803 and 804 of FIG. 27. The via-through-holes for the resistors were formed in the vicinity of the periphery of the circuit board. The conductor paste of Ag/Pd=95/5 was filled in the via-thorough-holes for the conductors and the resistor paste was filled in the viathrough-holes for the resistors. Then, the internal conductor pattern were printed, that is, the ground layer 703 was printed on the green sheet for forming the dielectric material layer 801 and the power layer 702 was printed on the green sheet for forming the dielectric material layer 804 by using the conductor paste of Ag/Pd=95/5 and then those sheets were stacked and pressed and sintered by holding then at 900° C. under atmospheric pressure for one hour. Then, the surface conductor patterns 701, 704, 711-1, 711-2, 711-3 were printed on the sintered circuit board surface by using the conductor paste of Ag/Pd=70/30 and they were sintered at 850° C. under atmospheric pressure for ten minutes to form the surface conductor patterns. Then, the parts were mounted to prepare the low EMI circuit board of FIG. 27. The dielectric material of the circuit board exhibited the specific dielectric constant of 5.0 and the dielectric loss (tan δ) of 0.4%.

Figure 28:
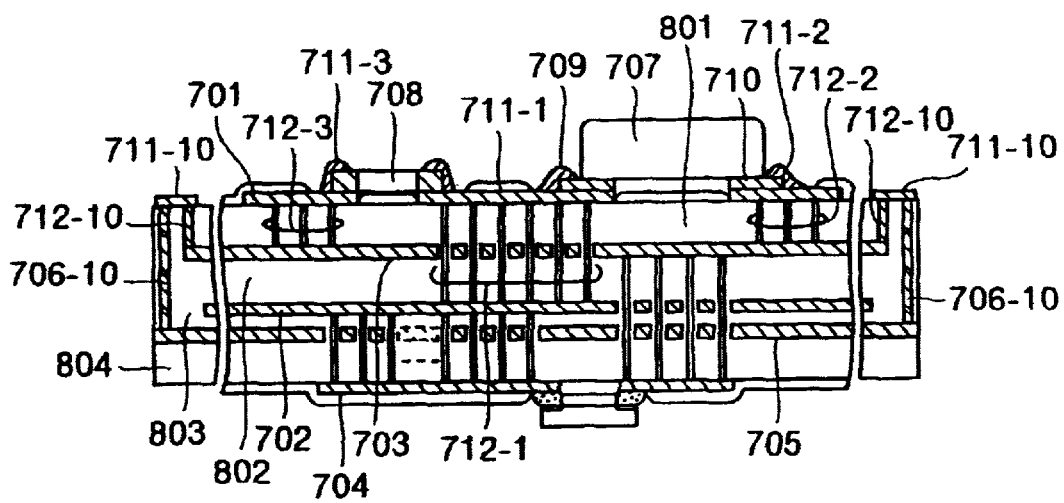
FIG. 28 shows a sectional view of a five-layer circuit board in accordance with an embodiment of the present invention.
Figure 29:
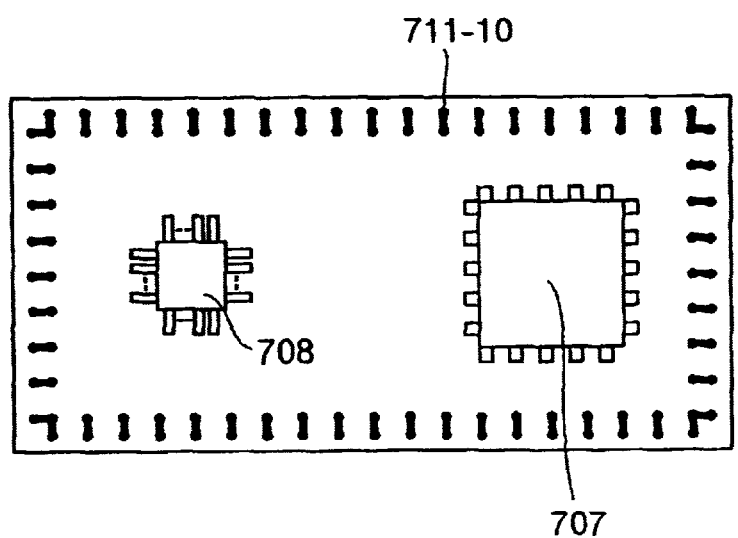
FIG. 29 shows a sectional view of a five-layer circuit board in accidence with an embodiment of the present invention.

FIG. 28 shows other embodiment.

The via-through-holes 712-1, 712-2, 712-3 and 712-10 for the conductors and the via-through hole 706-10 for the resistor were formed by the NC punching machine at predetermined positions on four low dielectric constant dielectric material green sheets for forming the dielectric material layers 801, 802, 803 and 804 of FIG. 28. Then, the conductor paste of Ag/Pd=95/5 was filed in the via-through holes for the conductors and the resistor paste was filled in the via-through-hole for the resistor. Subsequently, in the same manner as that of the Embodiment 1, the internal conductor patterns were printed, that is, the ground layer 703 was printed on the green sheet for forming the dielectric material layer 801 by using the conductor paste of Ag/Pd=95/5, power layer 702 was printed on the green sheet for forming dielectric material layer 802 and the ground layer 705 was printed on the green sheet for forming the dielectric material layer 804, and then those sheets were stacked and pressed and sintered by holding them at 900° C. under atmospheric pressure for one hour. Then, the surface conductor patterns 701, 704, 711-1, 711-2, 711-3 and 711-10 were printed on the sintered circuit board surface by using the conductor paste of Ag/Pd=70/30 and they were sintered by holding them at 850° C. under atmospheric pressure for ten minutes to form the surface conductor patterns. The internal via-through-holes for the resistor are connected to the internal ground layer 703 through the via-through-holes for the conductors and the resistance thereof was adjusted by cutting the surface conductor pattern 711-10 shown in FIG. 29. Then, the parts were mounted to prepare the low EMI circuit board of FIG. 28.

Figure 30:
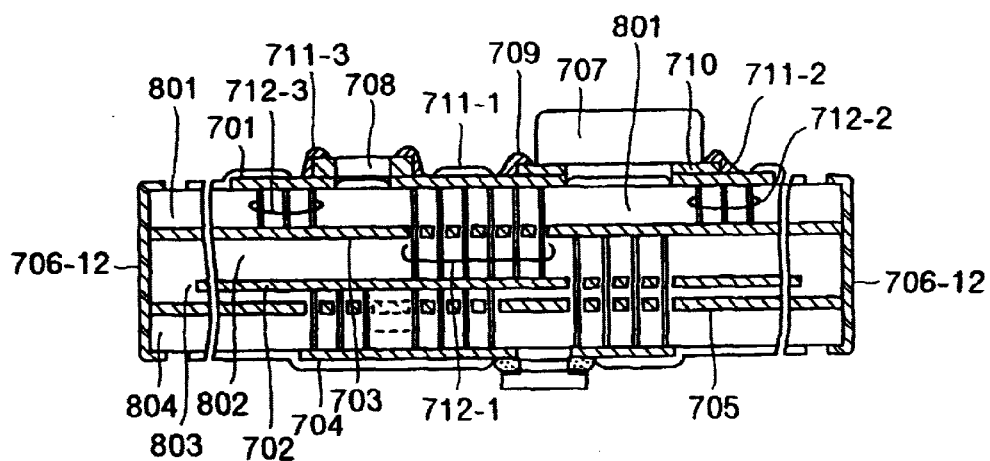
FIG. 30 shows a sectional view of a five-layer circuit board in accidence with an embodiment of the present invention.

FIG. 30 shows other embodiment.

The via-through-holes 712-1, 712-2 and 712-3 for the conductors were formed by the NC punching machine at predetermined positions on four low dielectric constant dielectric material green sheets for forming the dielectric material layers 801, 802, 803 and 804 of FIG. 30. Then, the conductor paste of Ag/Pd=95/5 was filed in the via-through holes for the conductors. Subsequently, the internal conductor patterns were printed, that is, the ground layer 703 was printed on the green sheet for forming the dielectric material layer 801 by using the conductor paste of Ag/Pd=95/5, the power layer 702 was printed on the green sheet for forming dielectric material layer 802 and the ground layer 705 was printed on the green sheet for forming the dielectric material layer 804, and then those sheets were stacked and pressed and sintered by holding them at 900° C. under atmospheric pressure for one hour. Then, the surface conductor patterns 701, 704, 711-1, 711-2 and 711-3 were printed on the sintered circuit board surface by using the conductor paste of Ag/Pd=70/30 and the above resistor was applied to the ends of the circuit board by the dipping method and then they were sintered by holding them at 850° C. under atmospheric pressure for ten minutes to form the surface conductor patterns and the resistor 706-12. The resistances of the resistors at the ends of the circuit board ware adjusted by the laser trimming method. Then, the parts were mounted to prepare the low EMI circuit board of FIG. 30.

Figure 31:
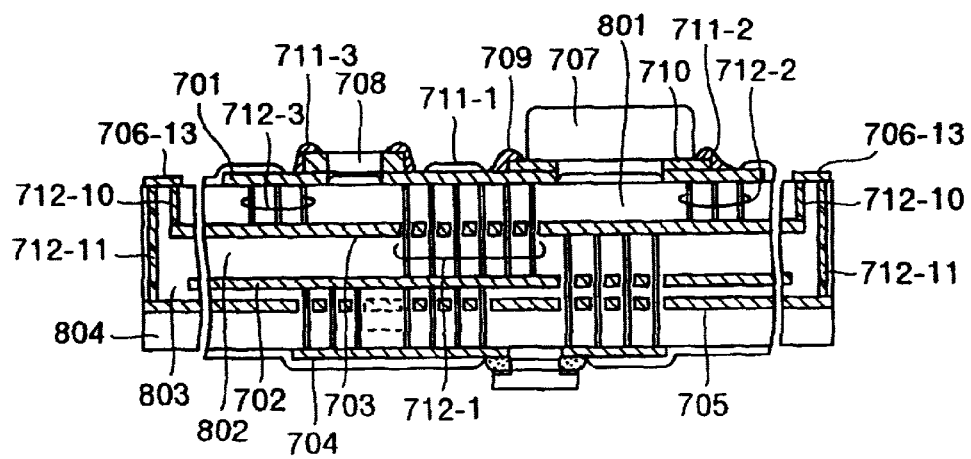
FIG. 31 shows a sectional view of a five-layer circuit board in accidence with an embodiment of the present invention.

FIG. 31 shows other embodiment.

The via-through-holes 712-1, 712-2, 712-3, 712-10 and 712-11 for the conductors were formed by the NC punching machine at predetermined positions on four low dielectric constant dielectric material green sheets for forming the dielectric material layers 801, 802, 803 and 804 of FIG. 31. Then, the conductor paste of Ag/Pd=95/5 was filed in the via-through holes for the conductors. Subsequently, in the same manner as that of the Embodiment 1, the internal conductor patterns were printed, that is, the ground layer 703 was printed on the green sheet for forming the dielectric material layer 801 by using the conductor paste of Ag/Pd=95/5, power layer 702 was printed on the green sheet for forming dielectric material layer 802 and the ground layer 705 was printed on the green sheet for forming the dielectric material layer 804, and then those sheets were stacked and pressed and sintered by holding them at 900° C. under atmospheric pressure for one hour. Then, the surface conductor patterns 701, 704, 711-1, 711-2, 711-3 and 711-10 were printed on the sintered circuit board surface by using the conductor paste of Ag/Pd=70/30 and the resistor 706-13 was printed by the above resistor paste, and they were sintered by holding them at 850° C. under atmospheric pressure for ten minutes to form the surface conductor patterns and the surface resistors. The surface resistors are connected to the internal ground layers 703 and 705 through the conductor vias and the resistances thereof were adjusted by the laser trimming of the surface resistor patterns. Then, the parts were mounted to prepare the low EMI circuit board of FIG. 31.

Figure 32:
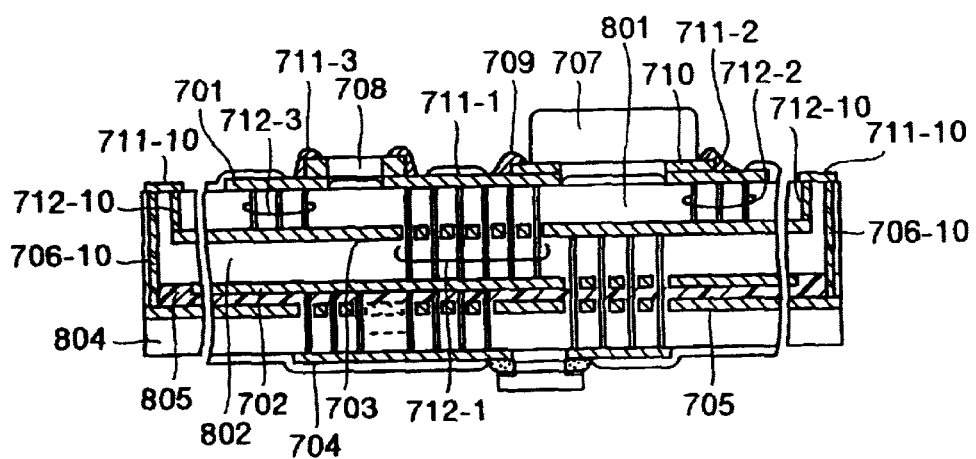
FIG. 32 shows a sectional view of a five-layer circuit board in accidence with an embodiment of the present invention.

FIG. 32 shows other embodiment.

As a first high dielectric constant dielectric material, mixture of sintered powder of barium titanate synthesized from oxalic acid salt and glass powder were milled with the above vehicle by a three-roll mill to prepare the first high dielectric constant dielectric material paste. The proportion of the barium titanate powder and the glass powder was 95/5 by weight ratio.

The via-through-holes 712-1, 712-2, 712-3 and 712-10 for the conductors and the via-through hole 706-10 for the resistor were formed by the NC punching machine at predetermined positions on three low dielectric constant dielectric material green sheets for forming the dielectric material layers 801, 802 and 804 of FIG. 32. The via 706-10 for the resistor was formed in the vicinity of the periphery of the circuit substrate. Then, the conductor paste of Ag/Pd=95/5 was filed in the vias for the conductors and the resistor paste was filled in the via for the resistor. Subsequently, the internal conductor patterns were printed, that is, the ground layer 703 was printed on the green sheet for forming the dielectric material layer 801 by using the conductor paste of Ag/Pd=95/5, power layer 702 was printed on the green sheet for forming dielectric material layer 802 and the ground layer 705 was printed on the green sheet for forming the dielectric material layer 804. The first high dielectric constant dielectric material paste was further printed on the green sheet for forming the dielectric material layer 802 to form the dielectric material layer 805. The printing was made to the respective vias so that by using the pastes so that the vias for the conductors and the vias for the resistor are connected. Then, those sheets were stacked and pressed and sintered by holding them at 900° C. under atmospheric pressure for one hour. Then, the surface conductor patterns 701, 704, 711-1, 711-2, 711-3 and 711-10 were printed on the sintered circuit board surface by using the conductor paste of Ag/Pd=70/30 and they were sintered by holding them at 850° C. under atmospheric pressure for ten minutes to form the surface conductor patterns. The internal via-through-holes for the resistor are connected to the internal ground layer 703 through the surface conductor 711-10 and the vias for the conductors and the resistances thereof were adjusted by cutting the surface conductor pattern 711-10 shown in FIG. 29. Then, the parts were mounted to prepare the low EMI circuit board of FIG. 32 having the high dielectric material layer 805 formed between the power layer 702 and the ground layer 705. The first high dielectric constant dielectric material in the circuit board exhibited the specific dielectric constant of 500 and the dielectric loss (tan δ) of 2.5%.

FIG. 33 shows other embodiment.

As a second high dielectric constant dielectric material, PbO, $Fe_2O_3$, $WO_3$ and $TiO_2$ were used as raw materials, and the raw material oxide was mixed with 75 mol % of iron-lead tungstate (Pb($Fe_2$/3Wl/3)$O_3$) and 25 mol % of lead titanate (PbTiO$_3$) in solid solution ratio by a ball mill and the mixed powder was sintered at 800° C. for one hour. The resulting sintered powder of 75 mol % of iron-lead tungstate (Pb($Fe_2$/3Wl/3)$O_3$) and 25 mol % of lead titanate (PbTiO$_3$), polyvinyl buthyral resin, solvent (buthanol) and plastic agent are mixed by an alumina ball mill to produce slurry of ferro-dielectric material including lead. Then, from the slurry, the second high dielectric constant dielectric material green sheet was prepared by a doctor blade type casting machine.

The vias 712-1, 712-2, 712-3 and 712-10 for the conductors and the via 706-10 for the resistor were formed by the NC punching machine at predetermined positions on three low dielectric constant dielectric material green sheets for forming the dielectric material layers 801, 802 and 804 of FIG. 32 and the second high dielectric constant dielectric material green sheet for forming the dielectric material layer 805. The via 706-10 for the resistor was formed in the vicinity of the periphery of the circuit substrate. Then, the conductor paste of Ag/Pd=95/5 was filed in the vias for the conductors and the resistor paste was filled in the via for the resistor. Subsequently, the internal conductor patterns were printed, that is, the ground layer 703 was printed on the green sheet for forming the dielectric material layer 801 by using the conductor paste of Ag/Pd=95/5, power layer 702 was printed on the green sheet for forming dielectric material layer 802 and the ground layer 705 was printed on the green sheet for forming the dielectric material layer 804. Then, those sheets were stacked and pressed and sintered by holding them at 900° C. under atmospheric pressure for one hour. Then, the surface conductor patterns 701, 704, 711-1, 711-2, 711-3 and 711-10 were printed on the sintered circuit board surface by using the conductor paste of Ag/Pd=70/30 and they were sintered by holding them at 850° C. under atmospheric pressure for ten minutes to form the surface conductor patterns. The internal via-through-holes for the resistor are connected to the internal ground layer 703 through the surface conductor 711-10 and the vias for the conductors and the resistances thereof were adjusted by cutting the surface conductor pattern 711-10 shown in FIG. 29. Then, the parts were mounted to prepare the low EMI circuit board of FIG. 32 having the high dielectric material layer 805 formed between the power layer 702 and the ground layer 705. The second high dielectric constant dielectric material in the circuit board exhibited the specific dielectric constant of 1000 and the dielectric loss (tan δ) of 13%. When the perovskite type ferro-dielectric material including lead was used as the high dielectric constant dielectric material, similar effect was attained.

Industrial Applicability

Since the spurious radiation is suppressed at the level of the circuit board mounted in the electronic apparatus, the present invention can provide the electronic apparatus which eliminates the various countermeasure parts such as the common mode choke of the I/O unit and the power code, filter and the bypass capacitor and eliminates the demerits of ① the rise of cost, ② problems in so-called high packaging density such as miniaturization, thinning and weight reduction due to the increase of the volume ③ complexity of the countermeasure parts and ④ restriction of external design.

Further, since is s not necessary to use the shield structure having plating applied to the plastic housing, it contributes to the recycling of the plastic housing.

Further, the present invention can provide the electronic apparatus which can cope with the increase of the operation frequency of the future electronic apparatus.

The structure of the present invention or the circuit board allows the suppression of the spurious radiation at the level of the circuit board.

What is claimed is:

1. A structure comprising a first conductor layer, a second conductor layer, a third conductor layer, a first dielectric material layer, a second dielectric material layer and a resistor layer, wherein:

said resistor layer, said first dielectric material layer, said second dielectric material layer and said third conductor layer are disposed between said first conductor layer and said second conductor layer;

said resistor layer is sandwiched by said first conductor layer and said second conductor layer;

said first dielectric material layer is sandwiched by said first conductor layer and said third conductor layer;

said second dielectric material layer is sandwiched by said third conductor layer and said second conductor layer; and said resistor layer is connected electrically to said first conductor layer and said second conductor layer.

2. A structure according to claim 1, wherein said first conductor layer is a first ground layer, said second conductor layer is a second ground layer and said third conductor layer is a power source layer.

3. An electronic apparatus having electronic components provided on said structure according to claim 1.

* * * * *